United States Patent
Murai et al.

(10) Patent No.: US 10,867,950 B2
(45) Date of Patent: Dec. 15, 2020

(54) SEMICONDUCTOR DEVICE WITH A GAP CONTROL ELECTRODE AND METHOD OF MANUFACTURING THE SEMICONDUCTOR DEVICE

(71) Applicant: SONY CORPORATION, Tokyo (JP)

(72) Inventors: Makoto Murai, Tokyo (JP); Yuji Takaoka, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/316,598

(22) PCT Filed: Jun. 5, 2015

(86) PCT No.: PCT/JP2015/066349
§ 371 (c)(1),
(2) Date: Dec. 6, 2016

(87) PCT Pub. No.: WO2015/198838
PCT Pub. Date: Dec. 30, 2015

(65) Prior Publication Data
US 2017/0141064 A1   May 18, 2017

(30) Foreign Application Priority Data
Jun. 27, 2014   (JP) .................................. 2014-132333

(51) Int. Cl.
*H01L 23/00*   (2006.01)
*H01L 23/12*   (2006.01)
(Continued)

(52) U.S. Cl.
CPC ............ *H01L 24/16* (2013.01); *H01L 21/563* (2013.01); *H01L 23/12* (2013.01);
(Continued)

(58) Field of Classification Search
CPC .............. H01L 24/16; H01L 24/12–14; H01L 24/15–17
See application file for complete search history.

(56) References Cited

U.S. PATENT DOCUMENTS 5,656,863 A * 8/1997 Yasunaga .............. H01L 21/565
257/778
5,753,973 A   5/1998 Yasunaga et al.
(Continued)

FOREIGN PATENT DOCUMENTS

AT   549742 T   3/2012
EP   918354 A2   5/1999
(Continued)

OTHER PUBLICATIONS

International Search Report and Written Opinion of PCT Application No. PCT/JP2015/066349, dated Aug. 25, 2015, 7 pages of English Translation and 7 pages of ISRWO.

*Primary Examiner* — Stephen M Bradley
(74) *Attorney, Agent, or Firm* — Chip Law Group

(57) ABSTRACT

A semiconductor chip includes a chip body and a plurality of solder-including electrodes provided on an element-formation surface of the chip body. A packaging substrate includes a substrate body, a plurality of wirings, and a solder resist layer, in which the plurality of wirings and the solder resist layer are provided on a front surface of the substrate body. The solder resist layer is provided as a continuous layer on the front surface of the substrate body and the plurality of wirings, and has an aperture on each of the plurality of wirings. The plurality of solder-including electrodes include at least one gap control electrode. The at least one gap control electrode includes a columnar metal layer and a solder layer in order named from side on which the chip body is disposed, and includes an overlap region where
(Continued)

the columnar metal layer and the solder resist layer overlap each other, along part or all of an aperture end of the aperture.

15 Claims, 30 Drawing Sheets

(51) Int. Cl.
*H01L 21/56* (2006.01)
*H01L 23/498* (2006.01)
*H01L 25/10* (2006.01)
*H01L 25/065* (2006.01)
*H05K 3/34* (2006.01)

(52) U.S. Cl.
CPC .. *H01L 23/49838* (2013.01); *H01L 23/49866* (2013.01); *H01L 24/81* (2013.01); *H05K 3/3436* (2013.01); *H01L 24/73* (2013.01); *H01L 25/0657* (2013.01); *H01L 25/105* (2013.01); *H01L 2224/1147* (2013.01); *H01L 2224/13082* (2013.01); *H01L 2224/13083* (2013.01); *H01L 2224/13109* (2013.01); *H01L 2224/13111* (2013.01); *H01L 2224/13139* (2013.01); *H01L 2224/13147* (2013.01); *H01L 2224/13155* (2013.01); *H01L 2224/16013* (2013.01); *H01L 2224/16055* (2013.01); *H01L 2224/16057* (2013.01); *H01L 2224/16113* (2013.01); *H01L 2224/16225* (2013.01); *H01L 2224/16227* (2013.01); *H01L 2224/16237* (2013.01); *H01L 2224/32225* (2013.01); *H01L 2224/48091* (2013.01); *H01L 2224/48106* (2013.01); *H01L 2224/48227* (2013.01); *H01L 2224/73204* (2013.01); *H01L 2224/8112* (2013.01); *H01L 2224/81191* (2013.01); *H01L 2224/81203* (2013.01); *H01L 2224/81385* (2013.01); *H01L 2224/81815* (2013.01); *H01L 2224/83192* (2013.01); *H01L 2224/83862* (2013.01); *H01L 2224/92125* (2013.01); *H01L 2225/0651* (2013.01); *H01L 2225/0652* (2013.01); *H01L 2225/06517* (2013.01); *H01L 2225/06562* (2013.01); *H01L 2225/06572* (2013.01); *H01L 2225/06586* (2013.01); *H01L 2924/00014* (2013.01); *H01L 2924/014* (2013.01); *H01L 2924/01028* (2013.01); *H01L 2924/01046* (2013.01); *H01L 2924/01079* (2013.01); *H01L 2924/1436* (2013.01); *H01L 2924/15311* (2013.01); *H01L 2924/15331* (2013.01); *H01L 2924/15747* (2013.01); *H01L 2924/181* (2013.01); *H05K 2201/099* (2013.01); *H05K 2201/0989* (2013.01); *H05K 2201/10674* (2013.01); *Y02P 70/50* (2015.11)

(56) References Cited

U.S. PATENT DOCUMENTS

| | | | |
|---|---|---|---|
| 5,920,770 A | 7/1999 | Yasunaga et al. | |
| 6,191,493 B1 | 2/2001 | Yasunaga et al. | |
| 6,683,375 B2* | 1/2004 | Joshi | H01L 24/11 257/690 |
| 7,804,173 B2* | 9/2010 | Ke | H01L 24/11 257/737 |
| 8,222,538 B1* | 7/2012 | Yoshida | H05K 3/34 174/262 |
| 9,313,881 B2* | 4/2016 | Healy | H01L 23/3157 |
| 2001/0044197 A1 | 11/2001 | Heinen et al. | |
| 2005/0023683 A1 | 2/2005 | Chung et al. | |
| 2005/0184371 A1* | 8/2005 | Yang | H01L 23/49816 257/678 |
| 2007/0145553 A1* | 6/2007 | Araki | H01L 23/3171 257/678 |
| 2008/0199988 A1* | 8/2008 | Ito | H01L 21/4853 438/125 |
| 2009/0250812 A1 | 10/2009 | Araki et al. | |
| 2011/0169157 A1* | 7/2011 | Fan | H01L 23/49816 257/692 |
| 2011/0291245 A1* | 12/2011 | Feng | H01L 23/481 257/621 |
| 2012/0091577 A1* | 4/2012 | Hwang | H01L 24/11 257/737 |
| 2013/0077275 A1* | 3/2013 | Kariyazaki | H01L 23/49838 361/783 |
| 2013/0228897 A1* | 9/2013 | Chen | H01L 21/481 257/621 |
| 2013/0277865 A1* | 10/2013 | Teh | H01L 23/498 257/782 |
| 2016/0307864 A1* | 10/2016 | Chiu | H01L 24/17 |
| 2017/0162436 A1* | 6/2017 | Arvin | H01L 24/81 |
| 2017/0278814 A1* | 9/2017 | Hung | H01L 24/16 |
| 2018/0174990 A1* | 6/2018 | Park | H01L 24/11 |

FOREIGN PATENT DOCUMENTS

| | | |
|---|---|---|
| JP | 02-198148 A | 8/1990 |
| JP | 06-302604 A | 10/1994 |
| JP | 2695893 B2 | 1/1998 |
| JP | 11-238833 A | 8/1999 |
| JP | 2005-51240 A | 2/2005 |
| JP | 2007-194598 A | 8/2007 |
| JP | 2008-145254 A | 6/2008 |
| JP | 2008-244180 A | 10/2008 |
| JP | 2009-117862 A | 5/2009 |
| JP | 5011993 B2 | 8/2012 |
| KR | 10-0523330 B1 | 10/2005 |

* cited by examiner

[ FIG. 1 ]
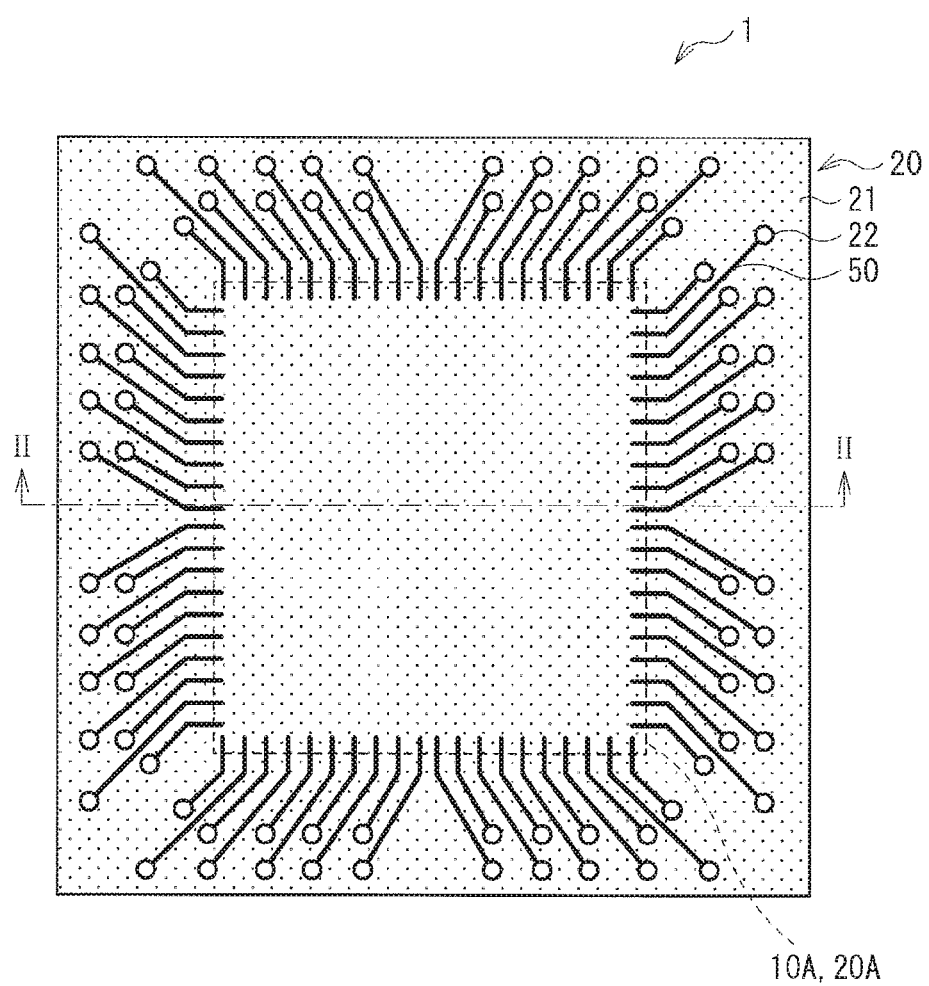

[ FIG. 2 ]
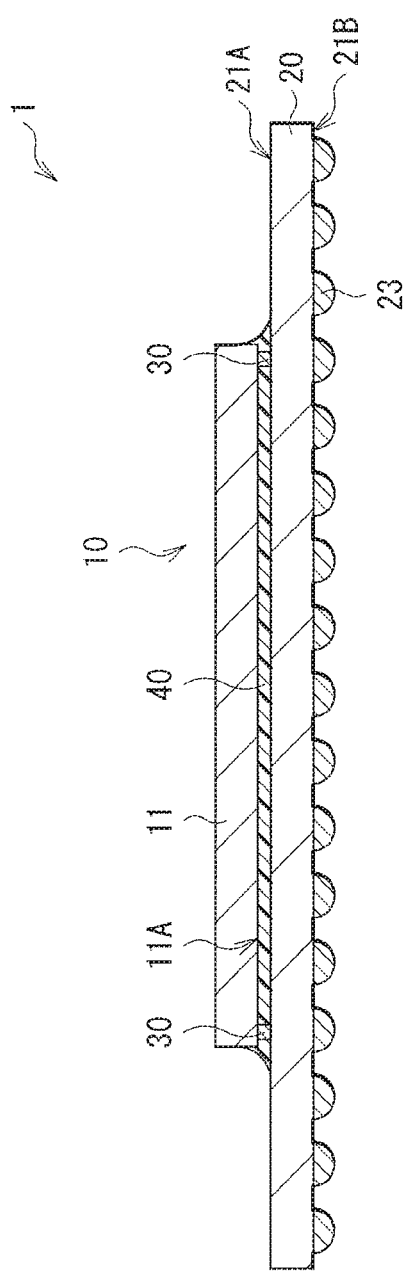

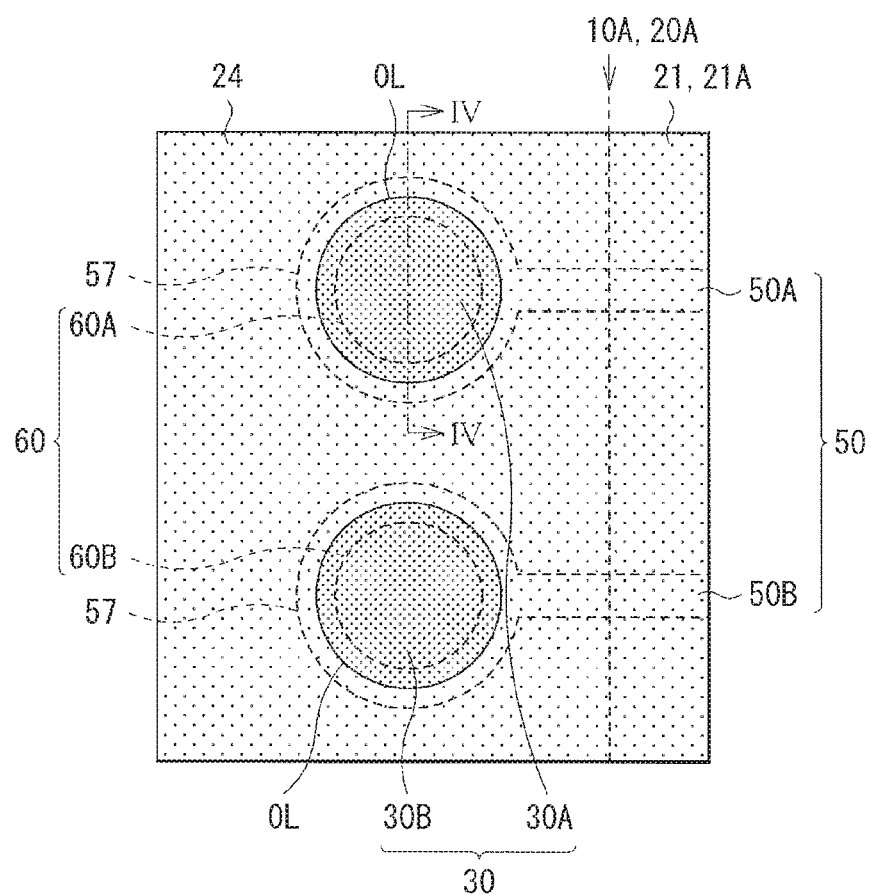
[ FIG. 3 ]

[ FIG. 4 ]
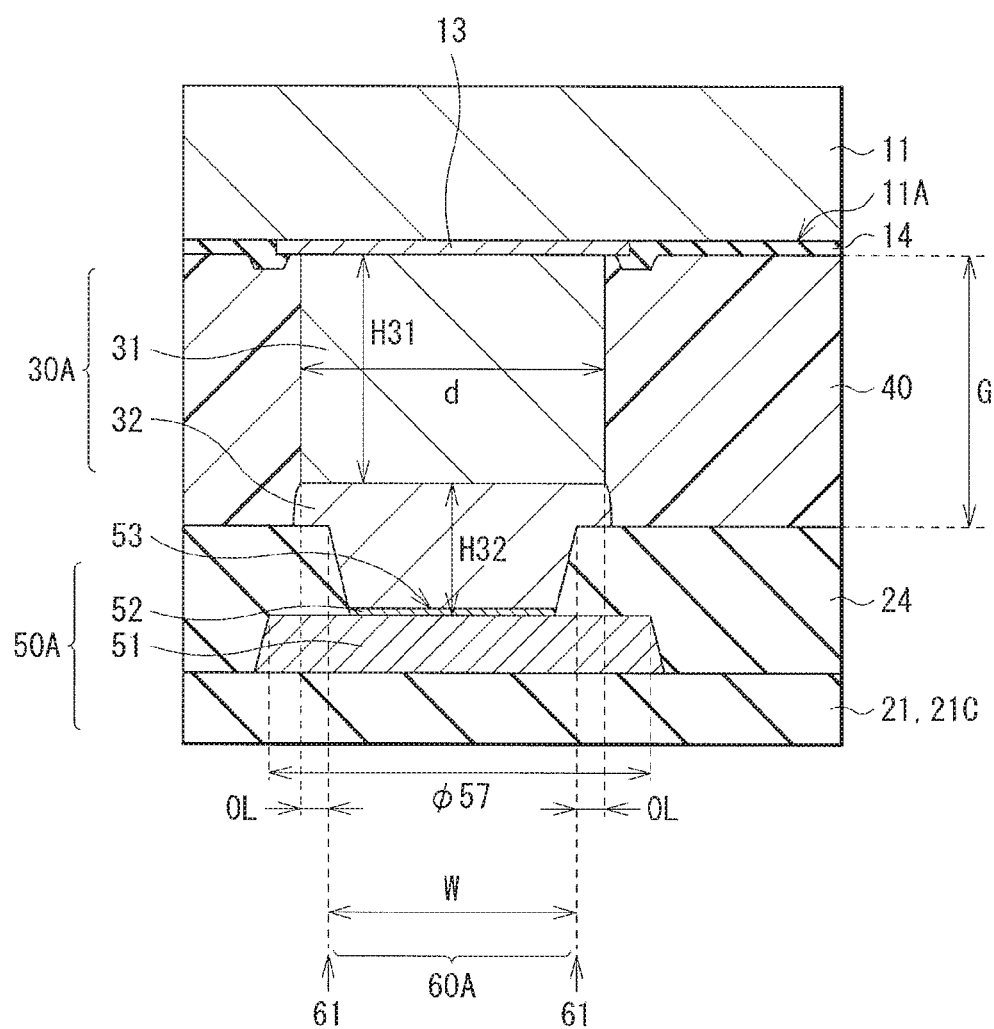

[FIG. 5]
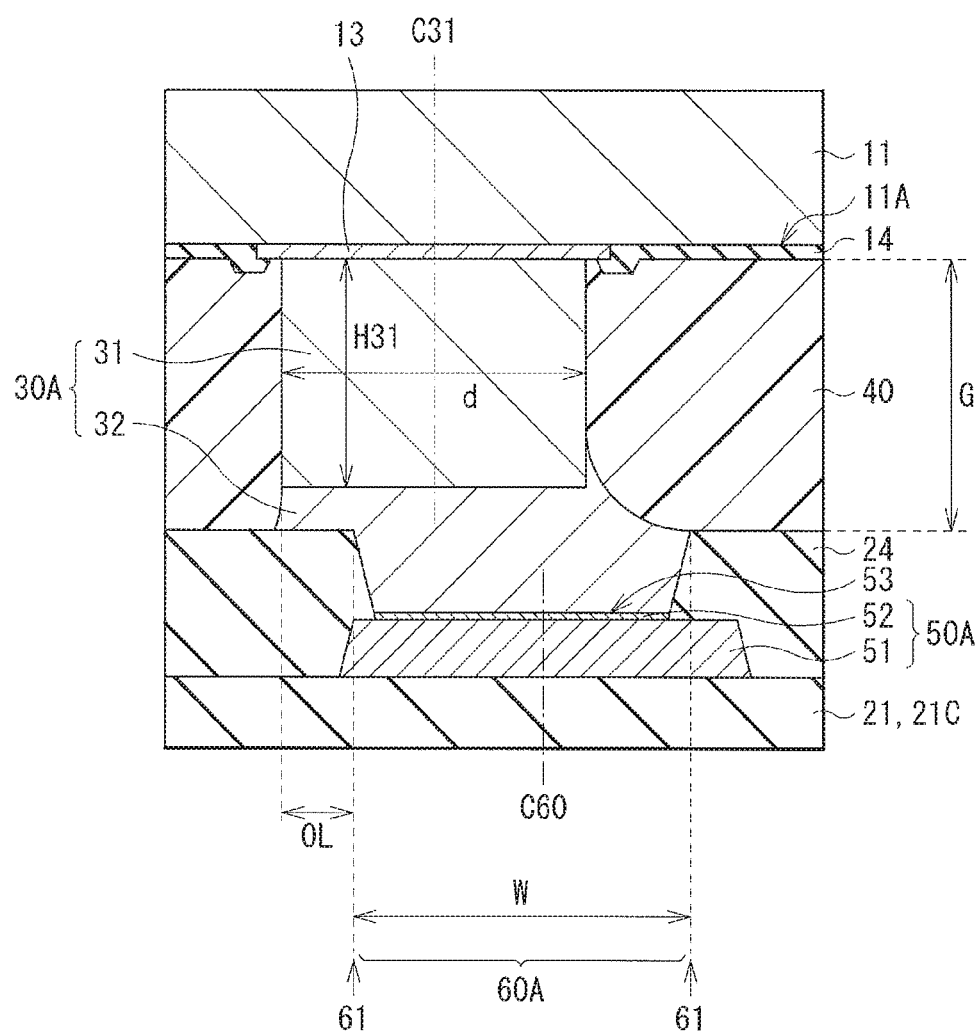

[ FIG. 6 ]
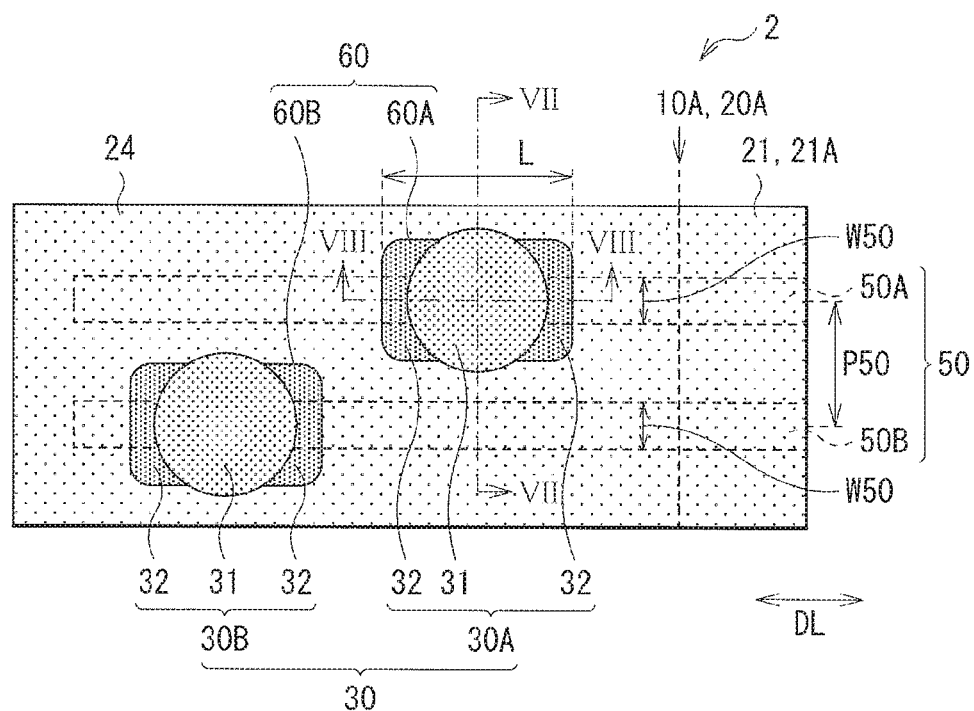

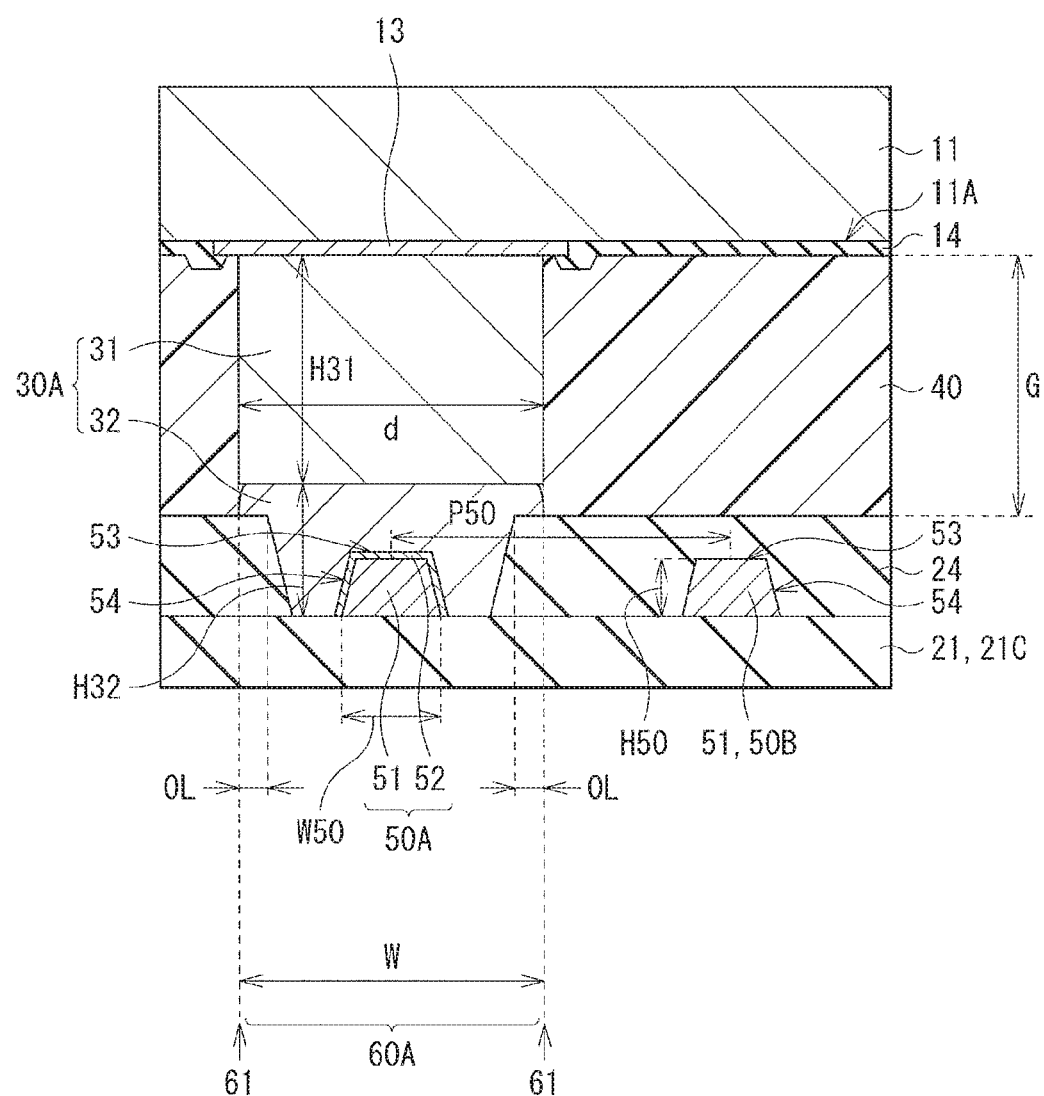
[FIG.7]

[ FIG. 8 ]
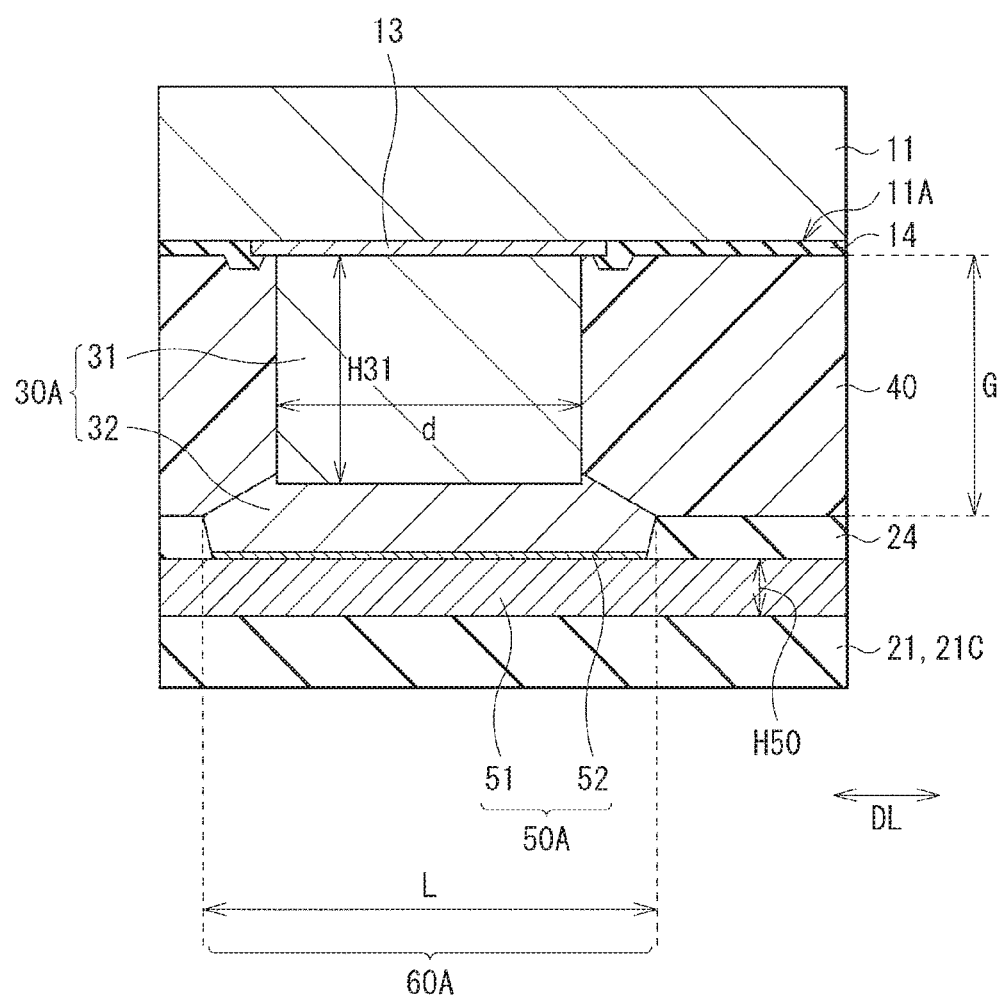

[ FIG. 9 ]
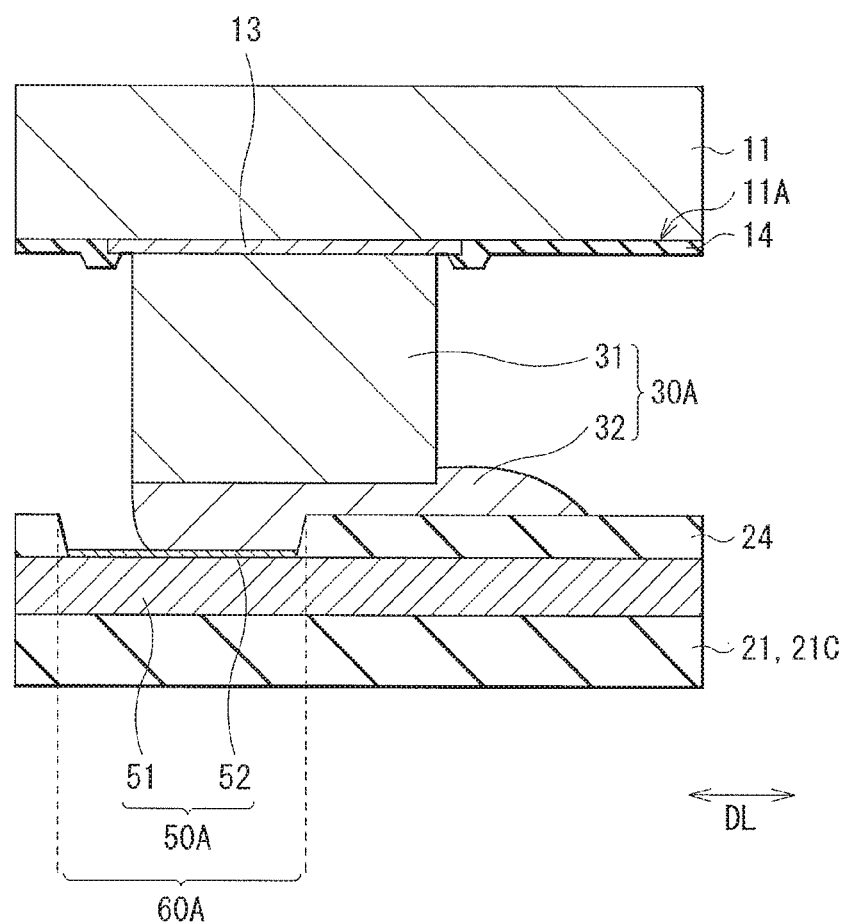

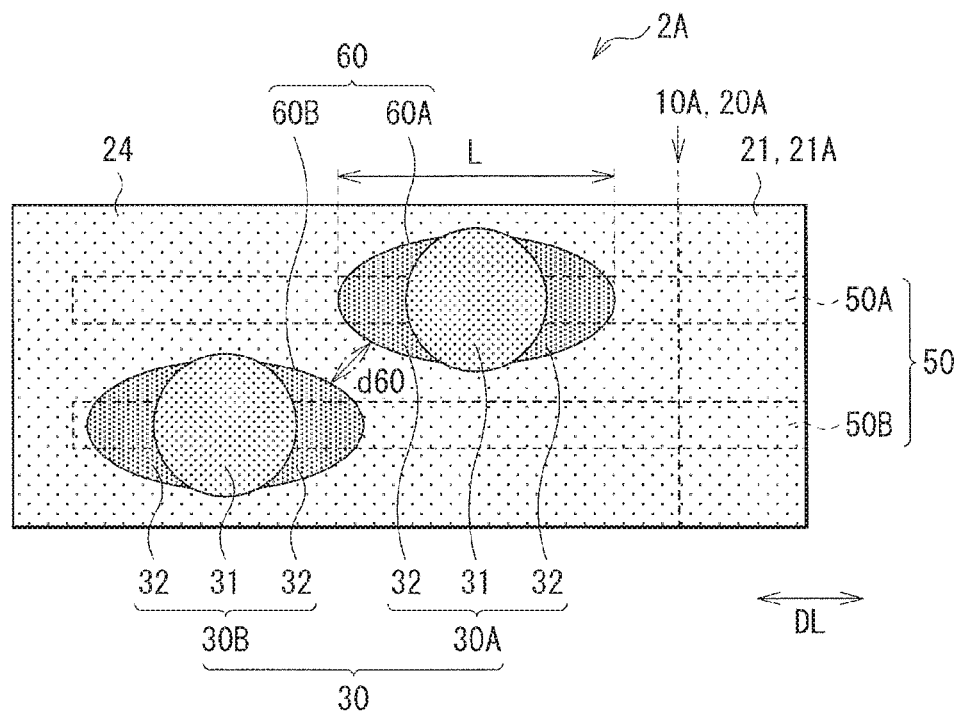
[ FIG. 10 ]
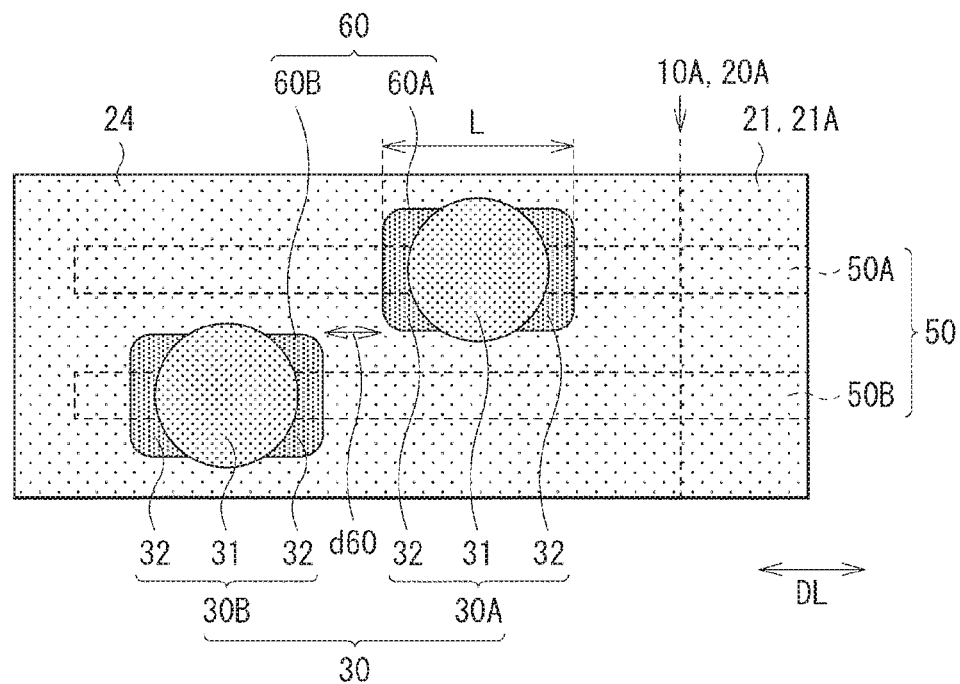
[ FIG. 11 ]

[ FIG. 12 ]
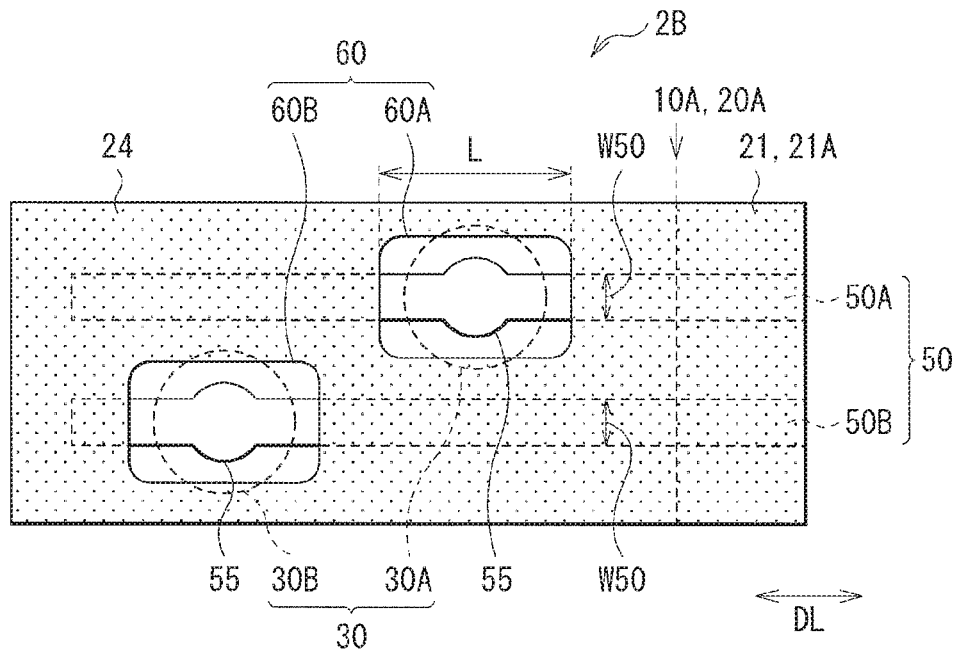
[ FIG. 13 ]
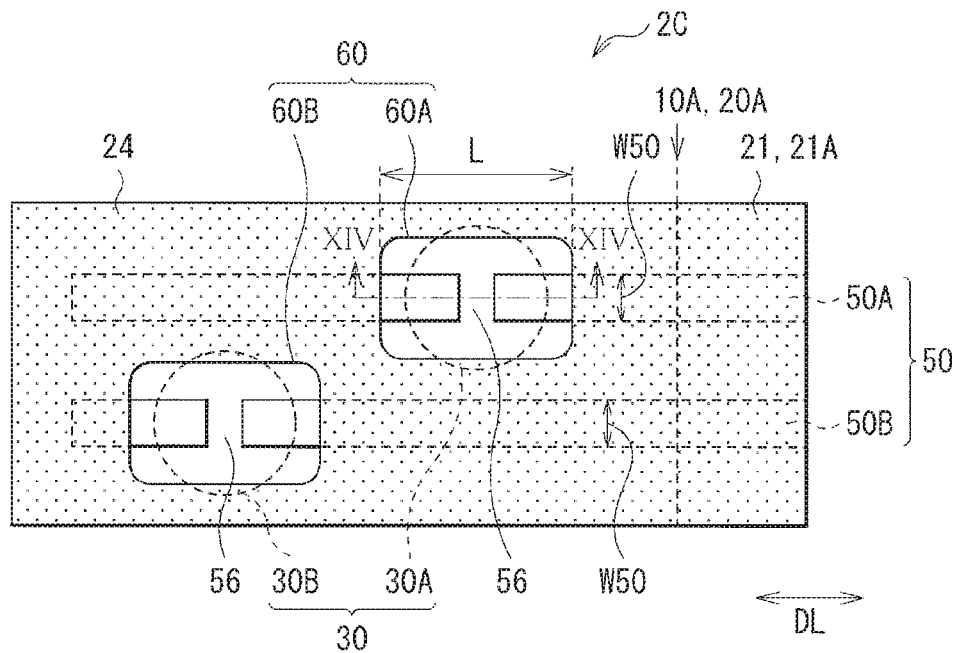

[ FIG. 14 ]
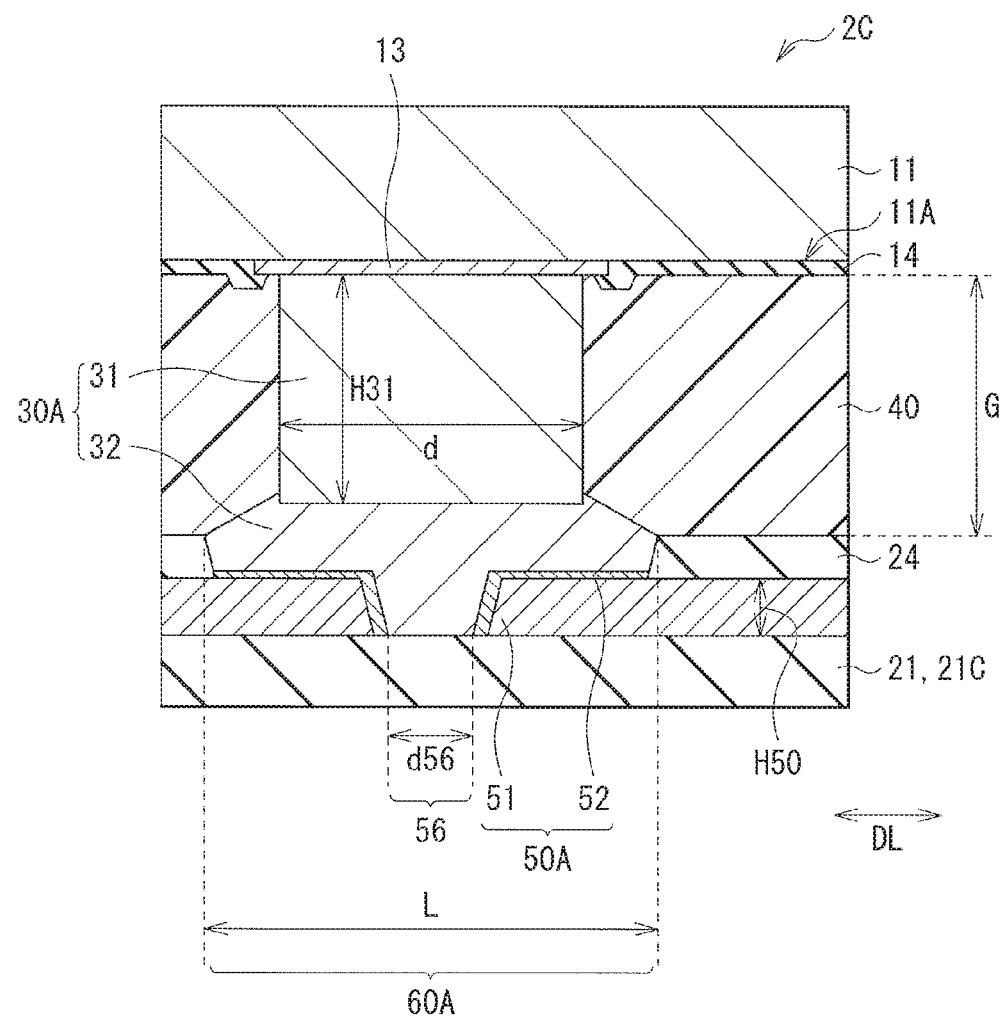

[ FIG. 15 ]
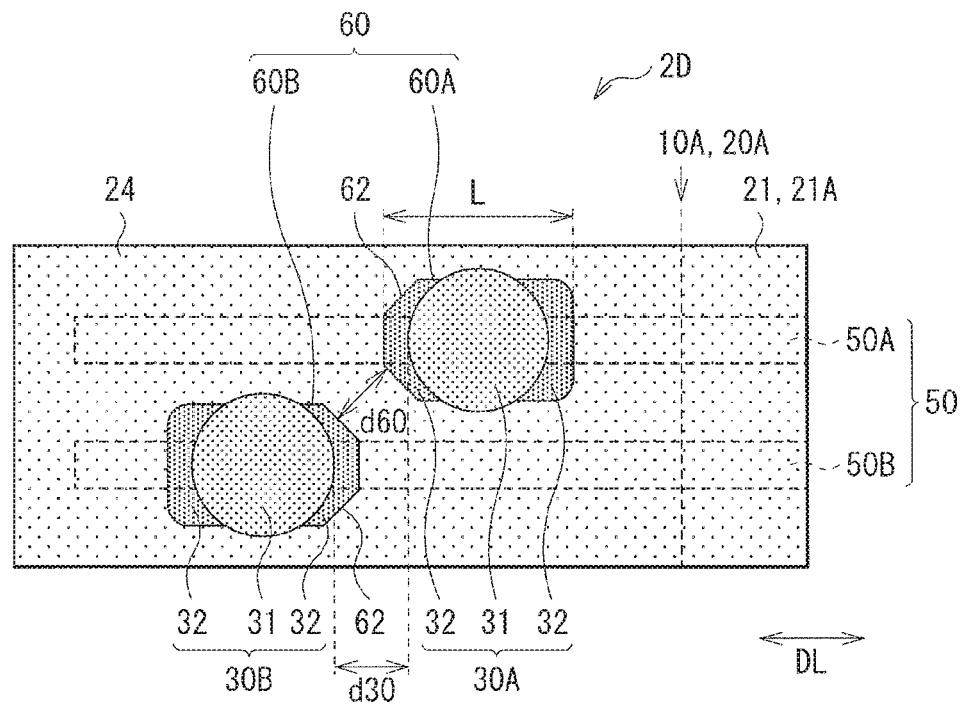
[ FIG. 16 ]
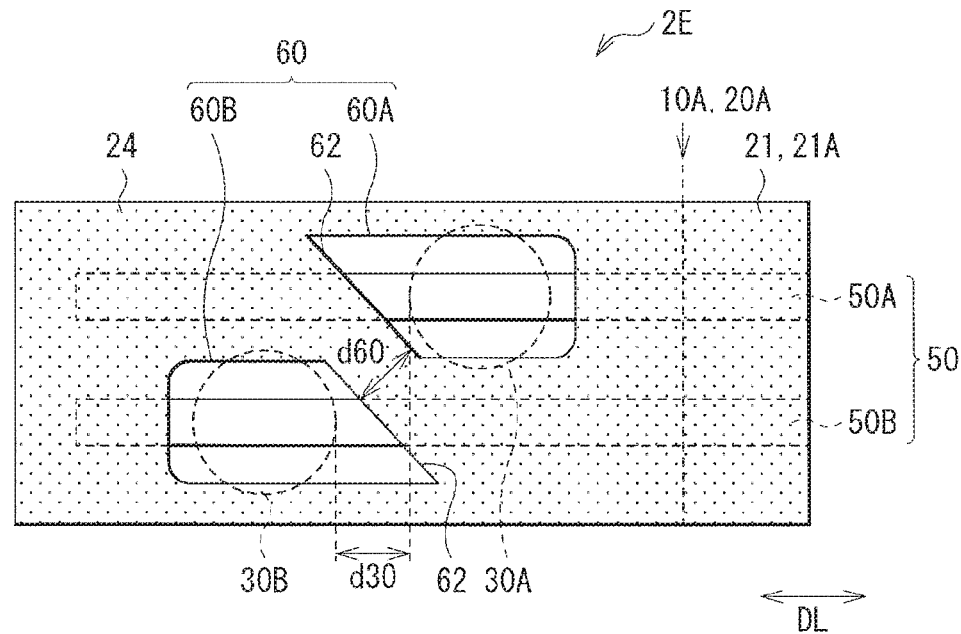

[ FIG. 17 ]
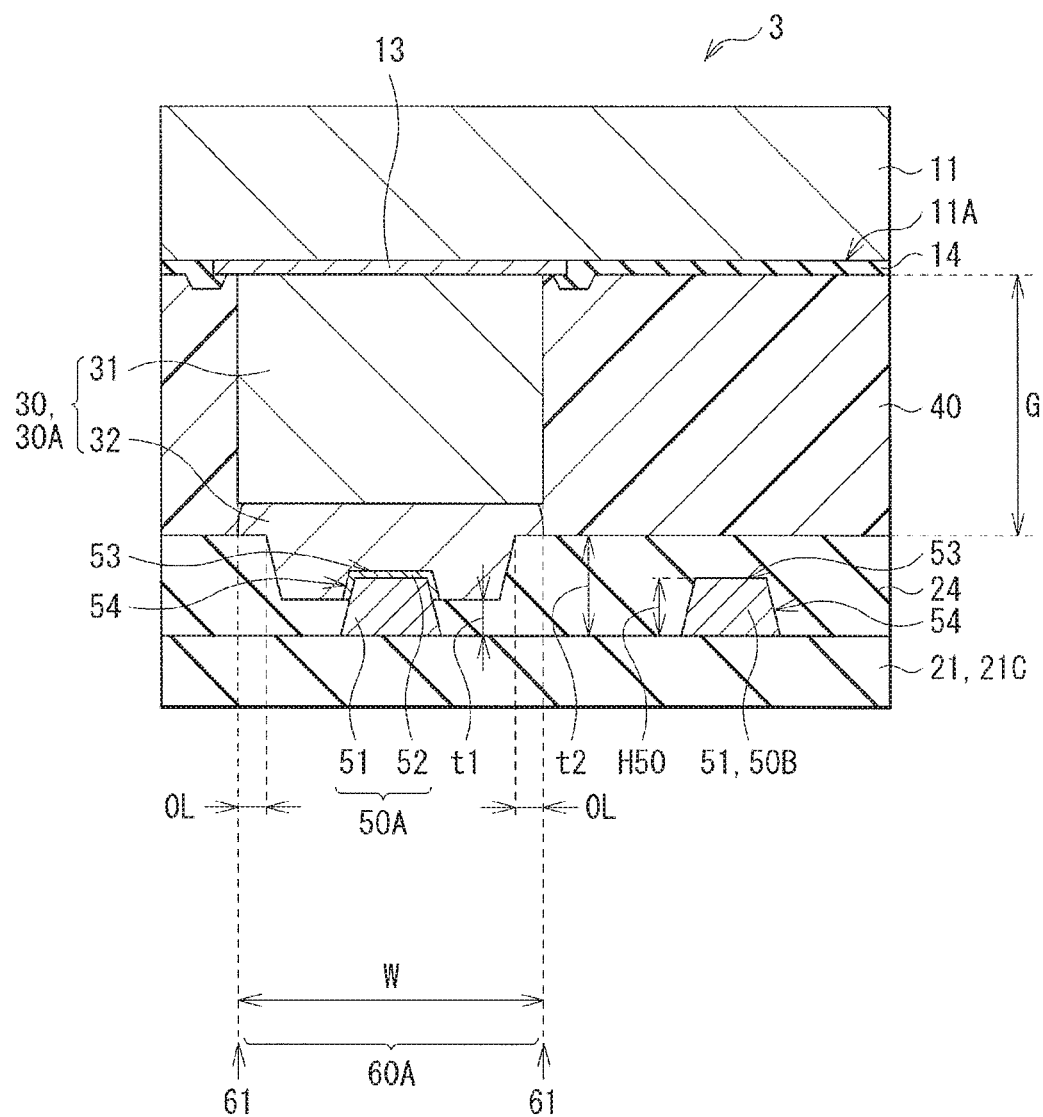

[FIG. 18]
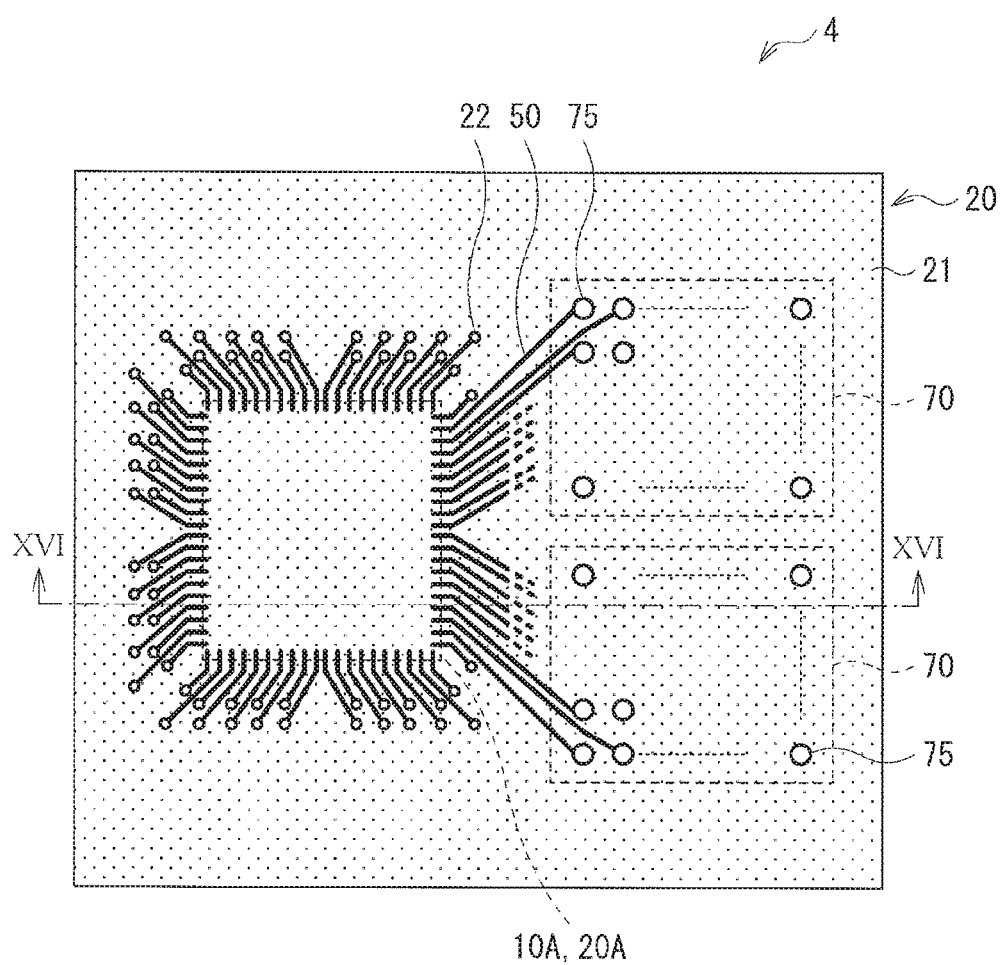

[ FIG. 19 ]
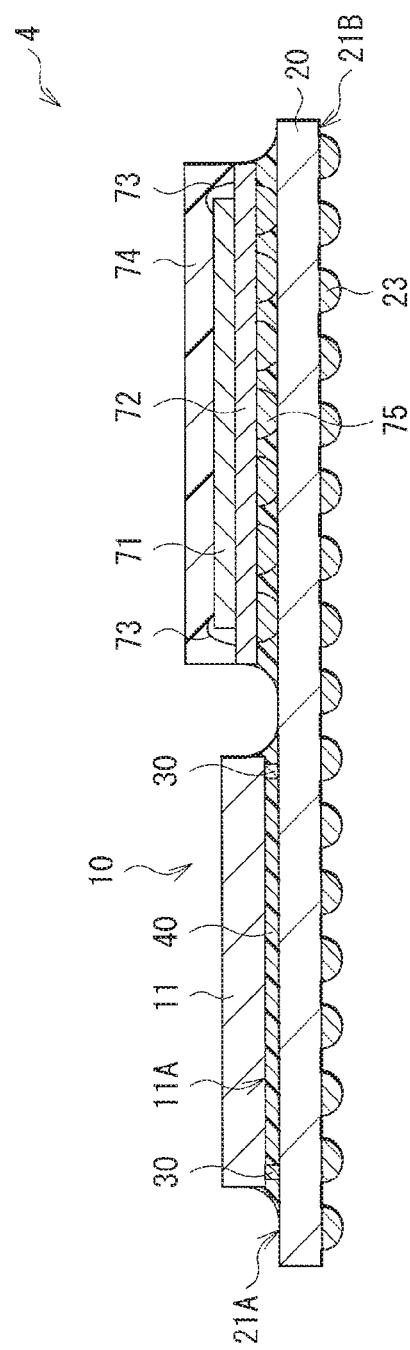

[ FIG. 20 ]
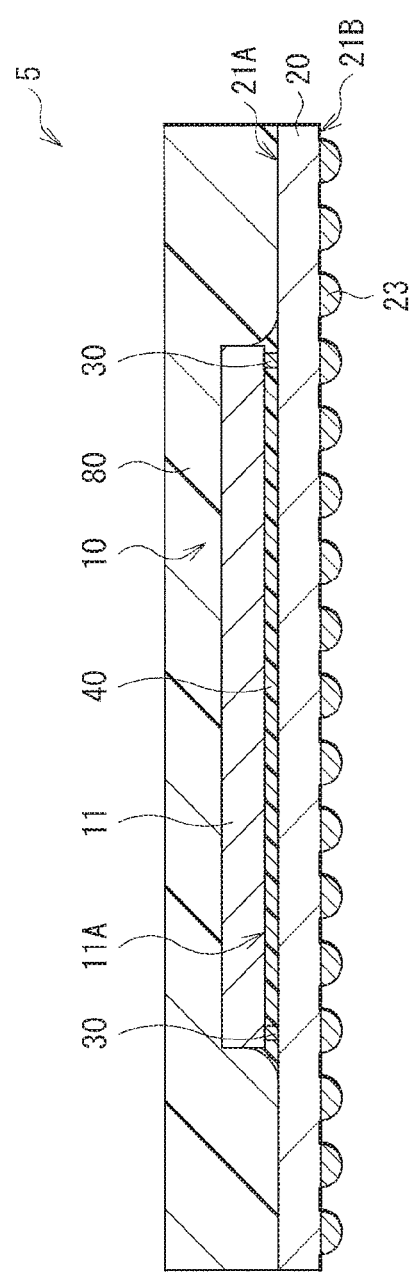

[ FIG. 21 ]
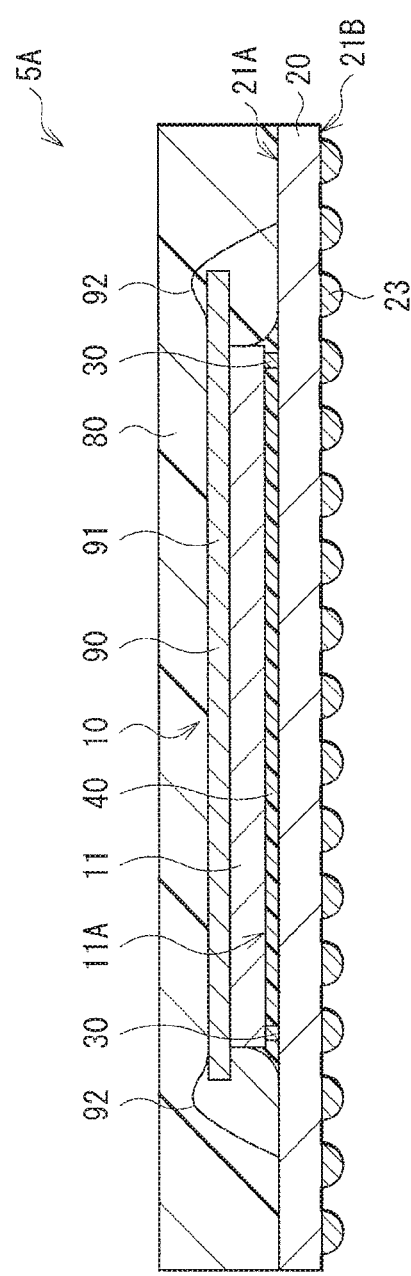

[FIG. 22]
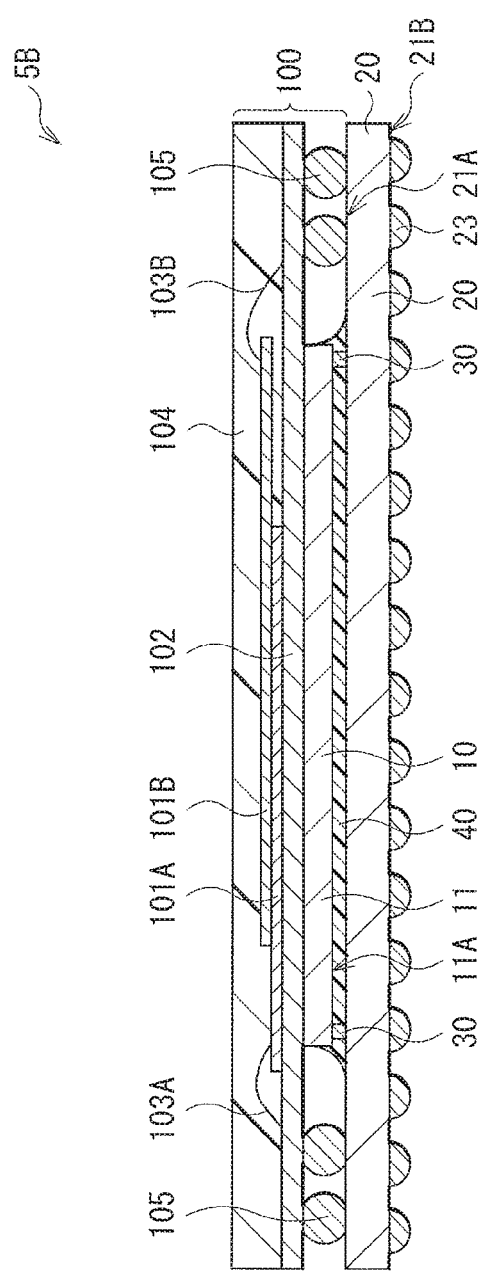

[ FIG. 23 ]
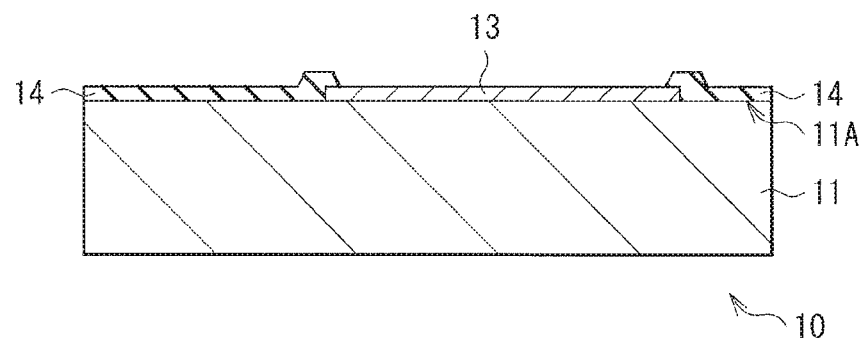
[ FIG. 24 ]
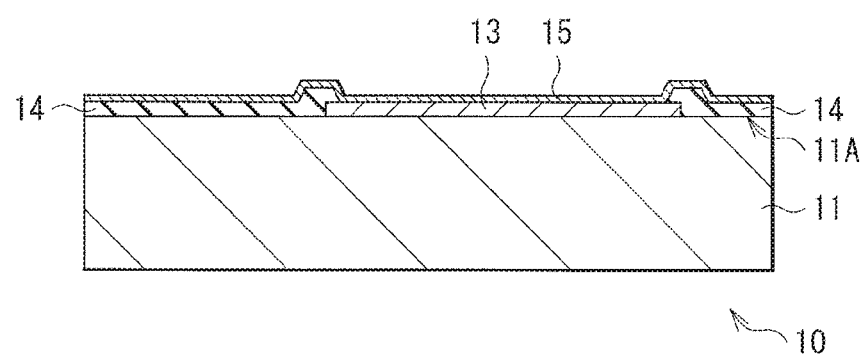

[ FIG. 25 ]
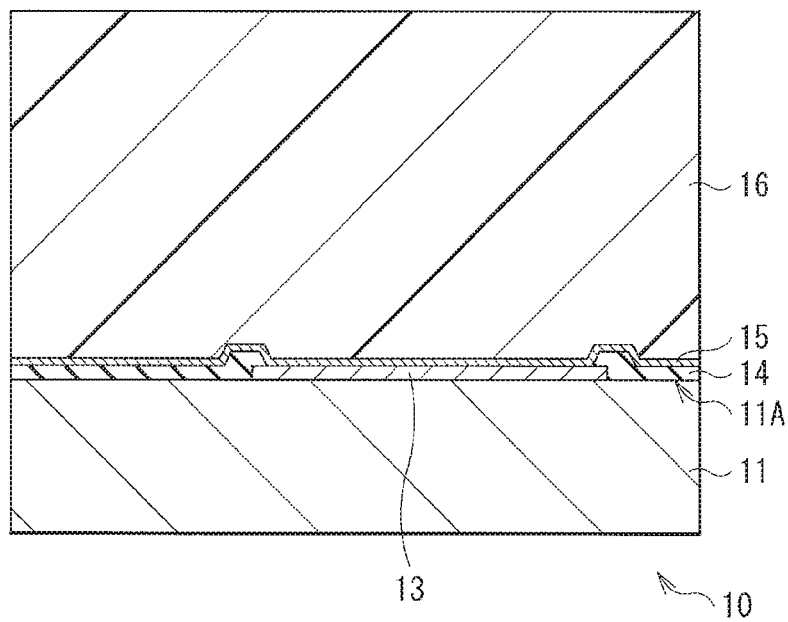
[ FIG. 26 ]
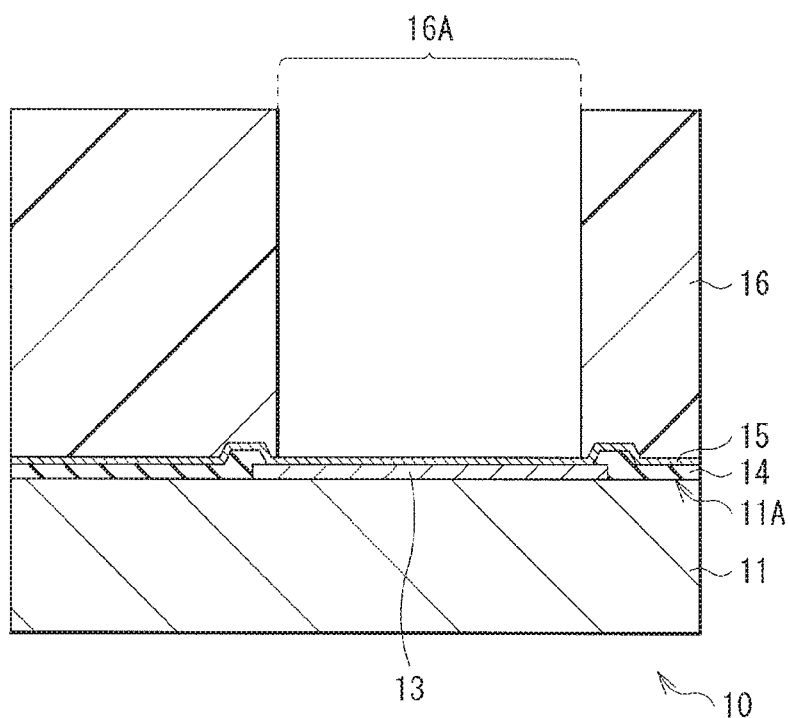

[ FIG. 27 ]
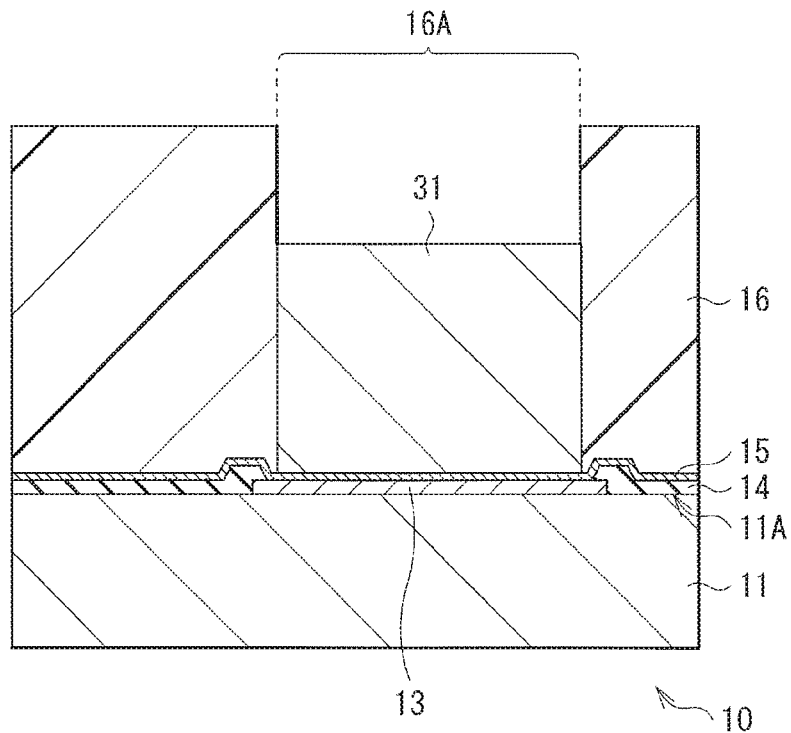
[ FIG. 28 ]
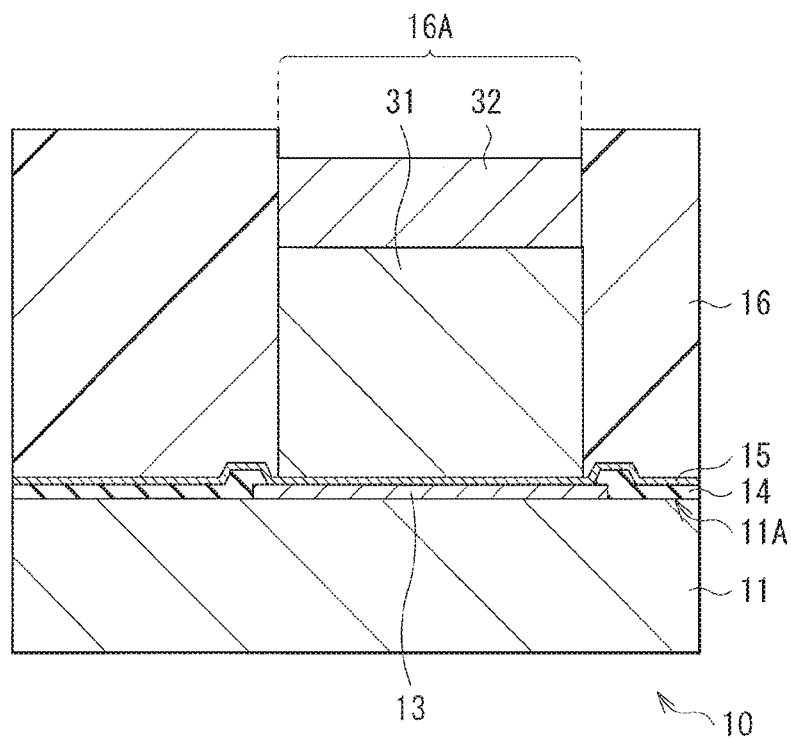

[ FIG. 29 ]
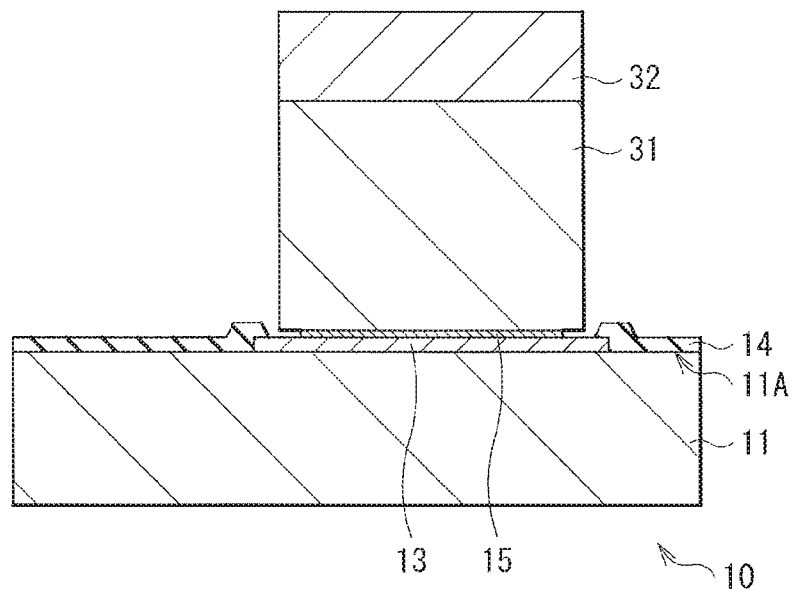
[ FIG. 30 ]
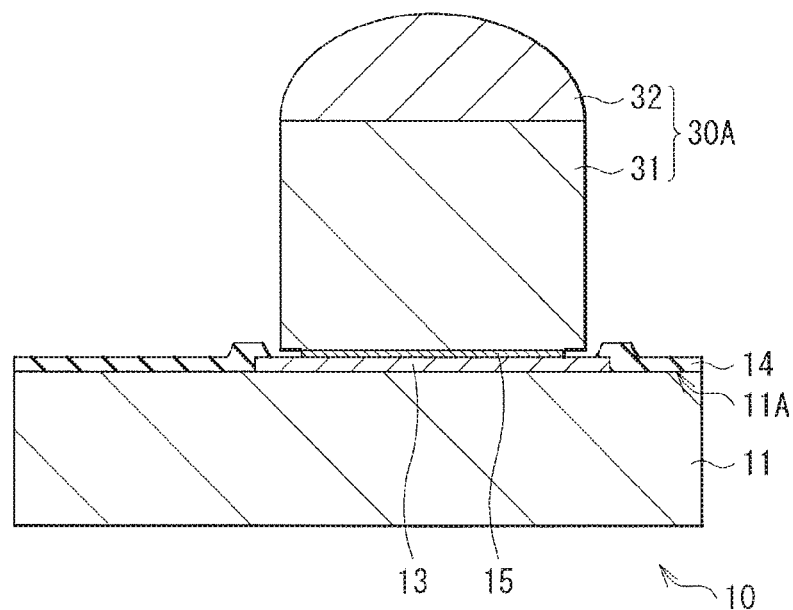

[ FIG. 31 ]
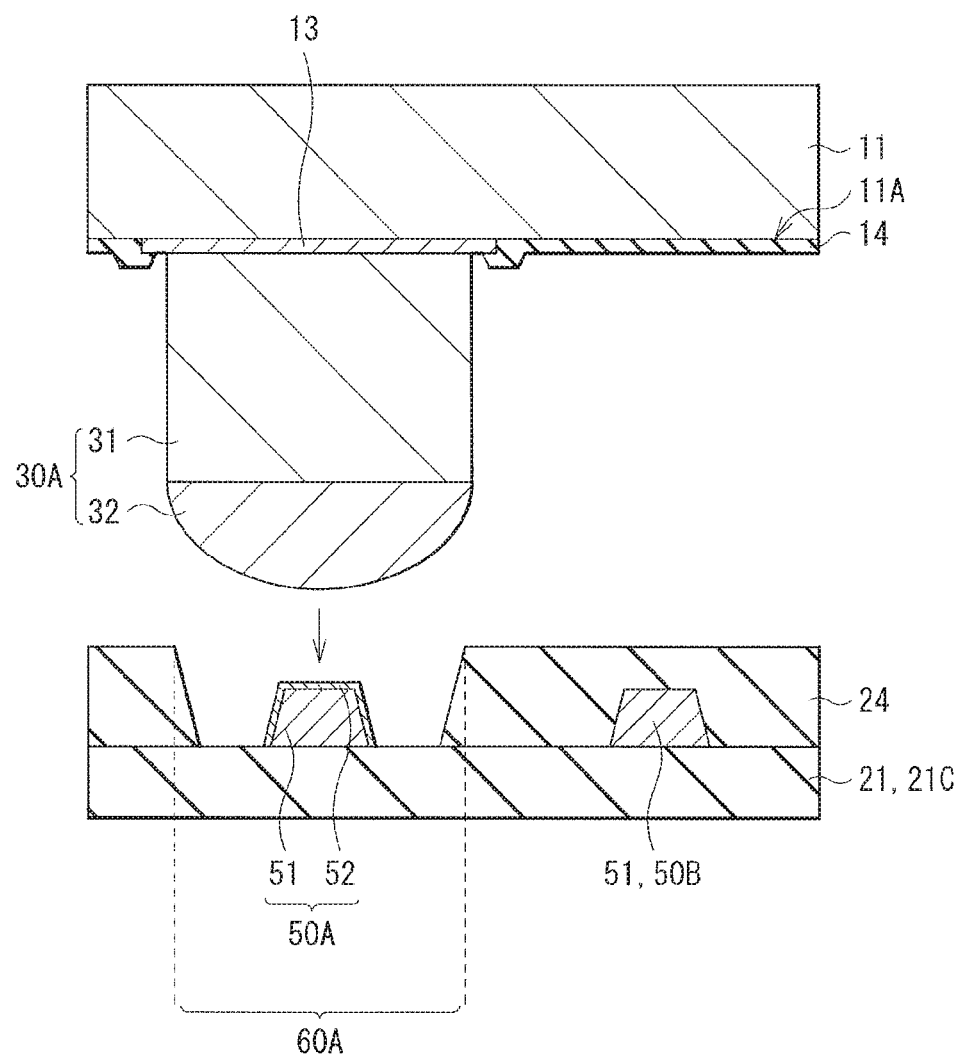

[ FIG. 32 ]
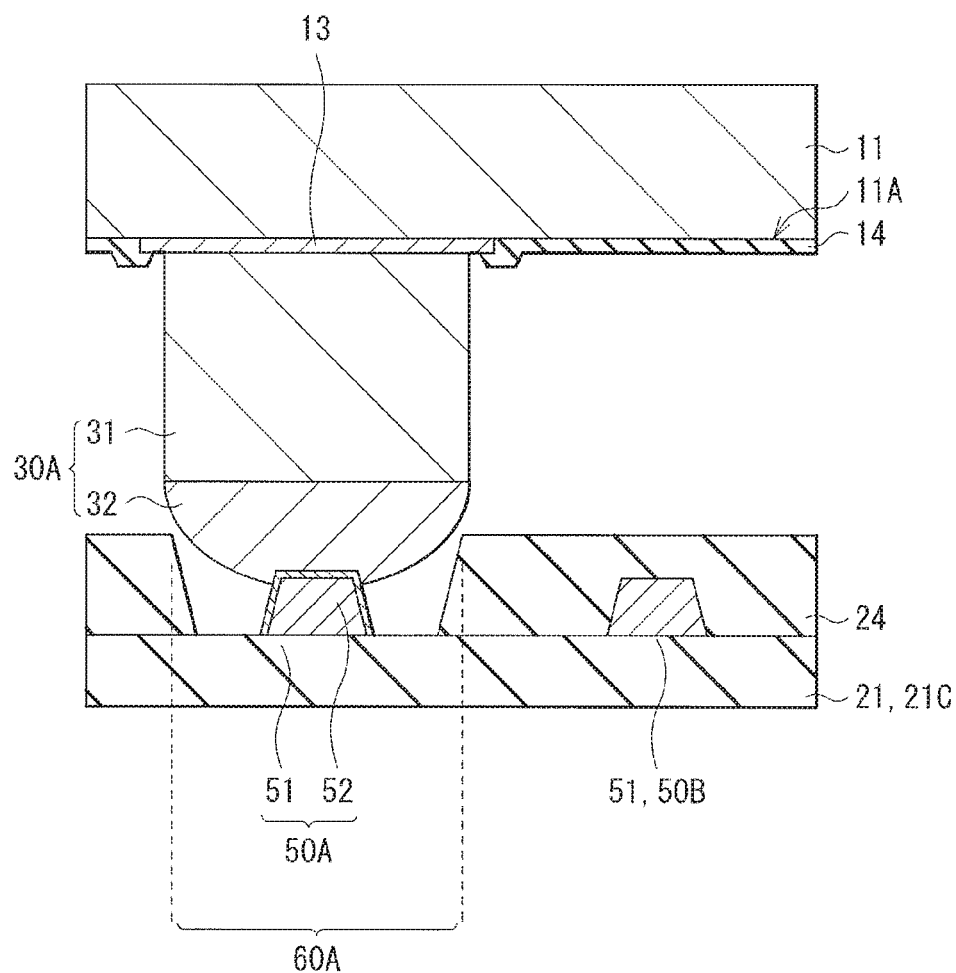

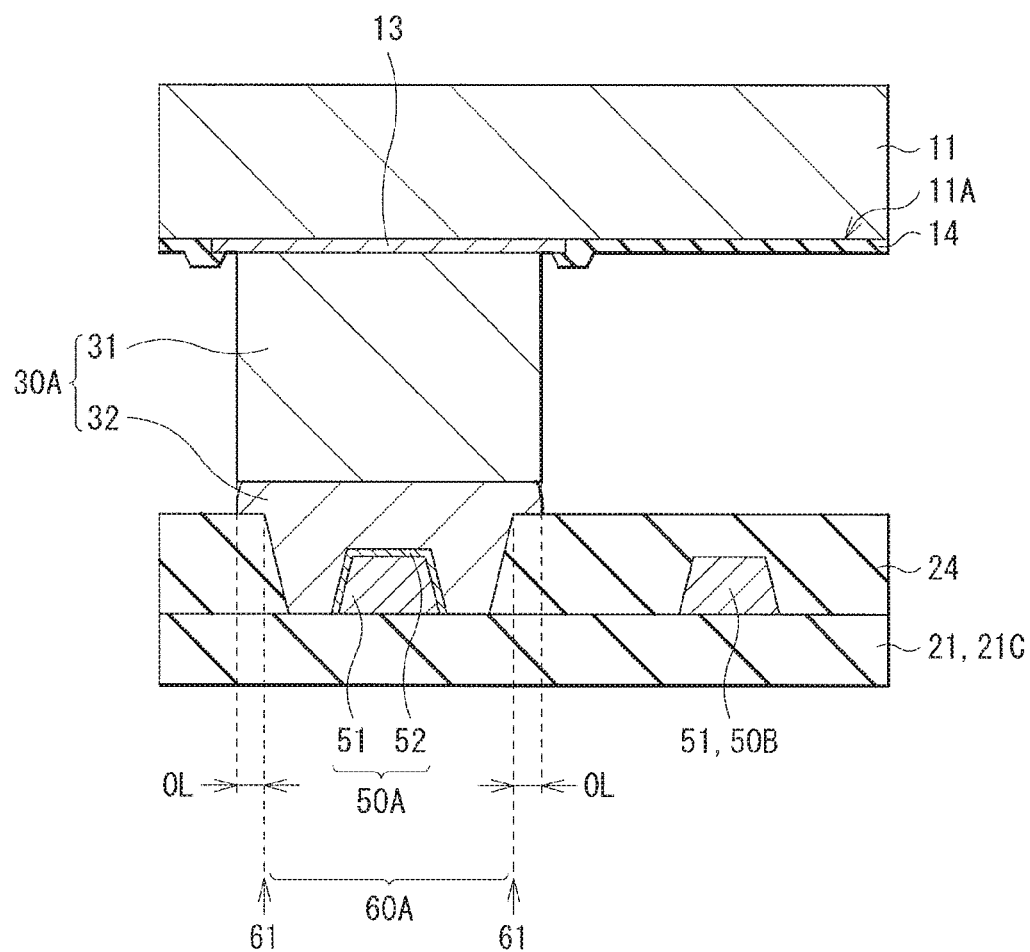
[ FIG. 33 ]

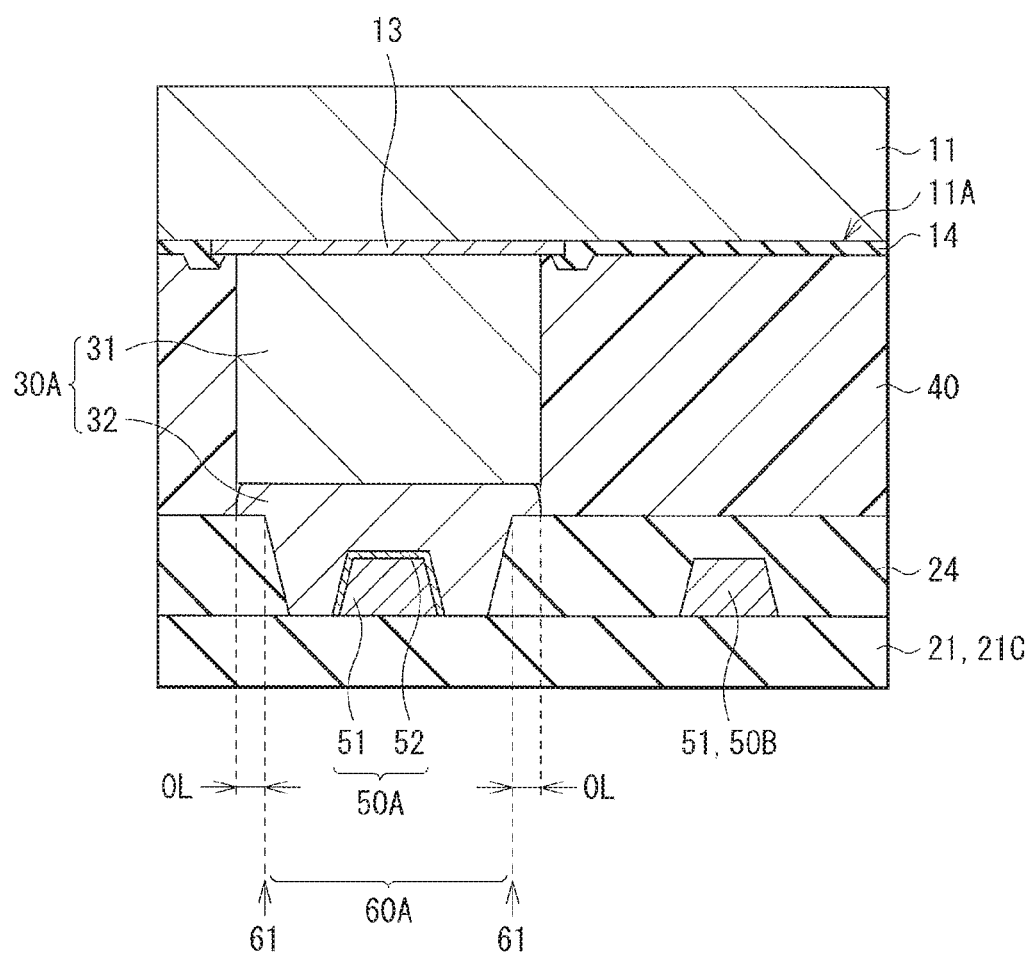
[ FIG. 34 ]

[ FIG. 35 ]
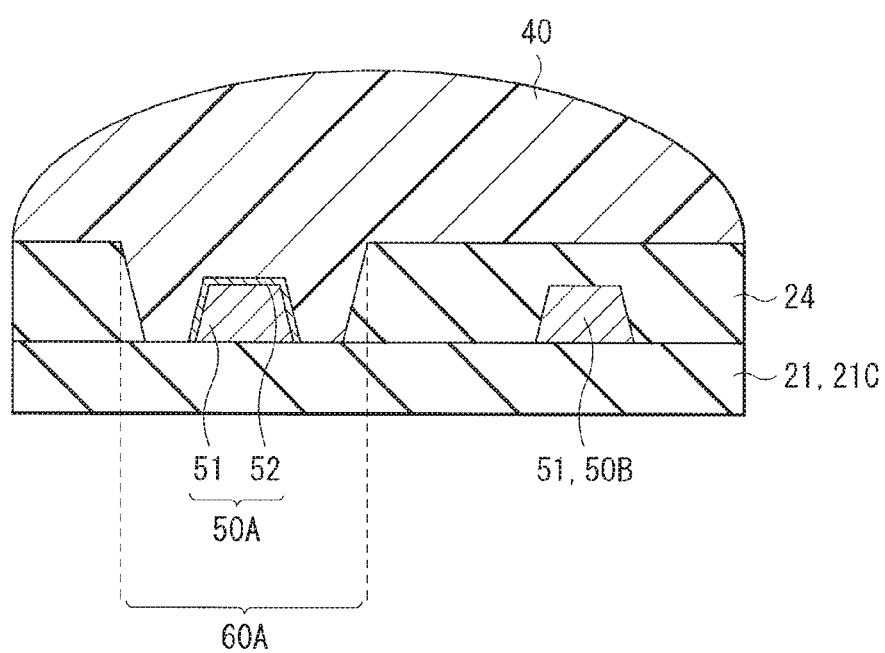

[ FIG. 36 ]
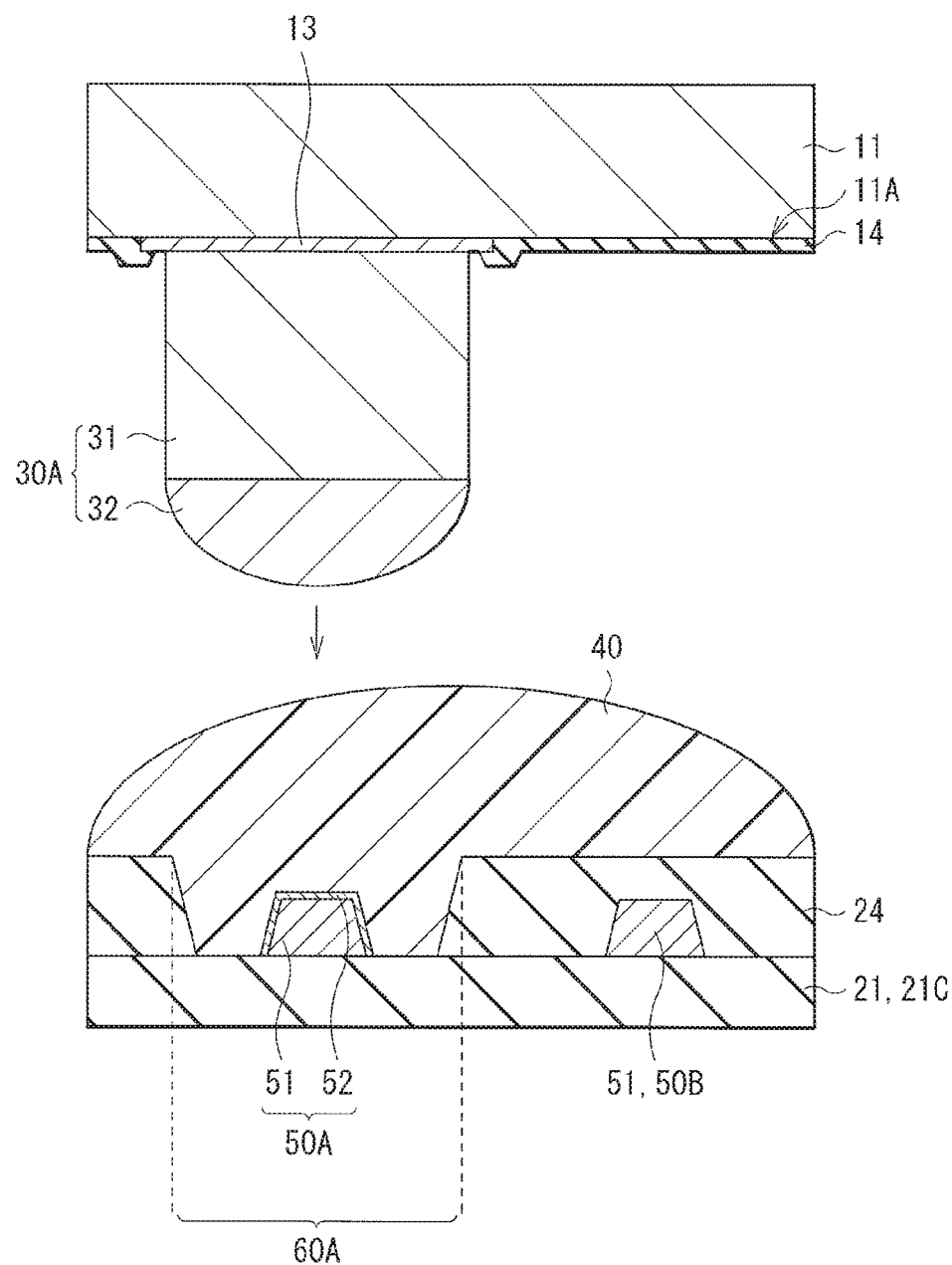

[ FIG. 37 ]
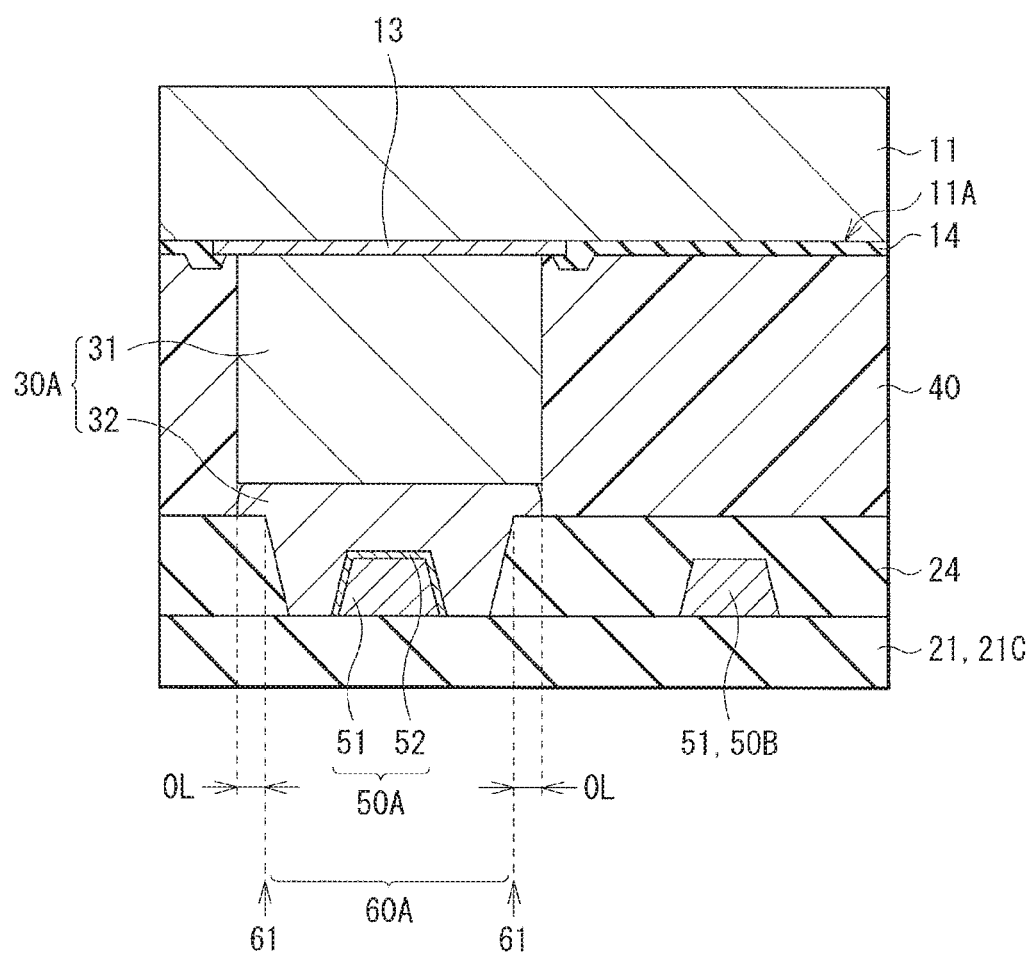

SEMICONDUCTOR DEVICE WITH A GAP CONTROL ELECTRODE AND METHOD OF MANUFACTURING THE SEMICONDUCTOR DEVICE

CROSS REFERENCE TO RELATED APPLICATIONS

This application is a U.S. National Phase of International Patent Application No. PCT/JP2015/066349 filed on Jun. 5, 2015, which claims priority benefit of Japanese Patent Application No. JP 2014-132333 filed in the Japan Patent Office on Jun. 27, 2014. Both of the above-referenced applications is hereby incorporated herein by reference in its entirety.

TECHNICAL FIELD

The disclosure relates to a semiconductor device that utilizes a flip chip technique, and a method of manufacturing the semiconductor device.

BACKGROUND ART

In recent years, apparatuses having picture output functions, e.g., smartphones, tablet computers, television receivers, and game machines, have had remarkable improvement in display resolution. For adaptation thereto, there has been expansion of a memory band desired for an image processor LSI (Large Scale Integrated Circuit) installed in such apparatuses. Known techniques to achieve a wide memory band may include Chip on Chip (CoC), as disclosed in Patent Literature 1. However, the CoC technique may tend to incur higher costs, because of use of DRAM (Dynamic Random Access Memory) having a special interface, or use of techniques such as fine connection using microbumps. A general approach may be, therefore, to use a plurality of DRAMs having a standard DDR (Double Data Rate) interface and to ensure the memory band by increasing the number of connection channels between the image processor LSI and the DRAMs. A 64-bit interface is in actual use in apparatuses such as smartphones, and the use of such an interface is expected to be spreading in the future.

Moreover, miniaturization of semiconductor devices has allowed for integration of a greater number of transistors in a chip. This has made it possible to integrate even more functions in one chip. For example, an application processor currently used in the smartphone or the tablet computer, and the LSI incorporated in a digital television receiver mainly use what unitizes CPU (Central Processing Unit), GPU (Graphics Processing Unit), and various interfaces as one chip.

Such advances in multi-channeling of a memory interface and in functional integration in one chip have caused a tendency of an increase in the number of terminals that connect the LSI to outside. In related arts, a packaging method has been generally adopted in which a semiconductor chip is connected to a packaging substrate by wire bonding. In recent years, however, in order to adapt to the increase in the connection terminals, adoption of a so-called flip chip technique has been increasing. The flip chip technique involves connecting the semiconductor chip to the packaging substrate with use of solder bumps. In particular, a technique generally used in the flip chip technique is called C4 (Controlled Collapse Chip Connection), as disclosed in, for example, Patent Literature 2.

In the C4 technique, on side of the packaging substrate, a solder resist may be provided in advance with apertures. The apertures each may have a substantially same size as a size of a solder bump to be used for connection. A paste solder material may be printed in the apertures. Then, a chip provided in advance with solder bumps may be mounted on the printed solder material, with use of flux. By a batch reflow method, the solder may melt to form connection. An underfill resin may be filled for sealing, between the chip and the packaging substrate. With this technique used, miniaturization of an inter-terminal pitch may become difficult, for the following reasons. First, in order to ensure a gap between the chip and the packaging substrate to fill the underfill resin, it is desirable to increase a diameter of the solder bump formed on side of the chip. Second, the solder paste may be formed by a printing method, causing difficulty in formation of fine patterns. Accordingly, the pitch between the connection terminals may become about 150 μm to 180 μm both inclusive. This leads to expectation of difficulty in adaptation to an increase in the number of signals in the future, or to chip shrinkage due to device miniaturization.

In view of the current situation as described above, Patent Literature 3 discloses a technique that involves performing flip chip directly on wirings, for purpose of a further increase in signal terminal density and reduction in substrate costs. In the existing C4 technique, a land having a larger size than the bump diameter may be formed on the packaging substrate. In contrast, in this technique, a bump may be pressed onto a wiring having a smaller width than a bump diameter, to join the bump and the wiring together, with the wiring forcing itself into the bump. Thus, this technique has made improvement in an effort to attain high bonding strength even in a case with use of bumps having small diameters. In addition, a bump structure may be generally used in which solder plating is performed on a metal pillar, or a so-called pillar. This makes it possible to ensure the gap, between the chip and the packaging substrate, desirable for injection of the underfill resin even in the case with use of bumps having small diameters.

CITATION LIST

Patent Literature

Patent Literature 1: JP 2010-192886A
Patent Literature 2: Specification of U.S. Pat. No. 5,900,675
Patent Literature 3: JP 2012-119648A

SUMMARY OF INVENTION

However, the use of such a bump structure having a solder layer at a tip of a columnar metal layer may cause difficulty in controlling a gap between a semiconductor chip and a packaging substrate. Accordingly, if a gap between the columnar metal layer and a wiring becomes excessively narrow, solder interposed between the columnar metal layer and the wiring may be expelled, causing a short circuit with an adjacent wiring.

It is therefore desirable to provide a semiconductor device and a method of manufacturing the same that make it possible to stably control a gap between a semiconductor chip and a packaging substrate and to suppress a short circuit between adjacent wirings.

A semiconductor device according to an embodiment of the disclosure includes a semiconductor chip, and a packaging substrate on which the semiconductor chip is mounted. The semiconductor chip includes a chip body and a plurality of solder-including electrodes provided on an element-formation surface of the chip body. The packaging substrate includes a substrate body, a plurality of wirings, and a solder resist layer, in which the plurality of wirings and the solder resist layer are provided on a front surface of the substrate body. The solder resist layer is provided as a continuous layer on the front surface of the substrate body and the plurality of wirings, and has an aperture on each of the plurality of wirings. The plurality of solder-including electrodes include at least one gap control electrode. The at least one gap control electrode includes a columnar metal layer and a solder layer in order named from side on which the chip body is disposed, and includes an overlap region where the columnar metal layer and the solder resist layer overlap each other, along part or all of an aperture end of the aperture.

In the semiconductor device according to the embodiment of the disclosure, the plurality of solder-including electrodes include the at least one gap control electrode. The at least one gap control electrode includes the overlap region where the columnar metal layer and the solder resist layer overlap each other, along part or all of the aperture end of the aperture. Thus, a gap between the semiconductor chip and the packaging substrate is defined as a value equal to or larger than a height of the columnar metal layer. Accordingly, the gap between the semiconductor chip and the packaging substrate is restrained from becoming excessively small, and causing the solder interposed between the columnar metal layer and the wiring to be expelled, for example. Hence, a short circuit between the adjacent wirings is suppressed.

A first method of manufacturing a semiconductor device according to an embodiment of the disclosure includes: aligning a semiconductor chip with a packaging substrate, in which the semiconductor chip includes a chip body and a plurality of solder-including electrodes provided on an element-formation surface of the chip body, and the packaging substrate includes a substrate body, a plurality of wirings, and a solder resist layer, in which the plurality of wirings and the solder resist layer are provided on a front surface of the substrate body; temporarily bonding the semiconductor chip to the packaging substrate; connecting the plurality of solder-including electrodes to the plurality of wirings, by reflow heating; and injecting an underfill resin between the semiconductor chip and the packaging substrate, and curing the underfill resin. The solder resist layer is provided as a continuous layer on the front surface of the substrate body and the plurality of wirings, and has an aperture on each of the plurality of wirings. The plurality of solder-including electrodes include at least one gap control electrode. The at least one gap control electrode includes a columnar metal layer and a solder layer in order named from side on which the chip body is disposed. The temporarily bonding of the semiconductor chip to the packaging substrate includes heating the semiconductor chip and pressure-bonding the semiconductor chip to the packaging substrate, and detecting a load by allowing the columnar metal layer of the at least one gap control electrode and the solder resist layer to be in contact with each other.

A second method of manufacturing a semiconductor device according to an embodiment of the disclosure includes: aligning a semiconductor chip with a packaging substrate after heating the semiconductor chip at a temperature equal to or higher than a melting point of solder, in which the semiconductor chip includes a chip body and a plurality of solder-including electrodes provided on an element-formation surface of the chip body, and the packaging substrate includes a substrate body, a plurality of wirings, and a solder resist layer, in which the plurality of wirings and the solder resist layer are provided on a front surface of the substrate body; connecting the plurality of solder-including electrodes to the plurality of wirings; and injecting an underfill resin between the semiconductor chip and the packaging substrate, and curing the underfill resin. The solder resist layer is provided as a continuous layer on the front surface of the substrate body and the plurality of wirings, and has an aperture on each of the plurality of wirings. The plurality of solder-including electrodes include at least one gap control electrode. The at least one gap control electrode includes a columnar metal layer and a solder layer in order named from side on which the chip body is disposed. The connecting of the plurality of solder-including electrodes to the plurality of wirings includes pressure-bonding the semiconductor chip to the packaging substrate, detecting a load by allowing the columnar metal layer of the at least one gap control electrode and the solder resist layer to be in contact with each other, and adjusting a gap between the semiconductor chip and the packaging substrate.

A third method of manufacturing a semiconductor device according to an embodiment of the disclosure includes: aligning a semiconductor chip with a packaging substrate, in which the semiconductor chip includes a chip body and a plurality of solder-including electrodes provided on an element-formation surface of the chip body, and the packaging substrate includes a substrate body, a plurality of wirings, and a solder resist layer, in which the plurality of wirings and the solder resist layer are provided on a front surface of the substrate body; connecting the plurality of solder-including electrodes to the plurality of wirings; and injecting an underfill resin between the semiconductor chip and the packaging substrate, and curing the underfill resin. The solder resist layer is provided as a continuous layer on the front surface of the substrate body and the plurality of wirings, and has an aperture on each of the plurality of wirings. The plurality of solder-including electrodes include at least one gap control electrode. The at least one gap control electrode includes a columnar metal layer and a solder layer in order named from side on which the chip body is disposed. The connecting of the plurality of solder-including electrodes to the plurality of wirings includes pressure-bonding the semiconductor chip to the packaging substrate, detecting a load by allowing the columnar metal layer of the at least one gap control electrode and the solder resist layer to be in contact with each other, and heating the semiconductor chip at a temperature equal to or higher than a melting point of the solder and pressure-bonding the semiconductor chip to the packaging substrate, to connect the plurality of solder-including electrodes to the plurality of wirings.

A fourth method of manufacturing a semiconductor device according to an embodiment of the disclosure includes: supplying an underfill resin on a packaging substrate, in which the packaging substrate includes a substrate body, a plurality of wirings, and a solder layer, in which the plurality of wirings and the solder resist layer are provided on a front surface of the substrate body; aligning a semiconductor chip with the packaging substrate, in which the semiconductor chip includes a chip body and a plurality of solder-including electrodes provided on an element-formation surface of the chip body; connecting the plurality of solder-including electrodes to the plurality of wirings, and temporarily curing the underfill resin; and permanently curing the underfill resin. The solder resist layer is provided as a continuous layer on the front surface of the substrate body and the plurality of wirings, and has an aperture on each of the plurality of wirings. The plurality of solder-including electrodes include at least one gap control electrode. The at least one gap control electrode includes a columnar metal layer and a solder layer in order named from side on which the chip body is disposed. The connecting of the plurality of solder-including electrodes to the plurality of wirings includes pressure-bonding the semiconductor chip to the packaging substrate, detecting a load by allowing the columnar metal layer of the at least one gap control electrode and the solder resist layer to be in contact with each other, and heating the semiconductor chip at a temperature equal to or higher than a melting point of the solder and pressure-bonding the semiconductor chip to the packaging substrate, to connect the plurality of solder-including electrodes to the plurality of wirings.

According to the semiconductor device of the embodiment of the disclosure, the plurality of solder-including electrodes include the at least one gap control electrode. The at least one gap control electrode includes the overlap region where the columnar metal layer and the solder resist layer overlap each other, along part or all of the aperture end of the aperture. Hence, it is possible to stably control the gap between the semiconductor chip and the package substrate, and thereby to suppress the short circuit between the adjacent wirings.

According to the first to fourth methods of manufacturing the semiconductor devices of the embodiments of the disclosure, the plurality of solder-including electrodes are formed to include the at least one gap control electrode. In heating the semiconductor chip and pressure-bonding the semiconductor chip to the packaging substrate, or in pressure-boding the semiconductor chip to the packaging substrate, the load is detected by allowing the columnar metal layer of the at least one gap control electrode and the solder resist layer to be in contact with each other. Hence, it is possible to easily manufacture the semiconductor device of the embodiment of the disclosure.

It is to be noted that some effects described here are not necessarily limitative, and any of other effects described herein may be achieved.

BRIEF DESCRIPTION OF DRAWINGS

FIG. 1 is a schematic top view of an overall configuration of a semiconductor device according to a first embodiment of the disclosure.

FIG. 2 is a schematic cross-sectional view of the overall configuration of the semiconductor device illustrated in FIG. 1.

FIG. 3 is an enlarged top view of part of the semiconductor device illustrated in FIG. 1.

FIG. 4 is a cross-sectional view taken along a line IV-IV of FIG. 3.

FIG. 5 is an enlarged cross-sectional view of part of a semiconductor device according to a modification example 1-1.

FIG. 6 is an enlarged top view of part of a semiconductor device according to a second embodiment of the disclosure.

FIG. 7 is a cross-sectional view taken along a line VII-VII of FIG. 6.

FIG. 8 is a cross-sectional view taken along a line VIII-VIII of FIG. 6.

FIG. 9 is a cross-sectional view that illustrates an example of positional deviation between an aperture and a solder-including electrode.

FIG. 10 is an enlarged top view of part of a semiconductor device according to a modification example 2-1.

FIG. 11 is a top view that illustrates a case with an aperture having a rectangular planar shape.

FIG. 12 is an enlarged top view of part of a semiconductor device according to a modification example 2-2.

FIG. 13 is an enlarged top view of part of a semiconductor device according to a modification example 2-3.

FIG. 14 is a cross-sectional view taken along a line XIV-XIV of FIG. 13.

FIG. 15 is an enlarged top view of part of a semiconductor device according to a modification example 2-4.

FIG. 16 is an enlarged top view of part of a semiconductor device according to a modification example 2-5.

FIG. 17 is an enlarged cross-sectional view of part of a semiconductor device according to a third embodiment of the disclosure.

FIG. 18 is a schematic top view of an overall configuration of a semiconductor device according to a fourth embodiment of the disclosure.

FIG. 19 is a schematic cross-sectional view of the overall configuration of the semiconductor device illustrated in FIG. 18.

FIG. 20 is a schematic cross-sectional view of an overall configuration of a semiconductor device according to a fifth embodiment of the disclosure.

FIG. 21 is a schematic cross-sectional view of an overall configuration of a semiconductor device according to a modification example 5-1.

FIG. 22 is a schematic cross-sectional view of an overall configuration of a semiconductor device according to a modification example 5-2.

FIG. 23 is a cross-sectional view that illustrates a method of manufacturing a semiconductor device according to a sixth embodiment of the disclosure in the order of procedure, and is a cross-sectional view that illustrates a method of manufacturing a solder-including electrode illustrated in FIG. 7 in the order of procedure.

FIG. 24 is a cross-sectional view of a process following FIG. 23.

FIG. 25 is a cross-sectional view of a process following FIG. 24.

FIG. 26 is a cross-sectional view of a process following FIG. 25.

FIG. 27 is a cross-sectional view of a process following FIG. 26.

FIG. 28 is a cross-sectional view of a process following FIG. 27.

FIG. 29 is a cross-sectional view of a process following FIG. 28.

FIG. 30 is a cross-sectional view of a process following FIG. 29.

FIG. 31 is a cross-sectional view that illustrates a method of manufacturing a semiconductor device according to a seventh embodiment of the disclosure in the order of procedure, and is a cross-sectional view that illustrates a method of connecting a packaging substrate to a semiconductor chip illustrated in FIG. 7 in the order of procedure.

FIG. 32 is a cross-sectional view of a process following FIG. 31.

FIG. 33 is a cross-sectional view of a process following FIG. 32.

FIG. 34 is a cross-sectional view of a process following FIG. 33.

FIG. 35 is a cross-sectional view that illustrates a method of manufacturing a semiconductor device according to a tenth embodiment of the disclosure in the order of procedure.

FIG. 36 is a cross-sectional view of a process following FIG. 35.

FIG. 37 is a cross-sectional view of a process following FIG. 36.

DESCRIPTION OF EMBODIMENTS

In the following, some embodiments of the disclosure are described in detail with reference to the drawings. Note that description is made in the following order.
1. First Embodiment (a semiconductor device; an example in which an aperture of a solder resist layer has a circular shape, and a diameter of a columnar metal layer is larger than a width (diameter) of the aperture)
2. Modification Example 1-1 (an example in which a center of the columnar metal layer is out of alignment with a center of the aperture)
3. Second Embodiment (a semiconductor device; an example in which an aperture of a solder resist layer has a substantially rectangular planar shape, with a length of the aperture adjusted in accordance with a thermal expansion coefficient of a packaging substrate)
4. Modification Example 2-1 (an example in which the aperture has a planar shape of an ellipse)
5. Modification Example 2-2 (an example in which, inside the aperture, a wiring includes a widened part)
6. Modification Example 2-3 (an example in which, inside the aperture, a wiring has a break)
7. Modification Example 2-4 (an example in which two apertures have oblique notches at their corners, and the two apertures are adjacently disposed with the oblique notches confronted with each other)
8. Modification Example 2-5 (an example in which two apertures have oblique notches at their sides, and the two apertures are adjacently disposed with the oblique notches confronted with each other)
9. Third Embodiment (a semiconductor device; an example in which a thickness of a solder resist layer inside an aperture is smaller than a thickness of the solder resist layer in a region other than the aperture out of a front surface of a substrate body)
10. Fourth Embodiment (a semiconductor device; an example of an MCM (Multi Chip Module))
11. Fifth Embodiment (a semiconductor device; an example of sealing with a mold resin)
12. Sixth Embodiment (a method of manufacturing a semiconductor device; an example that involves temporarily bonding with use of flux, and thereafter, performing a batch reflow process)
13. Seventh Embodiment (a method of manufacturing a semiconductor device; an example of local reflow)
14. Eighth Embodiment (a method of manufacturing a semiconductor device; an example of temporarily bonding by thermocompression)
15. Ninth Embodiment (a method of manufacturing a semiconductor device; an example of thermocompression, with a temperature on tool side fixed)
16. Tenth Embodiment (a method of manufacturing a semiconductor device; an example in which an underfill resin is supplied in advance on a packaging substrate)

First Embodiment

FIG. 1 schematically illustrates an overall configuration of a semiconductor device according to a first embodiment of the disclosure. FIG. 2 schematically illustrates a cross-sectional configuration of the semiconductor device, taken along a line II-II. A semiconductor device 1 may be, for example, a flip chip semiconductor device in which a semiconductor chip 10 and a packaging substrate 20 may be connected by a plurality of solder-including electrodes 30. An underfill resin 40 may be provided between the semiconductor chip 10 and the packaging substrate 20.

Referring to FIG. 2, the semiconductor chip 10 includes a chip body 11 that may be made of, for example, silicon (Si). An element (undepicted) may be provided on one surface (an element-formation surface) of the chip body 11. The semiconductor chip 10 may be mounted on a chip mounting region 20A in a central part of the packaging substrate 20, in a face-down posture in which the element-formation surface 11A of the chip body 11 may be oriented toward the packaging substrate 20. It is to be noted that the top view of FIG. 1 depicts a chip outline 10A of the semiconductor chip 10 in a broken line, with the semiconductor chip 10 and the underfill resin 40 omitted.

The plurality of solder-including electrodes 30 are provided on the element-formation surface 11A of the chip body 11, as illustrated in FIG. 2. The plurality of solder-including electrodes 30 may be provided, for example, in a peripheral part of the element-formation surface 11A of the chip body 11 of the semiconductor chip 10, at predetermined intervals and in a predetermined arrangement.

Referring to FIGS. 1 and 2, the packaging substrate 20 includes a substrate body 21, for example. As illustrated in FIG. 1, the chip mounting region 20A and a plurality of wirings 50 may be provided in a front surface (a semiconductor chip mounting surface) 21A of the substrate body 21. A via 22 may be provided on one end (a first end) of each of the plurality of wirings 50. As illustrated in FIG. 2, a solder ball 23 may be provided on a rear surface 21B of the substrate body 21. It is to be noted that the plurality of wirings 50 are omitted in the cross-sectional view of FIG. 2.

The substrate body 21 may have a stacked structure including, for example, a resin substrate (undepicted), a wiring layer made of, for example, copper (Co), and a solder resist layer (undepicted), but there is no particular limitation on its configurations.

The plurality of wirings 50 may be extended outward of the substrate body 21 from a peripheral part of the chip mounting region 20A, for example. The plurality of wirings 50 may be disposed in parallel with one another at each side of the chip mounting region 20A, and expanded in a radial pattern in an outer region of the substrate body 21. It is to be noted that the plurality of wirings 50 may be extended inward of the substrate body 21 from the peripheral part of the chip mounting region 20A.

The via 22 may be provided between the one end (the first end) of each of the plurality of wirings 50 and the solder ball 23, and penetrate the substrate body 21 of the packaging substrate 20. The via 22 may transfer each terminal from the front surface (the semiconductor chip mounting surface) 21A of the packaging substrate 20 to the rear surface 21B (toward the solder ball 23). Each terminal may be extended from the semiconductor chip 10, with use of the plurality of solder-including electrodes 30 and the plurality of wirings 50. In this embodiment, a size of the via 22 formed on the packaging substrate 20 may be larger than a size of each of the plurality of solder-including electrodes 30. For this reason, as illustrated in FIG. 1, each terminal may be extended from the semiconductor chip 10 with use of the plurality of solder-including electrodes 30, and extracted to a peripheral part of the substrate body 21 with use of the plurality of wirings 50, on the packaging substrate 20. This allows for widening of an inter-wiring pitch of the plurality of wirings 50. Furthermore, each terminal may be extracted toward the solder ball 23 on the packaging substrate 20 with use of the via 22.

The solder ball 23 may perform signal input into and output from the semiconductor chip 10, and perform power supply to the semiconductor chip 10.

The underfill resin 40 may protect bonding parts between the plurality of solder-including electrode 30 and the plurality of wirings 50, and be filled between the semiconductor chip 10 and the packaging substrate 20. In one preferred example, fillers may be dispersed in the underfill resin 40, in order to adjust a thermal expansion coefficient. As the fillers, for example, silicon oxide in a spherical shape may be used. In one desired example, the thermal expansion coefficient of the underfill resin 40 may be adjusted to, for example, approximately 10 ppm/° C. to 50 ppm/° C. both inclusive.

FIG. 3 illustrates, in an enlarged manner, part of the semiconductor device 1 illustrated in FIG. 1. Specifically, FIG. 3 illustrates a plan configuration of the two adjacent wirings 50 (50A and 50B) in vicinity of the peripheral part of the chip mounting region 20A. It is to be noted that the semiconductor chip 10 and the underfill resin 40 are omitted in the top view of FIG. 3 for an easier understanding, but the semiconductor chip 10 may be disposed in a region leftward of the chip outline 10A of the semiconductor chip 10 denoted by a broken line.

The packaging substrate 20 may include a solder resist layer 24, as well as the plurality of wirings 50, on the front surface 21A of the substrate body 21. The solder resist layer 24 may be made of, for example, a negative photosensitive permanent resist material.

The solder resist layer 24 is provided as a continuous layer on the front surface 21A of the substrate body 21 and the plurality of wirings 50, and has an aperture 60 on each of the plurality of wirings 50. In one specific example, each of the plurality of wirings 50 may have, for example, a land 57 having a circular shape, on another end (a second end). The aperture 60 may be provided, for example, in a circular shape on the land 57. FIG. 3 depicts, for example, the two apertures 60A and 60B provided on the two wirings 50A and 50B. Inside the aperture 60A, the wiring 50A and the solder-including electrode 30A may be bonded together. Inside the aperture 60B as well, the wiring 50B and the solder-including electrode 30B may be bonded together. Thus, the plurality of solder-including electrodes 30 and the plurality of wirings 50 may be bonded together inside the apertures 60, to form connection between the semiconductor chip 10 and the packaging substrate 20. It is to be noted that in FIG. 3, a region in which the solder resist layer 24 is provided is represented by a lightly dotted region.

As described, the solder resist layer 24 is provided as the continuous layer, and has the partial apertures 60. This makes it possible to ensure insulation between the plurality of adjacent wirings 50. Accordingly, even when the two wirings 50A and 50B are arranged at a small pitch of about 40 μm, it is possible to reduce possibility that the solder-including electrode 30A connected to the wiring 50A comes into contact with the adjacent wiring 50B. This allows for suppression of occurrence of a short circuit.

Moreover, because the solder resist layer 24 has the partial apertures 60, the solder resist layer 24 is continuous or undivided on the packaging substrate 20. Hence, it is possible to prevent the plurality of wirings 50 from peeling off, and to prevent the solder resist layer 24 from peeling off FIG. 4 illustrates a cross-sectional configuration of the aperture 60A, taken along a line IV-IV of FIG. 3. It is to be noted that the aperture 60B may have a similar configuration as well. The aperture 60 may allow part of an upper surface 53 of the wiring 50 inside the aperture 60 to be exposed, for example. Each of the plurality of solder-including electrodes 30 may cover an exposed part of the wiring 50 inside the aperture 60.

Each of the plurality of solder-including electrodes 30 includes, for example, a columnar metal layer 31 and a solder layer 32, in the order named from side on which the chip body 11 is disposed. The columnar metal layer 31 is made of a metal having a higher melting point than a melting point of solder that constitutes the solder layer 32. This allows for limited use of the solder material to a tip part of the solder-including electrode 30, as compared to solder bump connection as used in the existing C4 technique. Accordingly, the diameter d of the solder-including electrode 30 may be substantially limited to a diameter of the columnar metal layer 31, even when the solder melts into a spherical shape due to surface tension. It is therefore possible to reduce an inter-electrode pitch of the plurality of solder-including electrodes 30.

In one preferred example, the columnar metal layer 31 may be made of copper (Cu), or include a stacked film of copper (Cu) and nickel (Ni), for example. The solder layer 32 may be made of, for example, tin (Sn) or Sn—Ag.

The columnar metal layer 31 including copper makes it possible to enhance heat dissipation of the semiconductor device 1 even more, since copper has optimal thermal conductivity. Moreover, copper and the solder material form an alloy having an optimal strength. This makes it possible to provide an electrode structure having more optimal connection strength.

With the solder layer 32 made of tin or Sn—Ag, copper may disperse inside the solder layer 32 when the columnar metal layer 31 includes copper. An Sn—Cu alloy may be formed when the solder layer 32 is made of tin, while an Sn—Ag—Cu alloy may be formed when the solder layer 32 is made of Sn—Ag. These are known to have stable and optimal mechanical characteristics as solder materials, and make it possible to provide a connection structure having more optimal strength and more optimal reliability.

In one preferred alternative example, the columnar metal layer 31 may be made of copper (Cu), or include a stacked film of copper (Cu) and nickel (Ni), for example. The solder layer 32 may be made of, for example, indium (In) or In—Ag. In this case, the description given above may apply to the columnar metal layer 31. Moreover, the solder layer 32 made of indium or In—Ag allows for lowering of the melting point. This makes it possible to reduce thermal stress generated during an assembly process, and to provide a structure having a more optimal yield and more optimal reliability.

In one preferred example, a height H31 of the columnar metal layer 31 may be larger than a height H32 of the solder layer 32. This makes it possible to increase a gap G between the semiconductor chip 10 and the packaging substrate 20, in spite of a decrease in an amount of the solder, by the height H31 of the columnar metal layer 31. It is therefore possible to form the plurality of solder-including electrodes 30 at the narrower pitch, while allowing for easier injection of the underfill resin 40.

In one preferred example, the aperture 60 may be filled with the solder layer 32. If a minute aperture that is not filled with the solder should remain inside the aperture 60, it is difficult to fill the minute aperture with the underfill resin 40 in post-processes, leading to possibility that the minute aperture may become a void. In this case, there may be possibility that air inside the void may expand to cause a bonding failure in a ball attachment or in a reflow process in secondary mounting, or possibility that the molten solder may flow along the void to cause the short circuit between the adjacent wirings 50. Filling the aperture 60 with the solder layer 32 makes it possible to suppress the occurrence of the void, or the bonding failure or the short circuit due to the void, and to prevent the yield or the reliability from being lowered.

In one preferred example, a volume of the solder layer 32 may be larger than a volume of the aperture 60. This makes it possible to surely fill the aperture 60 with the solder layer 32. Moreover, with the volume of the solder layer 32 larger than the volume of the aperture 60, it is possible to provide a sufficient amount of the solder, and to allow the bonding part between the solder-including electrode 30 and the wiring 50 to have an optimal shape. Accordingly, the bonding part between the solder-including electrode 30 and the wiring 50 may be kept from having a distorted shape, or from having a partly constricted shape. Hence, it is possible to avoid concentration of stress to the solder layer 32, leading to higher mechanical strength of the bonding part.

Moreover, in this embodiment, the plurality of solder-including electrodes 30 each have a function of serving as a gap control electrode that controls the gap G between the semiconductor chip 10 and the packaging substrate 20. In other words, the plurality of solder-including electrodes 30 each include an overlap region OL where the columnar metal layer 31 and the solder resist layer 24 overlap each other, along all (a perimeter) of an aperture end (outline) 61 of the aperture 60. Hence, in the semiconductor device 1, it is possible to stably control the gap G between the semiconductor chip 10 and the packaging substrate 20, and to suppress the short circuit between the adjacent wirings 50.

The following effects may be obtained by adopting such an arrangement of the columnar metal layer 31 and the aperture 60. Whatever technique is adopted in connecting the semiconductor chip 10 to the packaging substrate 20, it is possible to avoid direct contact between the columnar metal layer 31 and the wiring 50. In other words, the gap G between the semiconductor chip 10 and the packaging substrate 20 may be self-alignedly adjusted to a value equal to or higher than the height H31 of the columnar metal layer 31. Accordingly, a distance between the columnar metal layer 31 and the wiring 50 may be restrained from becoming excessively small, and resulting in the short circuit between the solder layer 32 forced out of the aperture 60 and the nearby solder-including electrode 30. It is therefore possible to produce, with a high yield, the flip chip semiconductor device 1 in which an inter-electrode pitch of the plurality of solder-including electrodes 30 is narrowed. Moreover, it is possible to provide the stable gap G, without providing an extra structure such as a spacer for gap adjustment.

In one preferred example, the diameter d of the columnar metal layer 31 may be larger than a width (diameter) W of the aperture 60, along part or all of the aperture end 61 of the aperture 60. In this embodiment, the width (diameter) d of the columnar metal layer 31 may be, for example, 90 µm. A diameter φ57 of the land 57 may be, for example, 110 µm. The width (diameter) W of the aperture 60 may be, for example, 80 µm.

It is to be noted that description in this embodiment is given on a case in which, as illustrated in FIG. 3, the solder-including electrode 30 and the aperture 60 may have a planar positional relationship of a concentric circular shape, and the solder-including electrode 30 may include the overlap region OL along all of the aperture end 61 of the aperture 60. However, the plurality of solder-including electrodes 30 each may include the overlap region OL where the columnar metal layer 31 and the solder resist layer 24 overlap each other, along part of the aperture end 61 of the aperture 60. This case is described later in a second embodiment.

A pad 13 made of aluminum (Al) may be provided on the element-formation surface 11A of the chip body 11 of the semiconductor chip 10. The columnar metal layer 31 may be electrically connected to the pad 13 through a conductive thin film and a barrier film in the order named from side on which the columnar metal layer 31 is disposed, but the conductive thin film and the barrier film are omitted in FIG. 4. For example, copper (Cu) as the conductive thin film, and for example, TiW as the barrier film may be formed by sputtering. A passivation film 14 may cover a region other than a region in which the pad 13 is provided, out of the element-formation surface 11A of the chip body 11 of the semiconductor chip 10. It is to be noted that not only the pad 13 and the passivation film 14 but also layers such as wiring layers and diffusion layers may be formed in the semiconductor chip 10, but the layers such as the wiring layers and the diffusion layers are omitted in FIG. 4.

The plurality of wirings 50 may be wirings on an outermost layer of the packaging substrate 20. It is to be noted that FIG. 4 depicts a single-layer structure of an insulating layer 21C provided directly under the plurality of wirings 50, as the substrate body 21 of the packaging substrate 20. However, the substrate body 21 may be a stacked structure including a layer or layers other than the insulating layer 21C.

In one preferred example, each of the plurality of wirings 50 may include a metal wiring layer 51 and a surface coating 52. The metal wiring layer 51 may be made of copper (Cu) as a principal component. The surface coating 52 may cover a region exposed in the aperture 60, out of a surface of the metal wiring layer 51. Providing the surface coating 52 contributes to enhanced solder wettability, and promotes wetting and spreading of the solder over the surface of the metal wiring layer 51. This results in easier wetting and spreading of the solder over the whole exposed region of the wiring 50 inside the aperture 60, when the aperture 60 has a planar shape elongated in a lengthwise direction DL of the wiring 50 inside the aperture 60 as described later in the second embodiment. It is therefore possible to more surely encourage an effect of enhancing the bonding strength.

In one preferred example, the surface coating 52 may include, for example, an Ni—Au plating layer or an Ni—Pd—Au plating layer. Because nickel of the surface coating 52 and the solder layer 32 may form an alloy layer, the wiring 50 may be prevented from excessively forming an alloy layer with the solder, being thinned by the solder, and being dissipated and disconnected. The solder may be prevented from intruding into between the wiring 50 and the insulating layer 21C of the packaging substrate 20, causing lower adhesion strength of the wiring 50, and causing the wiring 50 to peel off and to be disconnected. Moreover, the solder layer 32 may react with gold of the surface coating 52, to improve wettability and to allow for prevention of a failure in bonding to the wiring 50. Also, wetting and spreading of the solder along the exposed wiring 50 makes it possible to steadily increase area of the bonding part between the solder-including electrode 30 and the wiring 50. In particular, adoption of non-electrolytic plating makes it possible to suppress variations in thickness of the surface coating 52, and to provide a structure having higher reliability of the bonding part.

A method of manufacturing the semiconductor device 1 is described in sixth to tenth embodiments.

In the semiconductor device 1, the plurality of solder-including electrodes 30 each have the function of serving as the gap control electrode, and each include the overlap region OL where the columnar metal layer 31 and the solder resist layer 24 overlap each other, along all or part of the aperture end 61 of the aperture 60. The gap G between the semiconductor chip 10 and the packaging substrate 20 may be thereby defined as a value equal to or higher than the height H31 of the columnar metal layer 31. Accordingly, the gap G between the columnar metal layer 31 and the wiring 50 may be restrained from becoming excessively small, and causing the solder interposed between the columnar metal layer 31 and the wiring 50 to be expelled. This may contribute to the suppression of the short circuit between the adjacent wirings 50 due to the solder thus expelled. Moreover, a volume of the solder layer 32 may be small as compared to a case of the existing C4 connection, but even when the gap G between the semiconductor chip 10 and the packaging substrate 20 becomes excessively wide, a solder shape of the bonding part may be restrained from being distorted due to shortage in an amount of the solder. Thus, a breakage of the solder due to concentration of stress or fatigue may be restrained.

As described, in this embodiment, the plurality of solder-including electrodes 30 are each provided with the function of serving as the gap control electrode, and the overlap region OL where the columnar metal layer 31 and the solder resist layer 24 overlap each other is provided along part or all of the aperture end 61 of the aperture 60. Hence, it is possible to stably control the gap G between the semiconductor chip 10 and the packaging substrate 20, and to suppress the short circuit between the adjacent wirings 50. It is therefore possible to suppress the short circuit due to shrinkage of the inter-wiring pitch of the plurality of wirings 50, or due to shrinkage of the inter-electrode pitch of the plurality of solder-including electrodes 30, when high-density flip chip connection is performed. Moreover, it is possible to suppress lowering of reliability of the bonding part due to a decrease in size of the plurality of solder-including electrodes 30, and to provide a product with high reliability or a high yield. Furthermore, it is also possible to provide such a product at even lower costs, with higher functionalization by increasing the number of connection terminals.

It is to be noted that description in the first embodiment is given on a case in which the plurality of solder-including electrodes 30 each serve as the gap control electrode. The solder resist layer 24 is, however, less liable to be deformed by the columnar metal layer 31 pressed against the solder resist layer 24. Accordingly, the plurality of solder-including electrodes 30 may include at least one gap control electrode, making it possible to obtain effects similar to those of the first embodiment.

Moreover, in one preferred example, the plurality of solder-including electrodes 30 may include a plurality of gap control electrodes, and at least one of the plurality of gap control electrodes may be disposed at each side of the rectangular semiconductor chip 10, in consideration of a tilt of the semiconductor chip 10 when the semiconductor chip 10 is pressure-bonded. Furthermore, the plurality of solder-including electrodes 30 each may have the function of serving as the gap control electrode as in the first embodiment, making it possible to obtain the effects more reliably, in consideration of variations in height of the plurality of solder-including electrodes 30 as well.

Modification Example 1-1

In addition, description in the forgoing first embodiment is given on a case where the overlap region OL where the columnar metal layer 31 and the solder resist layer 24 overlap each other may be provided, by allowing the diameter d of the columnar metal layer 31 to be larger than the width (diameter) W of the aperture 60. However, for example, as illustrated in FIG. 5, a center C31 of the columnar metal layer 31 may be out of alignment with a center C60 of the aperture 60. In this case as well, it is possible to provide the overlap region OL where the columnar metal layer 31 and the solder resist layer 24 overlap each other, and to obtain effects similar to those of the forgoing first embodiment. It is to be noted that this modification example is not limited to the first embodiment. It is possible to combine this modification example with any of second to tenth embodiments or any of modification examples to be described below.

Second Embodiment

FIG. 6 illustrates, in an enlarged manner, part of a semiconductor device 2 according to the second embodiment of the disclosure. Specifically, FIG. 6 illustrates a plan configuration of the two adjacent wirings 50 (50A and 50B) in the vicinity of the peripheral part of the chip mounting region 20A. It is to be noted that the semiconductor chip 10 and the underfill resin 40 are omitted in the top view of FIG. 6 for an easier understanding, but the semiconductor chip 10 may be disposed in the region leftward of the chip outline 10A of the semiconductor chip 10 denoted by the broken line.

In this embodiment, the aperture 60 may have a planar shape of a rectangle or substantially rectangle elongated in the lengthwise direction DL of the wiring 50 inside the aperture 60. A length L of the aperture 60 may be adjusted in accordance with the thermal expansion coefficient of the packaging substrate 20. Hence, in the semiconductor device 2, it is possible to alleviate influence of positional deviation between the aperture 60 and the solder-including electrode 30, and to suppress the short circuit between the adjacent wirings 50. Otherwise, the semiconductor device 2 according to this embodiment may have similar configurations, workings, and effects to those of the semiconductor device 1 according to the foregoing first embodiment. Description is therefore given with corresponding components denoted by same reference characters.

The solder resist layer 24 is provided as a continuous layer on the front surface 21A of the substrate body 21 and the plurality of wirings 50, and has the aperture 60 on each of the plurality of wirings 50. In one specific example, each of the plurality of wirings 50 may have, for example, a constant width W50. The aperture 60 may be provided, for example, in a rectangular or substantially rectangular shape on another end of each of the plurality of wirings 50. FIG. 6 depicts, for example, the two apertures 60A and 60B provided on the two wirings 50A and 50B. Inside the aperture 60A, the wiring 50A and the solder-including electrode 30A may be bonded together. Inside the aperture 60B as well, although undepicted, the wiring 50B and the solder-including electrode 30B may be bonded together. Thus, the plurality of solder-including electrodes 30 and the plurality of wirings 50 may be bonded together inside the apertures 60, to form connection between the semiconductor chip 10 and the packaging substrate 20. It is to be noted that in FIG. 6, a region in which the solder resist layer 24 is provided is represented by a lightly dotted region.

In one preferred example, as illustrated in FIG. 6, the adjacent apertures 60A and 60B may be arranged at alternatively deviated positions with respect to the lengthwise direction DL of the plurality of wirings 50 (a so-called staggered arrangement), in order to reduce the inter-wiring pitch P50 between the plurality of wirings 50.

FIG. 7 illustrates a cross-sectional configuration of the aperture 60A, taken along a line VII-VII of FIG. 6. It is to be noted that the aperture 60B may have a similar configuration as well. The aperture 60 may allow the upper surface 53 and all in a heightwise direction of side surfaces 54 of the wiring 50 inside the aperture 60 to be exposed, for example. Each of the plurality of solder-including electrodes 30 may cover the exposed part of the wiring 50 inside the aperture 60 (the part exposed in the aperture 60, out of the upper surface 53 and the side surfaces 54 of the wirings 50). In other words, the aperture 60 may be provided to allow the upper surface 53 and the side surfaces 54 of the wiring 50 inside the aperture 60 to be exposed. The aperture end 61 of the aperture 60 may be positioned outward of the side surfaces 54 of the wiring 50 inside the aperture 60. The diameter d of the solder-including electrode 30 may be larger than the width W50 of the wiring 50. The solder-including electrode 30 may be connected to the wiring 50, so as to envelope or surround the wiring 50.

In this way, area of connection between the solder-including electrode 30 and the wiring 50 may be enlarged, making it possible to form the bonding part between the solder-including electrode 30 and the wiring 50, not in a two-dimensional shape but in a three-dimensional shape. Consequently, it is possible to suppress an intermetallic compound generated in the bonding part from being destroyed, even when thermal stress due to the difference in the thermal expansion coefficients of the semiconductor chip 10 and the packaging substrate 20 is applied to the bonding part. The thermal stress may be caused by heating in mounting of the semiconductor chip 10, a reflow process in mounting in an assembly line, or heat generation during device operation. Hence, it is possible to enhance reliability.

In one preferred example, each of the plurality of solder-including electrodes 30 may include, for example, the columnar metal layer 31 and the solder layer 32, in the order named from side on which the chip body 11 is disposed, as with the first embodiment. The columnar metal layer 31 and the solder layer 32 may be configured similarly to those in the first embodiment.

In addition, the plurality of solder-including electrodes 30 each may have the function of serving as the gap control electrode that controls the gap G between the semiconductor chip 10 and the packaging substrate 20, as with the first embodiment. In other words, the plurality of solder-including electrodes 30 may have the overlap region OL where the columnar metal layer 31 and the solder resist layer 24 overlap each other, along part of the aperture end 61 of the aperture 60, as illustrated in FIG. 7. Hence, in the semiconductor device 2, it is possible to stably control the gap G between the semiconductor chip 10 and the packaging substrate 20, and to suppress the short circuit between the adjacent wirings 50, as with the first embodiment.

The pad 13 made of aluminum (Al) and the passivation film 14 may be provided on the element-formation surface 11A of the chip body 11 of the semiconductor chip 10, as with the first embodiment.

In one preferred example, each of the plurality of wirings 50 may include the metal wiring layer 51 and the surface coating 52, as with the first embodiment. The metal wiring layer 51 may be made of copper (Cu) as the principal component. The surface coating 52 may cover the region exposed in the aperture 60, out of the surface of the metal wiring layer 51. In one preferred example, the constituent material of the surface coating 52 may be similar to that in the first embodiment.

FIG. 8 illustrates a cross-sectional configuration of the aperture 60A, taken along a line VIII-VIII of FIG. 6. It is to be noted that the aperture 60B may have a similar configuration. As illustrated in FIGS. 6 and 8, the aperture 60 may have the planar shape elongated in the lengthwise direction DL of the wiring 50 inside the aperture 60. The length L of the aperture 60 may be adjusted in accordance with the thermal expansion coefficient of the packaging substrate 20. Hence, in the semiconductor device 2, it is possible to alleviate the influence of the positional deviation between the aperture 60 and the solder-including electrode 30, and to suppress the short circuit between the adjacent wirings 50.

Possible effects obtained by the aperture 60 elongated in the lengthwise direction DL of the wiring 50 inside the aperture 60 as described may be as follows. In order to connect the solder-including electrode 30 to the wiring 50, heating may be carried out to melt the solder. At this occasion, the aperture 60 of the solder resist layer 24 and the solder-including electrode 30 on the semiconductor chip 10 may be deviated from setting values, i.e., their relative positions at room temperature, because of the difference between the thermal expansion coefficients of the semiconductor chip 10 and the packaging substrate 20 including the wiring 50 and the insulating layer 21C. Because the thermal expansion coefficient of the packaging substrate 20 is generally larger than the thermal expansion coefficient of the semiconductor chip 10, there may be the positional deviation as illustrated in FIG. 9 at a temperature at which the solder melts.

In this embodiment, the aperture 60 may have the planar shape elongated in the lengthwise direction DL of the wiring 50 inside the aperture 60. The length L of the aperture 60 may be adjusted in accordance with the thermal expansion coefficient of the packaging substrate 20. This makes it possible to suppress the solder layer 32 from running on the solder resist layer 24 as illustrated in FIG. 9 to cause occurrence of the short circuit with the adjacent solder-including electrode 30B. Moreover, the plurality of wirings 50 may be arranged to be extended outward of the substrate body 21 from the peripheral part of the chip mounting region 20A, as illustrated in FIG. 1, so as to widen the inter-wiring pitch of the plurality of wirings 50 to the pitch of the vias 22. This arrangement of the plurality of wirings 50 may be combined with the aperture 60 elongated along the lengthwise direction DL of the wiring 50 inside the aperture 60, to produce the effects of the suppression of the short circuit as described.

Furthermore, enlarging the aperture 60 selectively along a specific direction, i.e., selectively along the lengthwise direction DL of the wiring 50 inside the aperture 60 makes it possible to provide a structure adapted to the positional deviation in heating, while maintaining the effects of the suppression of the short circuit without widening the pitch of the plurality of wirings 50.

In addition, it is possible to increase area of a region in which the solder layer 32 and the wiring 50 form an alloy layer. This leads to higher bonding strength, and enhancement in the yield and the reliability.

It is to be noted that in FIGS. 7 and 8, the width W50 of each of the wirings 50A and 50B may be, for example, 15 μm. The inter-wiring pitch P50 between the wirings 50A and 50B may be, for example, 40 μm. The height H50 of the wirings 50A and 50B may be, for example, 15 μm. The width W of the aperture 60 may be, for example, 40 μm, while the length L of the aperture 60 may be, for example, 60 μm. The height H31 of the columnar metal layer 31 may be, for example, 40 μm. The columnar metal layer 31 may have a shape of, for example, a circular column, and the diameter d may be, for example, 45 μm. Because the diameter d of the columnar metal layer 31 is larger than the width W of the aperture 60 as described above, it is possible to stably control the gap G between the semiconductor chip 10 and the packaging substrate 20, and to suppress the short circuit between the adjacent wirings 50, as described in the first embodiment. The height H32 of the solder layer 32 may be, for example, 18 μm. The gap between the semiconductor chip 10 and the packaging substrate 20 (a distance from the passivation layer 13 of the semiconductor chip 10 to the solder resist layer 24 of the packaging substrate 20) may be, for example, at least 40 μm or more.

In one preferred example, the length L of the aperture 60 may satisfy, for example, the following Expression 1.

$$L>(a-3.5)*D*(T-25)*10^{-6}+d \quad \text{Expression 1}$$

(In Expression 1, L denotes the length (mm) of the aperture 60, a denotes an equivalent thermal expansion coefficient (ppm/° C.) of the packaging substrate 20, D denotes a distance (mm) from a center of the packaging substrate 20 to the center of the aperture 60, T denotes a melting point (° C.) of the solder, and d denotes the diameter of the solder-including electrode 30.)

In the following, description is given on more details of Expression 1.

It is known that the thermal expansion coefficient of the packaging substrate 20 may be roughly substituted by the equivalent thermal expansion coefficient a that may be defined by the following Expression 2 (reference: "Thermophysical Properties Handbook", Japan Society of Thermophysical Properties, 1990, pp. 285-289).

$$a=\Sigma(\text{thickness*elastic modulus*} CTE)/\Sigma(\text{thickness*elastic modulus}) \quad \text{Expression 2}$$

Here, "Σ" denotes summing of values regarding all materials that constitute the packaging substrate 20. CTE is a thermal expansion coefficient of each material. When the solder that constitutes the solder layer 32 is Sn—Ag, the melting point is 221° C. Whatever bonding process is used, at least the packaging substrate 20 is heated to a temperature near the melting point of the solder. Accordingly, an amount of the positional deviation ΔL from a room-temperature state between the packaging substrate 20 and the solder layer 32 may be defined by the following Expression 3, with the room temperature assumed to be 25° C.

$$\Delta L=(a-3.5)*(221-25)*10^{-6}*D \quad \text{Expression 3}$$

Here, "D" denotes the distance from the center of the packaging substrate 20 to the bonding part (the center of the aperture 60). 3.5 is a thermal expansion coefficient of silicon (Si) that is a principal constituent material of the semiconductor chip 10. Accordingly, the length L of the aperture 60 may be at least a value equal to or larger than as given by the following Expression 4. This makes it possible to allow most of the solder to go into the aperture 60 even when the solder is heated in solder bonding.

$$L>(a-3.5)*(221-25)*D*10^{6}+d \quad \text{Expression 4}$$

Here, "d" denotes the diameter of each of the plurality of solder-including electrodes 30, i.e., the diameter of the columnar metal layer 31. In a desirable example, a maximum of the length L of the aperture 60 may be adjusted so as to allow the aperture 60 to be filled with the solder layer 32 as described above, in consideration of a volume of plating of the solder layer 32, the width W of the aperture 60, and the width W50 of the wiring 50.

For example, let us calculate the length L of the aperture 60 on an assumption that the packaging substrate 20 is manufactured with a configuration as summarized in Table 1.

TABLE 1

|  | Material used | Thickness (μm) | Elastic modulus (GPa) | CTE (ppm) |
| --- | --- | --- | --- | --- |
| Solder resist | AUS703 | 20 | 9 | 23 |
| L1: Wiring layer | Cu | 15 | 120 | 16 |
| Insulating layer | GX92 | 35 | 5 | 39 |
| L2: Cu wiring layer | Cu | 25 | 120 | 16 |
| Core insulating layer | E700GR | 800 | 33 | 8 |
| L3: Cu wiring layer | Cu | 25 | 120 | 16 |
| Insulating layer | GX92 | 35 | 5 | 39 |
| L4: Cu wiring layer | Cu | 15 | 120 | 16 |
| Solder resist | AUS703 | 20 | 9 | 23 |

The packaging substrate may be a build-up four-layer substrate, and include an epoxy material including glass cloth (Hitachi Chemical Company, Ltd.: 700GR) as a core material, an ABF film material (Ajinomoto Fine-Techno Co., Inc.: GX92) as a build-up material, a solder resist (Taiyo Ink Mfg. Co. Ltd.: AUS703), and wiring layers made of copper. A thickness of the core material may be 800 μm. A thickness of the build-up layer may be 35 μm. A solder resist thickness may be 20 μm. A thickness of a wiring layer as a surface layer may be 15 μm. A thickness of the wiring layer as a core layer may be 25 μm. An elastic modulus and a thermal expansion coefficient (CTE) of each material may be as summarized in Table 1. Regarding a position at which the columnar metal layer 31 is disposed, D may be equal to approximately 7.06 mm (D=approximately 7.06 mm), when considering angles (corners) at which thermal expansion becomes largest, on an assumption that, for example, the pads 13 are arranged in an area of 10 mm□. The pads 13 may serve as I/O pads of the semiconductor chip 10.

With use of these parameters, the equivalent thermal expansion coefficient a may be given by Expression 2 as approximately 10.5 ppm/° C. Assume that a temperature applied in a process of connecting the semiconductor chip 10 to the plurality of wirings 50 with use of the solder layer 32 is 221 degrees, i.e., the melting point of the Sn—Ag based solder. As a result, a maximum of the amount of the positional deviation ΔL given by Expression 3 may be 9.75 μm. Here, in one desirable example, from Expression 4, the length L of the aperture 60 may be at least 49.75 μm or more, because the diameter d of the columnar metal layer 31 is 40 μm. Thus, the length L of the aperture 60 may be designed to be, for example, 55 μm.

The volume of the aperture 60 may be calculated as 31625 μm³, exclusive of the volume occupied by the wiring 50. Accordingly, when the solder-including electrode 30 is designed to allow the volume of the solder layer 32 to be larger than this value, the thickness of plating of the solder layer 32 may be 25.2 μm or more. Because there are variations in an actual thickness of plating, the design of the solder-including electrode 30 may be carried out in consideration of the variations.

It is to be noted that the thickness of plating of the solder layer 32 may be reduced, as described later in a third embodiment, by stopping development halfway before the solder resist layer 24 is removed to allow the insulating layer 21C of the packaging substrate 20 to be exposed.

A method of manufacturing the semiconductor device 2 is described in the sixth to tenth embodiments.

In the semiconductor device 2, the aperture 60 of the solder resist layer 24 may have the planar shape elongated in the lengthwise direction DL of the wiring 50 inside the aperture 60. The length L of the aperture 60 may be adjusted in accordance with the thermal expansion coefficient of the packaging substrate 20. Accordingly, in heating for the solder bonding during the assembly process, there is little possibility that the solder layer 32 may run on the solder resist layer 24 even in a case with the positional deviation between the aperture 60 and the solder-including electrode 30 due to the difference in the thermal expansion coefficients of the semiconductor chip 10 and the packaging substrate 20. Thus, influence of the positional deviation between the aperture 60 and the solder-including electrode 30 is alleviated, leading to the suppression of the short circuit between the adjacent wirings 50.

As described, in this embodiment, the aperture 60 of the solder resist layer 24 may have the planar shape elongated in the lengthwise direction DL of the wiring 50 inside the aperture 60. The length L of the aperture 60 may be adjusted in accordance with the thermal expansion coefficient of the packaging substrate 20. Hence, it is possible to alleviate the influence of the positional deviation between the aperture 60 and the solder-including electrode 30, leading to the suppression of the short circuit between the adjacent wirings 50. In particular, this embodiment is suitable for a case in which a plurality of functions are synthesized in the single semiconductor chip 10 with an increase in a chip size, or a case in which the diameter d of the solder-including electrode 30 is reduced and the solder-including electrodes 30 are connected to the wirings 50 at a fine pitch.

Moreover, the aperture 60 may have the planar shape elongated in the lengthwise direction DL of the wiring 50 inside the aperture 60. This makes it possible to increase the area of the exposed part from the solder resist layer 24, of the wiring 50 as a connection target, without allowing the surface of the adjacent wiring 50 to be exposed. As a result, it is possible to enlarge the bonding area between the solder-including electrode 30 and the wiring 50, and to increase the mechanical strength of the bonding part. In other words, it is possible to suppress destruction due to the thermal stress generated by heating in the bonding process, to improve the mechanical strength against temperature cycles applied in the operation of the semiconductor chip 10, and to provide the flip chip semiconductor device 2 having the high yield or the high reliability.

Furthermore, the solder resist layer 24 is provided as the continuous layer on the front surface of the substrate body 21 and the plurality of wirings 50, and has the partial aperture 60 on each of the plurality of wirings 50. Hence, it is possible to prevent the solder resist layer 24 from peeling off from the plurality of wirings 50, so as not to lose a function of the suppression of the short circuit or a function of wiring protection.

In addition, the solder resist layer 24 is provided as the continuous layer. This allows the solder resist layer 24 to be interposed between the bonding part of the solder-including electrode 30 and the wiring 50, and the adjacent wiring 50. It is therefore possible to suppress the short circuit even when the inter-wiring pitch P50 is reduced. Hence, it is possible to reduce the inter-wiring pitch P50, and to provide a more highly densified connection structure between the semiconductor chip 10 and the packaging substrate 20. As a result, it is possible to provide, at lower costs, a flip chip structure adapted to higher functionalization of the semiconductor chip 10 or widening of a band of an interface.

Furthermore, the solder resist layer 24 is provided as the continuous layer. This makes it possible to prevent the solder from excessively wetting and spreading along the wiring 50, causing shortage of the volume of the solder, causing the distorted shape of the bonding part of the solder-including electrode 30 and the wiring 50, and causing lowered mechanical strength.

In addition, in this embodiment, the plurality of wirings 50 may be extended outward of the substrate body 21 from the peripheral part of the chip mounting region 20A, and disposed in parallel with one another at each side of the chip mounting region 20A. Hence, it is possible to directly extend the plurality of wirings 50 to an outer part of the packaging substrate 20 from the bonding parts of the solder-including electrodes 30 and the plurality of wirings 50. Also, pre-solder formation may be eliminated. It is also unnecessary to miniaturize the wirings 50 and to form the wirings 50 between lands, or to form wirings to lower layers from lands through vias, as in the existing C4 technique. This makes it possible to remarkably reduce substrate costs.

Furthermore, the aperture 60 may allow the upper surface 53 and part or all in the heightwise direction of the side surfaces 54 of the wiring 50 inside the aperture 60 to be exposed. This makes it possible to increase the area of the region in which the solder layer 32 and the wiring 50 form the alloy layer. In addition, the alloy layer thus generated may extend not only two-dimensionally as in the existing land-solder connection, but also three-dimensionally including a thicknesswise direction of the wiring 50. This makes it possible to provide a structure having higher bonding strength.

In addition, the length L of the aperture 60 may be set on the basis of Expression 1. Hence, it is possible to prevent the solder layer 32 from running on the solder resist layer 24 and causing the short circuit between the adjacent wirings 50, in heating to the temperature near the melting point of the solder in bonding of the solder-including electrode 30 and the wiring 50.

Regarding this, similar effects may be obtained not only during a flip chip bonding process of the semiconductor chip 10 and the packaging substrate 20, but also a post-process of reflow for BGA ball attachment and a heating process in mounting on a mother board on the assembly line. In other words, when the semiconductor device 2 is heated to a temperature equal to or higher than the melting point of the solder, the semiconductor chip 10 and the packaging substrate 20 each may thermally expand. Furthermore, the underfill resin 40 may be heated above a glass transition temperature and soften. Also, the solder layer 32 may melt. Accordingly, there is possibility that the columnar metal layer 31 may protrude from the aperture 60 and be positioned on the solder resist layer 24, with the solder layer 32 melting. Part of the solder layer 32 may move together with the columnar metal layer 31 and run over the solder resist layer 24. This may cause possibility of the short circuit with the adjacent wiring 50. Even if no short circuit is caused, there may be possibility of destruction due to thermal stress, during a cooling process, because of the distorted shape of the bonding part of the solder-including electrode 30 and the wiring 50.

Accordingly, setting the length of the aperture 60 on the basis of Expression 1 makes it possible to avoid disadvantages as mentioned above that may be derived from the positional deviation of the solder-including electrode 30 caused by the thermal expansion coefficients. Hence, it is possible to provide the structure having the optimal yield and reliability.

Modification Example 2-1

An Example in which the Aperture has a Planar Shape of an Ellipse

FIG. 10 illustrates, in an enlarged manner, part of a semiconductor device according to a modification example 2-1. Specifically, FIG. 10 illustrates a plan configuration of the two adjacent wirings 50 (50A and 50B) in the vicinity of the peripheral part of the chip mounting region 20A. It is to be noted that the semiconductor chip 10 and the underfill resin 40 are omitted in the top view of FIG. 10 for an easier understanding, but the semiconductor chip 10 may be disposed in the region leftward of the chip outline 10A of the semiconductor chip 10 denoted by the broken line.

In this modification example, the aperture 60 may have a planar shape of an ellipse elongated in the lengthwise direction DL of the wiring 50 inside the aperture 60. This makes it possible to increase the area of the exposed region of the wiring 50, and to provide larger allowance for the positional deviation between the solder-including electrode 30 and the aperture 60. Otherwise, a semiconductor device 2A according to this modification example may have similar configurations, workings, and effects to those of the semiconductor device 2 according to the foregoing second embodiment. Description is therefore given with corresponding components denoted by same reference characters.

In one preferred example, the aperture 60 of the solder resist layer 24 may be positioned at a distance d60 of a certain value or more from the adjacent aperture 60, because the solder resist is the negative photosensitive material. Accordingly, in one desirable example, the pitch between the plurality of solder-including electrodes 30 may be set at a large value, with the apertures 60 shaped like rectangles as described in the forgoing first embodiment, when the length L of the aperture 60 of the solder resist layer 24 is set to a large value in order to use the semiconductor chip 10 of a larger size or the packaging substrate 20 having a large linear expansion coefficient such as a coreless substrate.

In this modification example, the aperture 60 may have the planar shape of the ellipse elongated in the lengthwise direction DL of the wiring 50 inside the aperture 60. Hence, it is possible to increase the area of the exposed region of the wiring 50 inside the aperture 60, while keeping the distance d60 from the adjacent aperture 60 at the certain value. As a result, it is possible to provide the larger allowance for the positional deviation between the solder-including electrode 30 and the aperture 60 caused by the difference in the thermal expansion coefficients of the semiconductor chip 10 and the packaging substrate 20, while maintaining the pitch between the plurality of solder-including electrodes 30. In other words, it is possible to prevent the solder layer 32 from running on the solder resist layer 24 and causing the short circuit between the adjacent wirings 50, or to prevent a failure in the bonding between the solder layer 32 and the wiring 50, even in a case with the use of the semiconductor chip 10 of the larger size or the packaging substrate 20 having the larger thermal expansion coefficient, or a case with a higher process temperature. Moreover, it is also possible to increase the area of the region in which the solder layer 32 and the wiring 50 form the alloy layer, leading to higher bonding strength and enhancement in the yield and the reliability. Furthermore, an increase in the volume of the aperture 60 exclusive of the volume of the wiring 50 may be suppressed, as compared to a case with the rectangular shaped aperture 60 as illustrated in FIG. 11. This makes it possible to fill the aperture 60 with the solder layer 32 without increasing the volume of the solder layer 32, while producing the effects as described above.

As described, in this modification example, the aperture 60 may have the planar shape of the ellipse. Hence, it is possible to increase the area of the exposed region of the wiring 50 without reducing the distance d60 between the apertures 60, that is, without increasing resolution of the solder resist. This allows for the larger allowance for the positional deviation between the solder-including electrode 30 and the aperture 60, and the enhanced bonding strength.

Modification Example 2-2

An Example in which, Inside the Aperture, the Wiring Includes a Widened Part

FIG. 12 illustrates, in an enlarged manner, part of a semiconductor device according to a modification example 2-2. Specifically, FIG. 12 illustrates a plan configuration of the two adjacent wirings 50 (50A and 50B) in the vicinity of the peripheral part of the chip mounting region 20A. It is to be noted that the semiconductor chip 10, the plurality of solder-including electrodes 30, and the underfill resin 40 are omitted in the top view of FIG. 12 for an easier understanding, but the semiconductor chip 10 may be disposed in the region leftward of the chip outline 10A of the semiconductor chip 10 denoted by the broken line. Also, in FIG. 12, positions at which the plurality of solder-including electrodes 30 are mounted are denoted by a broken line.

In this modification example, inside the aperture 60, each of the plurality of wirings 50 may include a widened part 55. This makes it possible to increase the area of the region in which the solder-including electrode 30 and the wiring 50 form the alloy layer, leading to even higher strength of the bonding part. Otherwise, a semiconductor device 2B according to this modification example may have similar configurations, workings, and effects to those of the semiconductor device 2 according to the foregoing second embodiment. Description is therefore given with corresponding components denoted by same reference characters.

The plurality of wirings 50 each may be disposed inside the aperture 60 with both of the side surfaces 54 exposed, and each may include the widened part 55 in which the width W50 is partly increased. This causes the increase in the area of the region in which the solder layer 32 and the wiring 50 form the alloy layer. Hence, it is possible to enhance the bonding strength against shearing stress generated by the thermal stress or stress generated by other reasons and applied to the solder bonding part. This leads to the enhancement in the yield and the reliability.

Modification Example 2-3

An Example in which, Inside the Aperture, the Wiring has a Break

FIG. 13 illustrates, in an enlarged manner, part of a semiconductor device according to a modification example 2-3. Specifically, FIG. 13 illustrates a plan configuration of the two adjacent wirings 50 (50A and 50B) in the vicinity of the peripheral part of the chip mounting region 20A. It is to be noted that the semiconductor chip 10, the plurality of solder-including electrodes 30, and the underfill resin 40 are omitted in the top view of FIG. 13 for an easier understanding, but the semiconductor chip 10 may be disposed in the region leftward of the chip outline 10A of the semiconductor chip 10 denoted by the broken line. Moreover, in FIG. 13, the positions at which the plurality of solder-including electrodes 30 are mounted are denoted by the broken line.

In this modification example, inside the aperture 60, each of the plurality of wirings 50 may have a break 56. This makes it possible to increase the area of the region in which the solder-including electrode 30 and the wiring 50 form the alloy layer, leading to even higher strength of the bonding part. Otherwise, a semiconductor device 2C according to this modification example may have similar configurations, workings, and effects to those of the semiconductor device 2 according to the foregoing second embodiment. Description is therefore given with corresponding components denoted by same reference characters.

FIG. 14 illustrates a cross-sectional configuration along a line XIV-XIV of FIG. 13. Each of the wirings 50 may be broken inside the aperture 60, and have the break 56. A distance d56 of the break 56 may be, for example, about 10 μm. The height H50 of the wiring 50 may be, for example, 15 μm. With this configuration, it is possible to increase area of contact of the solder-including electrode 30 and the wiring 50, leading to higher bonding strength. Moreover, if there should occur peeling off of the alloy layer formed by the surface coating 52 of the wiring 50 and the solder layer 32, it is possible to prevent the peeling off from advancing any more, thanks to discontinuity of the wiring 50.

Modification Example 2-4

An Example in which Two Apertures have Oblique Notches at their Corners, and the Two Apertures are Adjacently Disposed with the Oblique Notches Confronted with Each Other FIG. 15 is an enlarged top view of part of a semiconductor device according to a modification example 2-4. Specifically, FIG. 15 illustrates a plan configuration of the two adjacent wirings 50 (50A and 50B) in the vicinity of the peripheral part of the chip mounting region 20A. It is to be noted that the semiconductor chip 10, the plurality of solder-including electrodes 30, and the underfill resin 40 are omitted in the top view of FIG. 15, but the semiconductor chip 10 may be disposed in the region leftward of the chip outline 10A of the semiconductor chip denoted by the broken line.

In this modification example, the two apertures 60A and 60B may have oblique notches 62 at their angles (corners). The two apertures 60A and 60B may be disposed with the oblique notches 62 confronted with each other. Hence, in this modification example, it is possible to reduce the distance d30 between the solder-including electrodes 30 even more. Otherwise, a semiconductor device 2D according to this modification example may have similar configurations, workings, and effects to those of the semiconductor device 2 according to the foregoing second embodiment. Description is therefore given with corresponding components denoted by same reference characters.

In one preferred example, the distance d60 between the apertures 60 may be a certain value or more because the solder resist is generally the negative photosensitive material. In this modification example, the adjacent apertures 60 may have the oblique notches 62 at their corners, with the solder resist layer 24 left unremoved. In this way, it is possible to reduce the distance d30 between the solder-including electrodes 30, while keeping the distance d60 between the apertures 60 at the certain value, as compared to the case with the rectangular apertures 60. Moreover, there is little change in the allowance for the positional deviation between the solder-including electrode 30 and the aperture 60, from the case with the apertures 60 shaped like rectangles. The positional deviation may be caused by the difference in the thermal expansion coefficients of the semiconductor chip 10 and the packaging substrate 20.

In one preferred example, the oblique notch 62 may be arranged to avoid overlap with the wiring 50, so as not to extend over the wiring 50. This makes it possible to prevent the area of the exposed region of the wiring 50 inside the aperture 60 from being affected by the oblique notches 62. Accordingly, it is possible to provide the sufficient area of the region in which the solder-including electrode 30 and the wiring 50 form the alloy layer, and to maintain the bonding strength even when the distance d30 between the solder-including electrodes 30 is reduced.

Modification Example 2-5

An Example in which Two Apertures have Oblique Notches at their Sides, and the Two Apertures are Adjacently Disposed with the Oblique Notches Confronted with Each Other FIG. 16 is an enlarged top view of part of a semiconductor device according to a modification example 2-5. Specifically, FIG. 16 illustrates a plan configuration of the two adjacent wirings 50 (50A and 50B) in the vicinity of the peripheral part of the chip mounting region 20A. It is to be noted that the semiconductor chip 10, the plurality of solder-including electrodes 30, and the underfill resin 40 are omitted in the top view of FIG. 16 for an easier understanding, but the semiconductor chip 10 may be disposed in the region leftward of the chip outline 10A of the semiconductor chip denoted by the broken line.

In this modification example, each of the two apertures 60A and 60B may have the oblique notch 62 along an entirety of its one side. The two apertures 60A and 60B may be adjacently disposed with the oblique notches 62 confronted with each other. Hence, in this modification example, it is possible to reduce the distance d30 between the solder-including electrodes 30 even more, and to enhance the bonding strength even more. Otherwise, a semiconductor device 2E according to this modification example may have similar configurations, workings, and effects to those of the semiconductor device 2 according to the foregoing second embodiment. Description is therefore given with corresponding components denoted by same reference characters.

In this modification example, the two apertures 60A and 60B each may have the oblique notch 62 at one side, and have a planar shape of a trapezoid including one oblique side. Thus, the adjacent apertures 60A and 60B each may include one oblique side with respect to the lengthwise direction DL of the wiring 50 inside the aperture 60. This makes it possible to reduce the distance d30 between the solder-including electrodes 30 while maintaining the distance d60 between the adjacent apertures 60 at the certain value, as compared to the case with the rectangular apertures 60. Furthermore, it is also possible to increase the bonding area between the solder-including electrode 30 and the wiring 50. This makes it possible to maintain the bonding strength even when the distance d30 between the solder-including electrodes 30 is reduced.

In this modification example, the two apertures 60A and 60B each may have the oblique notch 62 at one side, and be shaped as the trapezoid. Hence, it is possible to reduce the distance d30 between the solder-including electrodes 30 without increasing the resolution of the solder resist, and to provide even more highly densified arrangement of the solder-including electrodes 30.

Third Embodiment

A Semiconductor Device; an Example in which a Thickness of a Solder Resist Layer Inside an Aperture is Smaller than a Thickness of the Solder Resist Layer in a Region Other than the Aperture Out of a Front Surface of a Substrate Body FIG. 17 illustrates, in an enlarged manner, part of a semiconductor device according to a third embodiment of the disclosure. Specifically, FIG. 17 illustrates a cross-sectional configuration of the two adjacent wirings 50 (50A and 50B) in the vicinity of the peripheral part of the chip mounting region 20A.

In a semiconductor device 3, a thickness t1 of the solder resist layer 24 inside the aperture 60 may be smaller than a thickness t2 of the solder resist layer 24 in a region other than the aperture 60 out of the front surface of the substrate body 21. Hence, in this embodiment, it is possible to enhance controllability of the shape of the aperture 60, and to enhance adhesion strength of the packaging substrate 20 and the wiring 50. Otherwise, the semiconductor device 3 according to this embodiment may have similar configurations, workings, and effects to those of the semiconductor device 2 according to the foregoing second embodiment. Description is therefore given with corresponding components denoted by same reference characters.

In this embodiment, the solder resist layer 24 inside the aperture 60 may allow part in the heightwise direction of the side surfaces 54 of the wiring 50 to be exposed, without allowing the insulating layer 21C of the substrate body 21 of the packaging substrate 20 to be exposed. The surface coating 52 of the wiring 50 may be provided on the region exposed from the solder resist layer 24 out of the surface of the wiring 50. In one specific example, the thickness H50 of the wiring 50 may be, for example, 15 µm. The thickness t2 of the solder resist layer 24 may be, for example, 20 µm. An amount of exposure of the side surfaces 54 of the wiring 50 may be, for example, about 10 µm. The thickness t1 of the solder resist layer 24 inside the aperture 60 may be, for example, about 5 µm. Such a structure may be easily created by stopping development halfway, instead of carrying out the development to the end, because the solder resist layer 24 may be made of a negative resist in general. It is possible to reduce development time as compared to a case in which the development is carried out until the insulating layer 21C of the substrate body 21 of the packaging substrate 20 is exposed. This makes it possible to miniaturize the size of the apertures 60.

Moreover, in this embodiment, the wiring 50 may have a shape that is partly embedded in the solder resist layer 24, instead of having all in the heightwise direction of the side surfaces 54 exposed. It is therefore possible to suppress the wiring 50 from peeling off from the insulating layer 21C of the substrate body 21 of the packaging substrate 20.

In addition, an aspect ratio in a depthwise direction of the aperture 60 may be lowered, and the amount of the solder filled in the aperture 60 may be also reduced. It is therefore possible to easily fill the aperture 60 with the solder layer 32. As a result, it is possible to prevent generation of a minute void inside the aperture 60, to prevent swelling of the void in the post-processes such as the reflow process for ball attachment and the reflow process for secondary mounting, and to prevent degradation in the yield and the reliability.

In addition, as described in the second embodiment, the aperture 60 may be elongated in the lengthwise direction DL of the wiring 50 inside the aperture 60, to increase the area of the exposed region of the wiring 50 in the lengthwise direction DL. This makes it possible to compensate an amount of reduction in the bonding area due to the reduction in the exposed region of the wiring 50 in the depthwise direction.

As described, in this embodiment, the solder resist layer 24 may allow the upper surface 53 and part in the heightwise direction of the side surfaces 54 of the wiring 50 inside the aperture 60 to be exposed. The solder resist layer 24 may cover remaining part in the heightwise direction of the side surfaces 54 of the wiring 50 inside the aperture 60. Moreover, the solder resist layer 24 may cover the upper surface 53 and all in the heightwise direction of the side surfaces 54 of each of the plurality of wirings 50 in the region other than the aperture 60 out of the front surface of the substrate body 21. With this configuration, it is unnecessary to carry out the development of the solder resist layer 24 inside the aperture 60 for all in the thicknesswise direction of the solder resist layer 24. Hence, it is possible to enhance the resolution of the solder resist, to form the fine aperture 60, and to increase density of the plurality of wirings 50 even more.

Moreover, the configuration in which not all in the heightwise direction of the side surfaces 54 of the wiring 50 is exposed makes it possible to enhance the adhesion strength between the wiring 50 and the insulating layer 21C of the substrate body 21 of the packaging substrate 20. It is also possible to prevent the solder material from intruding into an interface between the wiring 50 and the insulating layer 21C of the substrate body 21 of the packaging substrate 20 and causing lowered adhesion strength. Furthermore, it is possible to reduce the volume of the solder filled in the aperture 60.

Fourth Embodiment

A Semiconductor Device; an Example of an MCM (Multi Chip Module)

FIG. 18 schematically illustrates an overall configuration of a semiconductor device according to a fourth embodiment of the disclosure. FIG. 19 schematically illustrates a cross-sectional configuration of the semiconductor device, taken along a line XIX-XIX. While the second embodiment describes a case in which the semiconductor device 2 may be an LSI package including the semiconductor chip 10 as a single body, a semiconductor device 4 according to this embodiment may be, for example, an application example to an MCM (Multi Chip Module). Otherwise, the semiconductor device 4 according to this embodiment may have similar configurations, workings, and effects to those of the semiconductor device 2 according to the foregoing second embodiment. Description is therefore given with corresponding components denoted by same reference characters.

The semiconductor device 4 may include, for example, the semiconductor chip 10, the packaging substrate 20, the via 22, the solder ball 23, the plurality of solder-including electrodes 30, the underfill resin 40, and the plurality of wirings 50. These may have similar configurations as those in the second embodiment.

Moreover, the packaging substrate 20 may include the solder resist layer 24, and have the apertures 60, as with the second embodiment.

As with the second embodiment, the aperture 60 may have the planar shape elongated in the lengthwise direction DL of the wiring 50 inside the aperture 60. The length L of the aperture 60 may be adjusted in accordance with the thermal expansion coefficient of the packaging substrate 20. Hence, in the semiconductor device 4, as with the second embodiment, it is possible to alleviate the influence of the positional deviation between the aperture 60 and the solder-including electrode 30, and to suppress the short circuit between the adjacent wirings 50.

For example, two semiconductor packages 70 may be further mounted on the front surface 21A of the substrate body 21 of the packaging substrate 20, in addition to the semiconductor chip 10. The underfill resin 40 may be provided between the packaging substrate 20 and each of the semiconductor packages 70.

The semiconductor package 70 may have a configuration in which, for example, a semiconductor chip 71 may be wire-bonded to a packaging substrate 72 with a wire 73, and sealed with a mold resin 74. The semiconductor package 70 may be connected to the plurality of wirings 50 on the packaging substrate 20 through solder balls 75 that may serve as external electrodes.

For example, when DRAM is used for the semiconductor package 70, it is desirable to increase the number of the wirings 50 that connect the semiconductor chip 10 to the semiconductor package 70, in order to provide a wide band. Accordingly, the foregoing second embodiment may be applied to the semiconductor device 4 according to this embodiment, and the length L of the aperture 60 may be adjusted in accordance with the thermal expansion coefficient of the packaging substrate 20. This makes it possible to reduce the short circuit between the adjacent wirings 50, and to enjoy the advantages of the foregoing second embodiment that involves the flip chip connection with use of the wirings 50 arranged at the narrow pitch.

It is to be noted that the semiconductor package 70 may not be a packaged semiconductor component, but may be, for example, a bare chip. In one example, a wide band memory that may be called a wide I/O (Wide I/O) may be mounted as a bare chip, and connection may be formed on the packaging substrate 20 with use of the fine wirings 50. In this way, it is possible to provide an even wider band.

Fifth Embodiment

A Semiconductor Device; an Example of Sealing with a Mold Resin

FIG. 20 schematically illustrates an overall configuration of a semiconductor device according to a fifth embodiment of the disclosure. A semiconductor device 5 may have a configuration in which the semiconductor device 2 as described in the foregoing second embodiment may be sealed with a mold resin 80. Sealing the semiconductor device 2 with the mold resin 80 makes it possible to protect the rear surface of the semiconductor chip 10 and the front surface 21A of the substrate body 21 of the packaging substrate 20. This allows for easier handling, and makes it possible to provide the flip chip semiconductor device 5 that is resistant to impact from outside.

On the other hand, the mold resin 80 may be accompanied by curing shrinkage, because the mold resin 80 uses an epoxy modified material. Moreover, the mold resin 80 has a different thermal expansion coefficient from those of the semiconductor chip 10 and the packaging substrate 20. This may easily cause an increase in the stress applied to the bonding parts between the plurality of solder-including electrodes 30 and the plurality of wirings 50.

In the semiconductor device 5 according to the embodiment, as described in the second embodiment, in the semiconductor device 2, the aperture 60 of the solder resist layer 24 may have the planar shape elongated in the lengthwise direction DL of the wiring 50 inside the aperture 60. The length L of the aperture 60 may be adjusted in accordance with the thermal expansion coefficient of the packaging substrate 20. Hence, it is possible to alleviate the influence of the positional deviation between the aperture 60 and the solder-including electrode 30, and to reduce the short circuit between the adjacent wirings 50. It is also possible to increase the area of the bonding part between the solder-including electrode 30 and the wiring 50, and to alleviate influences of the increase in the stress derived from the mold resin 80. Accordingly, it is possible to provide the flip chip semiconductor device 5 having more optimal connection reliability.

Modification Example 5-1

Moreover, as illustrated in FIG. 21, the foregoing effects may be also produced in a semiconductor device 5A in which a semiconductor chip 90 may be stacked inside the mold resin 80. The semiconductor chip 90 may be different from the semiconductor chip 10. The semiconductor chip 90 may include, for example, a chip body 91. The chip body 91 may be connected to the packaging substrate 20 through a wire 92.

Modification Example 5-2

Furthermore, as illustrated in FIG. 22, effects similar to those as described above may be also obtained in a PoP (Package on Package) semiconductor device 5B in which another semiconductor package 100 may be further stacked on the semiconductor chip 10 of the semiconductor device 2 as described in the second embodiment.

The semiconductor package 100 may have a configuration in which, for example, semiconductor chips 101A and 101B may be wire-bonded to a packaging substrate 102 with wires 103A and 103B, and sealed with a mold resin 104. The semiconductor package 100 may be connected to the plurality of wirings 50 on the packaging substrate 20, through solder balls 105 that may serve as external electrodes.

Sixth Embodiment

A Method of Manufacturing a Semiconductor Device; an Example of Batch Reflow

FIGS. 23 to 30, and FIGS. 31 to 34 illustrate a method of manufacturing a semiconductor device according to a sixth embodiment of the disclosure, in the order of procedure.

It is to be noted that the following description is given on a case of manufacturing the semiconductor device 1 or 2 as described in the foregoing first or second embodiment by the manufacturing method according to this embodiment. However, the manufacturing method according to this embodiment may be applicable not only to the case of manufacturing the semiconductor device 1 or 2 according to the foregoing first or second embodiment, but also to cases of manufacturing semiconductor devices according to other embodiments and modification examples.

Description is given first on a method of manufacturing the plurality of solder-including electrodes 30 with reference to FIGS. 23 to 30. FIG. 23 illustrates the semiconductor chip 10 in a wafer state before formation of the plurality of solder-including electrodes 30. The passivation film 14 may be formed on the element-formation surface 11A of the chip body 11 made of silicon (Si). An insulating film (undepicted) may be formed on an outermost surface of the chip body 11. The insulating film may be made of, for example, a silicon nitride film or polyimide. The passivation film 14 may have an opening that allows the pad 13 to be exposed. The pad 13 may be made of, for example, aluminum.

After cleansing of a wafer surface, a surface oxide film of the pad 13 may be removed by argon reverse sputtering. Next, as illustrated in FIG. 24, a TiW/Cu stacked film 15 may be sequentially stacked by sputtering. A thickness of TiW may be, for example, 100 nm. A thickness of copper (Cu) may be, for example, 200 nm. TiW may be provided for purpose of suppression of an increase in resistance due to formation of an alloy layer of the pad 13 and the metal of the columnar metal layer 31 to be formed later.

Thereafter, as illustrated in FIG. 25, a resist film 16 may be formed by spin coating on a front surface of the semiconductor chip 10 in the wafer state. A thickness of the resist film 16 may be, for example, about 70 μm.

Thereafter, as illustrated in FIG. 26, a resist opening 16A may be formed at a position at which the solder-including electrode 30 is formed, by photolithography with use of an exposure machine such as a stepper or an aligner. When using the negative resist, exposure may be carried out with use of a mask that allows for exposure of a region other than the resist opening 16A. Thereafter, development may be carried out to form the resist opening 16A.

Thereafter, resist residue that remains in a bottom of the resist opening 16A may be cleaned up by, for example, a scum removal process. As illustrated in FIG. 27, the columnar metal layer 31 may be formed by electroplating. In a peripheral part of the semiconductor chip 10 in the wafer state, an edge of the resist film 16 may be cut in advance by about 3 mm. Power may be supplied through the edge-cut part to carry out the electroplating. As an electroplating film, for example, a copper (Cu) layer may be formed with a diameter of 40 μm and a height of 40 μm. In order to suppress excessive growth of the alloy layer of the solder to be formed by plating later and the columnar metal layer 31, nickel (Ni) electroplating may be successively carried out after forming the copper (Cu) layer by the electroplating, to form a stacked structure. In this case, a thickness of the copper (Cu) plating film may be, for example, 35 μm, and a thickness of the nickel (Ni) plating film may be, for example, 5 μm.

Thereafter, as illustrated in FIG. 28, the solder layer 32 may be stacked by plating on the columnar metal layer 31. A thickness of the plating may be, for example, 26 μm. A composition of the solder may be, for example, Sn—Ag. The solder layer 32 may be formed with other solder materials that may be used in plating, by a similar manufacturing method. Plating of the solder material having a low melting point, e.g., indium (In), makes it possible to lower a heating temperature during the assembly process, and to reduce the thermal stress during the assembly.

Thereafter, as illustrated in FIG. 29, the resist film 16 may be removed. The TiW/Cu stacked film 15 may be removed by wet etching, with the columnar metal layer 31 serving as a mask. Ammonia hydrogen peroxide water may be used for TiW etching. A mixed liquid of citric acid and aqueous hydrogen peroxide may be used for Cu etching.

Thereafter, as illustrated in FIG. 30, a reflow process may be carried out to remove an oxide film on a surface of the solder layer 32 and to melt the solder layer 32. Examples may include a method of coating the wafer surface with flux and thereafter heating in a reflow furnace, and a method of heating in a reflow furnace under an atmosphere of formic acid. For example, a method may be used in which the wafer may be heated to about 250° C. under the atmosphere of formic acid to remove the surface oxide film of the solder layer 32 and to melt the solder layer 32. Thereafter, water cleansing treatment may be carried out to remove residue or a foreign matter that are attached to the surface. Thereafter, a protection tape may be attached to the element-formation surface 11A of the semiconductor chip 10 in the wafer state. Thereafter, back grinding may be carried out to a predetermined thickness, to adjust a thickness of the chip body 11 to an appropriate value. Thereafter, the chip body 11 may be fixed to a dicing frame with a dicing tape. After removal of the protection tape, dicing may be carried out. Thus, the semiconductor chip 10 including the plurality of solder-including electrodes 30 may be completed.

At this occasion, possible advantages of the columnar metal layer 31 made of the metal having the higher melting point than that of the solder that constitutes the solder layer 32 may be as follows. When most part of an electrode is made of solder as in the existing C4 technique, the solder electrode may tend to keep itself in a spherical shape, owing to action of a force that keeps surface tension to a minimum when the solder melts. In order to provide a gap for injection of the underfill resin 40 between the semiconductor chip 10 and the packaging substrate 20, it is preferable that a solder electrode having a large diameter be prepared when most part of the electrode is made of the solder. It is therefore difficult to reduce the pitch between the electrodes. In this embodiment, the plurality of solder-including electrodes 30 may have the stacked configuration of the columnar metal layer 31 and the solder layer 32. The columnar metal layer 31 may not melt at the melting point of the solder. This makes it possible to reduce the inter-electrode pitch between the plurality of solder-including electrodes 30, while providing the sufficient gap G between the semiconductor chip 10 and the packaging substrate 20.

It is to be noted that the foregoing method of manufacturing the plurality of solder-including electrodes 30 may be applicable to sixth and seventh embodiments to be described later.

In the following, description is given on a method of connecting, by batch reflow, the packaging substrate 20 and the semiconductor chip 10 with reference to FIGS. 31 to 34.

First, as illustrated in FIG. 31, the solder-including electrode 30A may be aligned with the aperture 60A on the wiring 50A as the connection target, with flux (undepicted) applied in advance by dipping to a tip of the solder layer 32 of the solder-including electrode 30A.

Next, as illustrated in FIG. 32, an appropriate load may be applied at an appropriate temperature, to pressure-bond the solder layer 32 to the wiring 50A. At this phase, the solder layer 32 and the surface coating 52 of the wiring 50A may not be completely alloyed, but may be fixed with adhesiveness of the flux material.

At this occasion, applying the load excessively may cause the gap G between the semiconductor chip 10 and the packaging substrate 20 to become small. Because of rigidity of the wiring 50 and the columnar metal layer, the solder layer 32 present therebetween may be expelled and protrude from the aperture 60 to outside, resulting in the possibility of the short circuit.

In this embodiment, as described above in the first embodiment, the plurality of solder-including electrodes 30 are each provided with the function of serving as the gap control electrode, and the overlap region OL where the columnar metal layer 31 and the solder resist layer 24 overlap each other is provided along part or all of the aperture end 61 of the aperture 60. Accordingly, the gap G between the semiconductor chip 10 and the packaging substrate 20 may be self-alignedly kept at the height H31 of the columnar metal layer 31 or more. This avoids the disadvantage of the short circuit as described above.

Thereafter, heating in the reflow furnace may be carried out, to cause alloying of the solder layer 32 and the surface coating 52 of the wiring 50A, as illustrated in FIG. 33. At this occasion, the flux material may have a function of removing the surface oxide film of the solder layer 32.

Moreover, at this occasion, there may occur the positional deviation between the solder-including electrode 30A and the aperture 60A due to the difference in the thermal expansion coefficients of the semiconductor chip 10 and the packaging substrate 20. In general, the packaging substrate 20 may have the larger thermal expansion coefficient. Accordingly, with the plan configuration of the packaging substrate 20 as illustrated in FIG. 1, the positional deviation may occur depthward or frontward of the sheet of FIG. 33, i.e., in the lengthwise direction DL of the wiring 50 inside the aperture 60.

Here, as described in the second embodiment, the aperture 60 of the solder resist layer 24 may have the planar shape elongated in the lengthwise direction DL of the wiring 50 inside the aperture 60. The length L of the aperture 60 may be adjusted in accordance with the thermal expansion coefficient of the packaging substrate 20. Accordingly, as illustrated in FIG. 9, the solder layer 32 may be suppressed from running on the solder resist layer 24 and causing the short circuit with the adjacent wiring 50B.

It is to be noted that the reflow process may be carried out a plurality of times, in order to promote the alloying.

Thereafter, cleansing may be carried out to remove the flux material. As illustrated in FIG. 34, the underfill resin 40 may be injected into the gap between the semiconductor chip 10 and the packaging substrate 20. Thereafter, curing may be carried out to modify and cure the underfill resin 40. In injecting the underfill resin 40, the packaging substrate 20 may be heated to, for example, about 80° C. After injection, post-curing may be carried out, for example, at 150° C. for about 1.5 hours in total.

Thereafter, flux may be transferred to the positions at which the solder balls 23 are mounted, on the rear surface 21B of the substrate body 21 of the packaging substrate 20. The solder balls 23 may be mounted. The reflow process for the ball attachment may be carried out. As a result, the solder layer 32 may melt again. At this occasion, the surface coating 52 of the wiring 50 may contribute to suppression of the excessive alloying of the solder layer 32 and the wiring 50 to cause degradation in the bonding strength. Furthermore, regarding the thermal stress generated in a cooling step after the reflow, the length L of the aperture 60 on the wiring 50 may be increased to expand the area of the bonding part. This makes it possible to enhance the mechanical strength.

In this embodiment, the semiconductor chip 10 and the packaging substrate 20 may be temporarily bonded with use of the flux. Thereafter, the reflow heating may be carried out. This causes the semiconductor chip 10 and the packaging substrate 20 to be heated to the same high temperature. Accordingly, the amount of the positional deviation due to the difference in the thermal expansion coefficients of the semiconductor chip 10 and the packaging substrate 20 may tend to be large. However, as described in the second embodiment, the aperture 60 of the solder resist layer 24 may have the planar shape elongated in the lengthwise direction DL of the wiring 50 inside the aperture 60. The length L of the aperture 60 may be adjusted in accordance with the thermal expansion coefficient of the packaging substrate 20. Hence, it is possible to alleviate the influence of the positional deviation between the aperture 60 and the solder-including electrode 30, and to suppress the short circuit between the adjacent wirings 50.

Moreover, in this embodiment, the semiconductor chip 10 may be heated, in an unfixed state, to the temperature equal to or higher than the melting point of the solder. Accordingly, the positional deviation or inclination of the semiconductor chip 10 may be corrected by a self-alignment effect of the solder. Hence, it is possible to provide high alignment precision even in a case in which the plurality of solder-including electrodes 30 and the plurality of wirings 50 are arranged at a narrow pitch. This allows for production with even smaller variations, and with stabilization of the shape of the bonding part between the solder-including electrode 30 and the wiring 50. This leads to the enhancement in the yield and the reliability.

Furthermore, the use of the batch reflow allows for successive treatment in the reflow furnace, optimal productivity, and lower costs.

In addition, as described in the first embodiment, the plurality of solder-including electrodes 30 are each provided with the function of serving as the gap control electrode, and the overlap region OL where the columnar metal layer 31 and the solder resist layer 24 overlap each other is provided along part or all of the aperture end 61 of the aperture 60. Therefore, at a phase in which the columnar metal layer 31 and the solder resist layer 24 come in contact with each other, it is difficult to press down the semiconductor chip 10 any further. This makes it possible to self-alignedly keep the gap G between the semiconductor chip 10 and the packaging substrate 20 at the height H31 of the columnar metal layer 31 or more. Accordingly, it is possible to restrain the solder layer 32 from being excessively expelled to cause the short circuit, in temporarily bonding the semiconductor chip 10 to the packaging substrate 20.

Seventh Embodiment

A Method of Manufacturing a Semiconductor Device; an Example of Local Reflow

Description is given next on a method of connection between the packaging substrate 20 and the semiconductor chip 10, with use of a local reflow method called thermal compression (Thermal Compression), with reference to FIGS. 31, 33, and 34 as well.

First, as illustrated in FIG. 31, the solder layer 32 of the solder-including electrode 30A may be aligned with the aperture 60A on the wiring 50A as the connection target.

Next, as illustrated in FIG. 33, an appropriate load may be applied at an appropriate temperature, to perform thermocompression. In one example, the semiconductor chip 10 and the packaging substrate 20 may be heated in advance to about 100° C. that is equal to or lower than the melting point of the solder. The semiconductor chip 10 may be pressed onto the packaging substrate 20 until a load cell on apparatus side detects a load. At this occasion, because the wiring 50 is shaped as a protrusion and made of a hard material, it is possible to impart a function of destroying the surface oxide film of the solder layer 32 to the wiring 50.

Incidentally, when the semiconductor chip 10 has been already heated to the temperature equal to or higher than the melting point of the solder at a stage before the thermocompression, oxidation of the solder may proceed, which may cause the bonding failure. Desirable countermeasures may include processing under an inert atmosphere or a reducing atmosphere, but it is conceivable that preparing such an environment may be difficult in a production plant. In such a case, as described above, the temperature may not be raised during the alignment of the semiconductor chip 10 with the packaging substrate 20. Instead, heating may be carried out after the load is detected by allowing the semiconductor chip 10 and the packaging substrate 20 to be in contact with each other.

After the detection of the load, a temperature of a tool that fixes the semiconductor chip 10 may be started to rise. The temperature of the tool may be adjusted to allow an effective temperature of the solder part to exceed the melting point of the solder. At this occasion, the heating may be accompanied by thermal expansion in a tool part of the apparatus. Accordingly, in order to cancel the thermal expansion on tool side, the apparatus may be instructed to operate to pull up the semiconductor chip 10 so as not to destroy the bonding part. After performing adjustment to provide the appropriate gap G between the semiconductor chip 10 and the packaging substrate 20, the tool may be cooled down to solidify the solder layer 32 and to complete the bonding. At this occasion as well, the cooling may be accompanied by shrinkage on the tool side. Accordingly, in order to cancel the shrinkage, the apparatus may be instructed to operate to press down the semiconductor chip 10. In a step after the load detection, it is desirable to adjust the gap G between the semiconductor chip 10 and the packaging substrate 20 to a value as constant as possible.

An amount of the thermal expansion of the tool may vary depending on the apparatus, and be expected to change with time. Therefore, a considerably complicated production recipe has been prepared for each production facility, and operation has been confirmed regularly.

In this embodiment, as described above in the first embodiment, the plurality of solder-including electrodes 30 are each provided with the function of serving as the gap control electrode, and the overlap region OL where the columnar metal layer 31 and the solder resist layer 24 overlap each other is provided along part or all of the aperture end 61 of the aperture 60. Accordingly, the load may be detected at a point of time when the columnar metal layer 31 comes into contact with the solder resist layer 24, and it may be difficult to press down the semiconductor chip 10 any further. This may allow the gap G between the semiconductor chip 10 and the packaging substrate 20 to be self-alignedly kept at the height H31 of the columnar metal layer 31 or more. It is therefore unnecessary to instruct each apparatus to perform the different pulling-up operation, and it is possible to obtain an optimal bonding shape, while maintaining the constant gap G even during the rise in the temperature. It is also possible to adjust the gap G by instructing the apparatus to pull up the tool, at a phase in which the thermal expansion of the tool calms down. Furthermore, even when the thermal expansion of the tool during the rise in the temperature is greater than expected, reduction in the gap G may be avoided. This makes it possible to prevent the occurrence of the short circuit.

In addition, providing the overlap region OL in a peripheral part of the columnar metal layer 31 may allow the solder layer 32 to be maintained in a shape close to a hemisphere by the reflow. Accordingly, the amount of the expelled solder layer 32 may be small even if the columnar metal layer 31 and the solder resist layer 24 are allowed to be in contact with each other. This leads to low probability of the occurrence of the short circuit with the adjacent wiring 50.

Moreover, in order to perform optimal bonding, there may be an additional improvement to remove the surface oxide film of the solder layer 32, with use of ultrasonic or mechanical vibration, or a reducing gas atmosphere such as formic acid when the solder layer 32 is heated to the temperature equal to or higher than the melting point of the solder layer 32.

Thereafter, as illustrated in FIG. 34, the underfill resin 40 may be injected into between the semiconductor chip 10 and the packaging substrate 20. Thereafter, the curing may be carried out to modify and cure the underfill resin 40. The post-processes may be the same as those in the sixth embodiment.

One advantage of using the local reflow method as described is that it is unnecessary to allow the temperatures of the semiconductor chip 10 and the packaging substrate 20 to be the same, unlike the batch reflow method as described in the sixth embodiment. In this embodiment, it is possible to allow the temperature of the packaging substrate 20 having the larger thermal expansion coefficient to be lower than the temperature of the semiconductor chip 10. This makes it possible to reduce the thermal stress generated in the cooling process in the solidification of the solder. Accordingly, by combining the local reflow method with the aperture 60 as described in the second embodiment, it is possible to provide the bonding structure having even higher strength against the thermal stress in the flip chip mounting.

Effects of this embodiment may be as follows. In a case with shrinkage of the plurality of solder-including electrodes 30 and the plurality of wiring 50 to increase the connection density, the heat treatment by the batch reflow method may cause generation of such large thermal stress that even breaking of the bonding part may be assumed. Thus, in this embodiment, in one preferred example, after the alignment, the tool that holds the semiconductor chip 10 may be heated to perform thermocompression. The bonding may be carried out without directly heating the packaging substrate 20 having the larger thermal expansion coefficient to the temperature equal to or higher than the melting point of the solder. Accordingly, an amount of the expansion of the packaging substrate 20 may be relatively small as compared to that in the batch reflow method. It is therefore possible to suppress the thermal stress generated in the assembly process. In this case, in the reflow process for the ball attachment or the reflow process for the secondary mounting, the semiconductor chip 10 and the packaging substrate 20 may be heated to the same temperature. However, the heating is performed after the injection of the underfill resin 40. Part of the thermal stress generated may be therefore shared by the underfill resin 40, making it possible to reduce the stress applied to the bonding part.

Eighth Embodiment

It is to be noted that description has been given in the foregoing sixth embodiment on the method that involves the temporarily bonding with use of the flux, and thereafter, the heating in the reflow furnace. However, other techniques may be utilized that involve temporarily bonding by the thermocompression method as described in the seventh embodiment, and thereafter, the heating in the reflow furnace, so as to promote growth of the alloy layer even more, and thereby to ensure the bonding.

Ninth Embodiment

Moreover, in the foregoing seventh embodiment, description has been given on a process that involves raising or lowering the temperature of the tool that holds the semiconductor chip 10 during the bonding process. However, a technique may be utilized that involves thermocompression with the temperature on the tool side fixed at the temperature equal to or higher than the melting point of the solder. In this case, it is difficult to detect the load by the contact of the solder layer 32 and the wiring 50. Therefore, the load when the columnar metal layer 31 comes into contact with the solder resist layer 24 may be detected. Alternatively, the load when the columnar metal layer 31 comes into contact with the wiring 50 may be detected, and thereafter, the tool that holds the semiconductor chip 10 may be pulled up so as to form the desired gap G On the other hand, this technique may allow a surface oxide film to grow, because the solder layer 32 is kept melting. Accordingly, taking countermeasures such as bonding under a nitrogen atmosphere makes it possible to obtain a more optimal bonding state.

In particular, as described above in the first embodiment, in one preferred example, the plurality of solder-including electrodes 30 each may be provided with the function of serving as the gap control electrode, and the overlap region OL where the columnar metal layer 31 and the solder resist layer 24 overlap each other is provided along part or all of the aperture end 61 of the aperture 60. Accordingly, the load may be detected at the point of time when the columnar metal layer 31 and the solder resist layer 24 come into contact with each other, and it may be difficult to press down the semiconductor chip 10 any further. This may allow the gap G between the semiconductor chip 10 and the packaging substrate 20 to be self-alignedly kept at the height H31 of the columnar metal layer 31 or more. Accordingly, the occurrence of the short circuit due to the expelled solder layer 32 may be avoided, and a margin for, for example, variations in the width (diameter) W of the aperture 60 may be increased.

By using such technique, it is possible to eliminate the complicated process of raising or lowering the temperature on the tool side, or the fine gap adjustment due to the thermal expansion of the tool, while enjoying the advantages of the local reflow such as the reduction in the thermal stress as described in the seventh embodiment. Hence, it is possible to reduce apparatus costs or production costs even more.

Tenth Embodiment

A Method of Manufacturing a Semiconductor Device; an Example in which an Underfill Resin is Supplied in Advance on a Packaging Substrate FIGS. 35 to 37 illustrate a method of manufacturing a semiconductor device according to a tenth embodiment of the disclosure, in the order of procedure. The manufacturing method according to this embodiment may be different from the method of manufacturing the semiconductor device according to the foregoing sixth embodiment, in that the underfill resin 40 may be supplied in advance on the packaging substrate 20.

It is to be noted that the following description is given on a case of manufacturing the semiconductor device 1 or 2 as described in the foregoing first or second embodiment by the manufacturing method according to this embodiment. However, the manufacturing method according to this embodiment may be applicable not only to the case of manufacturing the semiconductor device 1 or 2 according to the foregoing first or second embodiment, but also to cases of manufacturing semiconductor devices according to other embodiments and modification examples.

First, as illustrated in FIG. 35, the underfill resin 40 may be applied with a dispenser on the front surface 21A of the substrate body 21 of the packaging substrate 20. The underfill resin 40 may be made of a precoating underfill material (NCP) in a liquid state. For the NCP, for example, NCP 5208 (Henkel) may be used.

Next, as illustrated in FIG. 36, the solder-including electrode 30A may be aligned with the aperture 60A on the wiring 50A as the connection target.

Thereafter, as illustrated in FIG. 37, the bonding of the solder layer 32 and the wiring 50 may be carried out while maintaining an appropriate temperature and a tool position in a similar manner to the seventh embodiment. Heating at this occasion may cause the underfill resin 40 to be cured.

In one example, the packaging substrate 20 may be heated at a constant temperature of 70° C. The semiconductor chip 10 may be pressed onto the packaging substrate 20 until a load of 50 N is detected on the tool side. The temperature may be raised to 240° C., and thereafter maintained for 2.8 seconds to perform temporary curing. Thereafter, post-curing may be carried out at 150° C. for about 1.5 hours. Thus, the curing may be completed.

In such a technique, it is generally well known that the NCP material may remain between the solder layer 32 and the wiring 50 and cause the bonding failure. In an attempt to avoid this, applying the load excessively may cause the gap G between the semiconductor chip 10 and the packaging substrate 20 to become small. Because of the high rigidity of the wiring 50 and the columnar metal layer 31, the solder layer 32 present therebetween may be expelled and protrude from the aperture 60 to outside, resulting in the possibility of the short circuit.

In this embodiment, as described above in the first embodiment, the plurality of solder-including electrodes 30 are each provided with the function of serving as the gap control electrode, and the overlap region OL where the columnar metal layer 31 and the solder resist layer 24 overlap each other is provided along part or all of the aperture end 61 of the aperture 60. Accordingly, the gap G between the semiconductor chip 10 and the packaging substrate 20 may be self-alignedly kept at the height H31 of the columnar metal layer 31 or more. Hence, it is possible to avoid a decrease in a size of the gap G and to prevent the occurrence of the short circuit, even when the thermal expansion of the tool during the rise in the temperature is greater than expected.

Possible advantages of the manufacturing method according to this embodiment may be as follows. In a structure with the plurality of solder-including electrodes 30 (the columnar metal layers 31) arranged at the narrow pitch, it is difficult to provide the wide gap G between the semiconductor chip 10 and the packaging substrate 20, as compared to the flip chip connection of the existing C4 type. One reason may be because an aspect ratio of the resist opening 16A becomes large when the columnar metal layer 31 is formed by plating. This causes difficulty in filling the resist opening 16A by the plating. Accordingly, the use of the precoating underfill resin 40 as in this embodiment makes it possible to fill the gap G between the semiconductor chip 10 and the packaging substrate 20 with the underfill resin 40, even when the height of the columnar metal layer 31 is small. Moreover, because the curing of the underfill resin 40 may be started at the cooling stage of the bonding process, the thermal stress may be shared and received by not only the bonding part between the solder layer 32 and the wiring 50 but also the underfill resin 40. This makes it possible to reduce the thermal stress received by the bonding part between the solder-including electrode 30 and the wiring 50, and to enhance the yield and the reliability of the semiconductor devices 1 and 2 even more.

As described, in this embodiment, the underfill resin 40 may be supplied on the packaging substrate 20, and thereafter, the bonding may be carried out. Hence, it is possible to reduce the stress applied to the bonding part, as compared to the thermocompression process as described in the sixth or seventh embodiment.

In one specific example, the underfill resin 40 in the liquid state may be applied to the packaging substrate 20. Thereafter, the semiconductor chip 10 may be heated and pressure-bonded. After the underfill resin 40 is almost cured, the semiconductor chip 10 may be released from the tool. With this manufacturing method, the underfill resin 40 may start curing in the cooling process in which the thermal stress is generated. Accordingly, the thermal stress generated may be shared and received by the bonding part between the solder-including electrode 30 and the wiring 50 and by the underfill resin 40. This makes it possible to reduce the stress applied to the bonding part. Hence, it is possible to achieve further miniaturization of the plurality of solder-including electrodes 30 and the plurality of wirings 50, and to provide the even more highly densified flip chip semiconductor devices 1 and 2 with the high yield and the high reliability.

Other Effects

Description has been made on the example embodiments and their effects as mentioned above. The foregoing effects are not limited to a flip chip semiconductor device in which the semiconductor chip 10 as a single body is mounted as in the first to third embodiments. For example, the same effects may be produced by the MCM (Multi Chip Module) structure in which a plurality of memory packages and the semiconductor chip 10 are mounted on one sheet of the packaging substrate 20 as in the fourth embodiment.

Furthermore, in the structure in which the semiconductor chip 10 is flip chip connected to the packaging substrate 20 and sealed by the mold resin 80 as in the fifth embodiment, the stress generated in the bonding part between the solder-including electrode 30 and the wiring 50 tends to be larger due to the curing shrinkage of the mold resin 80. The same applies to the structure as described in the modification example 5-1 in which the semiconductor chip 90 as a bare chip may be mounted on the rear surface of the semiconductor chip 10, connected to the packaging substrate 20 by wire bonding, and sealed by the mold resin 80. In such structures, it is possible to obtain even higher effects by adopting the bonding structures having optimal strength, as in the forgoing example embodiments.

Also, there is no difference in effects produced in the PoP (Package on Package) structure in which the additional semiconductor package 100 may be further mounted on the semiconductor chip 10 of the semiconductor device 2, as in the modification example 5-2.

Although description has been made by giving the example embodiments as mentioned above, the contents of the disclosure are not limited to the above-mentioned example embodiments and may be modified in a variety of ways.

For example, shapes, materials, and thicknesses, or deposition methods or other methods of the layers as described in the forgoing example embodiments are not limited to as exemplified above, but other shapes, materials, and thicknesses, or other deposition methods may be adopted.

It is to be noted that effects described herein are merely exemplified and not limitative, and effects of the disclosure may be other effects or may further include other effects.

The contents of the technology may have the following configurations.

(1)

A semiconductor device, including:

a semiconductor chip; and a packaging substrate on which the semiconductor chip is mounted, wherein the semiconductor chip includes a chip body and a plurality of solder-including electrodes provided on an element-formation surface of the chip body, the packaging substrate includes a substrate body, a plurality of wirings, and a solder resist layer, the plurality of wirings and the solder resist layer being provided on a front surface of the substrate body, the solder resist layer is provided as a continuous layer on the front surface of the substrate body and the plurality of wirings, and has an aperture on each of the plurality of wirings, the plurality of solder-including electrodes include at least one gap control electrode, and the at least one gap control electrode includes a columnar metal layer and a solder layer in order named from side on which the chip body is disposed, and includes an overlap region where the columnar metal layer and the solder resist layer overlap each other, along part or all of an aperture end of the aperture.

(2)

The semiconductor device according to (1), wherein the at least one gap control electrode includes a plurality of gap control electrodes, and at least one of the plurality of gap control electrodes is disposed at each side of the semiconductor chip.

(3)

The semiconductor device according to (1) or (2), wherein, in the at least one gap control electrode, a diameter of the columnar metal layer is larger than a width of the aperture, along part or all of the aperture end of the aperture.

(4)

The semiconductor device according to (1) or (2), wherein, in the at least one gap control electrode, a center of the columnar metal layer is out of alignment with a center of the aperture.

(5)

The semiconductor device according to any one of (1) to (4), wherein the aperture has a planar shape elongated in a lengthwise direction of the wiring inside the aperture, with a length of the aperture adjusted in accordance with a thermal expansion coefficient of the packaging substrate.

(6)

The semiconductor device according to any one of (1) to (5), wherein the columnar metal layer is made of a metal having a higher melting point than a melting point of solder that constitutes the solder layer.

(7)

The semiconductor device according to (6), wherein a height of the columnar metal layer is larger than a height of the solder layer.

(8)

The semiconductor device according to (6) or (7), wherein a volume of the solder layer is larger than a volume of the aperture.

(9)

The semiconductor device according to any one of (5) to (8), wherein the length of the aperture satisfies Expression 1.

$$L>(a-3.5)*D*(T-25)*10-6+d \quad \text{Expression 1}$$

(in Expression 1, L denotes the length (mm) of the aperture, a denotes an equivalent thermal expansion coefficient (ppm/° C.) of the packaging substrate, D denotes a distance (mm) from a center of the packaging substrate to a center of the aperture, T denotes a melting point (° C.) of the solder, and d denotes a diameter of each of the plurality of solder-including electrodes.)

(10)

The semiconductor device according to any one of (1) to (9), wherein each of the plurality of wirings includes:

a metal wiring layer made of copper (Cu) as a principal component; and a surface coating that covers a region exposed in the aperture, out of a surface of the metal wiring layer.

(11)

The semiconductor device according to (10), wherein the surface coating includes an Ni—Au plating layer or a Ni—Pd—Au plating layer.

(12)

The semiconductor device according to any one of (1) to (11), wherein the columnar metal layer is made of copper (Cu), or includes a stacked film of copper (Cu) and nickel (Ni), and the solder layer is made of tin (Sn) or Sn—Ag.

(13)

The semiconductor device according to any one of (1) to (11), wherein the columnar metal layer is made of copper (Cu), or includes a stacked film of copper (Cu) and nickel (Ni), and the solder layer is made of indium (In) or In—Ag.

(14)

A method of manufacturing a semiconductor device, the method including:

aligning a semiconductor chip with a packaging substrate, the semiconductor chip including a chip body and a plurality of solder-including electrodes provided on an element-formation surface of the chip body, and the packaging substrate including a substrate body, a plurality of wirings, and a solder resist layer, the plurality of wirings and the solder resist layer being provided on a front surface of the substrate body;

temporarily bonding the semiconductor chip to the packaging substrate;

connecting the plurality of solder-including electrodes to the plurality of wirings, by reflow heating; and injecting an underfill resin between the semiconductor chip and the packaging substrate, and curing the underfill resin, wherein the solder resist layer is provided as a continuous layer on the front surface of the substrate body and the plurality of wirings, and has an aperture on each of the plurality of wirings, the plurality of solder-including electrodes include at least one gap control electrode, the at least one gap control electrode includes a columnar metal layer and a solder layer in order named from side on which the chip body is disposed, and the temporarily bonding of the semiconductor chip to the packaging substrate includes heating the semiconductor chip and pressure-bonding the semiconductor chip to the packaging substrate, and detecting a load by allowing the columnar metal layer of the at least one gap control electrode and the solder resist layer to be in contact with each other.

(15)

A method of manufacturing a semiconductor device, the method including:

aligning a semiconductor chip with a packaging substrate after heating the semiconductor chip at a temperature equal to or higher than a melting point of solder, the semiconductor chip including a chip body and a plurality of solder-including electrodes provided on an element-formation surface of the chip body, and the packaging substrate including a substrate body, a plurality of wirings, and a solder resist layer, the plurality of wirings and the solder resist layer being provided on a front surface of the substrate body;

connecting the plurality of solder-including electrodes to the plurality of wirings; and injecting an underfill resin between the semiconductor chip and the packaging substrate, and curing the underfill resin, wherein the solder resist layer is provided as a continuous layer on the front surface of the substrate body and the plurality of wirings, and has an aperture on each of the plurality of wirings, the plurality of solder-including electrodes include at least one gap control electrode, the at least one gap control electrode includes a columnar metal layer and a solder layer in order named from side on which the chip body is disposed, and the connecting of the plurality of solder-including electrodes to the plurality of wirings includes pressure-bonding the semiconductor chip to the packaging substrate, detecting a load by allowing the columnar metal layer of the at least one gap control electrode and the solder resist layer to be in contact with each other, and adjusting a gap between the semiconductor chip and the packaging substrate.

(16)

A method of manufacturing a semiconductor device, the method including:

aligning a semiconductor chip with a packaging substrate, the semiconductor chip including a chip body and a plurality of solder-including electrodes provided on an element-formation surface of the chip body, and the packaging substrate including a substrate body, a plurality of wirings, and a solder resist layer, the plurality of wirings and the solder resist layer being provided on a front surface of the substrate body;

connecting the plurality of solder-including electrodes to the plurality of wirings; and injecting an underfill resin between the semiconductor chip and the packaging substrate, and curing the underfill resin, wherein the solder resist layer is provided as a continuous layer on the front surface of the substrate body and the plurality of wirings, and has an aperture on each of the plurality of wirings, the plurality of solder-including electrodes include at least one gap control electrode, the at least one gap control electrode includes a columnar metal layer and a solder layer in order named from side on which the chip body is disposed, and the connecting of the plurality of solder-including electrodes to the plurality of wirings includes pressure-bonding the semiconductor chip to the packaging substrate, detecting a load by allowing the columnar metal layer of the at least one gap control electrode and the solder resist layer to be in contact with each other, and heating the semiconductor chip at a temperature equal to or higher than a melting point of the solder and pressure-bonding the semiconductor chip to the packaging substrate, to connect the plurality of solder-including electrodes to the plurality of wirings.

(17)

A method of manufacturing a semiconductor device, the method including:

supplying an underfill resin on a packaging substrate, the packaging substrate including a substrate body, a plurality of wirings, and a solder layer, the plurality of wirings and the solder resist layer being provided on a front surface of the substrate body;

aligning a semiconductor chip with the packaging substrate, the semiconductor chip including a chip body and a plurality of solder-including electrodes provided on an element-formation surface of the chip body;

connecting the plurality of solder-including electrodes to the plurality of wirings, and temporarily curing the underfill resin; and permanently curing the underfill resin, wherein the solder resist layer is provided as a continuous layer on the front surface of the substrate body and the plurality of wirings, and has an aperture on each of the plurality of wirings, the plurality of solder-including electrodes include at least one gap control electrode, the at least one gap control electrode includes a columnar metal layer and a solder layer in order named from side on which the chip body is disposed, and the connecting of the plurality of solder-including electrodes to the plurality of wirings includes pressure-bonding the semiconductor chip to the packaging substrate, detecting a load by allowing the columnar metal layer of the at least one gap control electrode and the solder resist layer to be in contact with each other, and heating the semiconductor chip at a temperature equal to or higher than a melting point of the solder and pressure-bonding the semiconductor chip to the packaging substrate, to connect the plurality of solder-including electrodes to the plurality of wirings.

This application claims the benefit of Japanese Priority Patent Application JP 2014-132333 filed on Jun. 27, 2014 the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A semiconductor device, comprising:
a semiconductor chip that includes a chip body and a plurality of solder-including electrodes, wherein the plurality of solder-including electrodes is on an element-formation surface of the chip body; and
a packaging substrate that includes a substrate body, a plurality of wirings, and a solder resist layer, wherein
the semiconductor chip is on the packaging substrate,
the plurality of wirings and the solder resist layer are on a front surface of the substrate body,
the solder resist layer is a continuous layer on the front surface of the substrate body and the plurality of wirings,
the solder resist layer has an aperture on a wiring of the plurality of wirings,
the aperture has a planar shape of an ellipse elongated in a lengthwise direction of each wiring of the plurality of wirings,
a length of the aperture satisfies Expression 1:

$$L > (a-3.5)*D*(T-25)*10^{-6} + d \qquad \text{Expression 1}$$

wherein
L denotes the length (mm) of the aperture,
a denotes an equivalent thermal expansion coefficient (ppm/° C.) of the packaging substrate,
D denotes a distance (mm) from a center of the packaging substrate to a center of the aperture,
T denotes a melting point (° C.) of solder, and
d denotes a diameter of each solder-including electrode of the plurality of solder-including electrodes,
a first portion of the solder resist layer is inside the aperture,
the first portion of the solder resist layer inside the aperture is different from a second portion of the solder resist layer at a periphery of the aperture,
the first portion of the solder resist layer is in contact with the wiring inside the aperture,
a thickness of the first portion of the solder resist layer that is in contact with the wiring inside the aperture is lower than a thickness of the solder resist layer in a region of the substrate body other than the aperture,
the first portion of the solder resist layer is in contact with the substrate body, and
at least one gap control electrode of the plurality of solder-including electrodes includes:
a columnar metal layer;
a solder layer different from the solder resist layer, wherein the columnar metal layer is between the solder layer and the chip body; and
an overlap region, wherein
in the overlap region, the columnar metal layer overlaps the solder resist layer along one of a part of the aperture or a perimeter of an outline of the aperture.

2. The semiconductor device according to claim 1, wherein the at least one gap control electrode is at each side of the semiconductor chip.

3. The semiconductor device according to claim 1, wherein, in the at least one gap control electrode, a diameter of the columnar metal layer is larger than a width of the aperture.

4. The semiconductor device according to claim 1, wherein, in the at least one gap control electrode, a center of the columnar metal layer is out of alignment with the center of the aperture.

5. The semiconductor device according to claim 1, wherein
the columnar metal layer comprises a metal, and
a melting point of the metal is higher than a melting point of solder of the solder layer.

6. The semiconductor device according to claim 5, wherein a height of the columnar metal layer is larger than a height of the solder layer.

7. The semiconductor device according to claim 5, wherein a volume of the solder layer is larger than a volume of the aperture.

8. The semiconductor device according to claim 1, wherein each wiring of the plurality of wirings includes:
a metal wiring layer having copper (Cu) as a principal component, and
a surface coating that covers a region of the each wiring exposed in the aperture.

9. The semiconductor device according to claim 8, wherein the surface coating includes one of an Ni—Au plating layer or an Ni—Pd—Au plating layer.

10. The semiconductor device according to claim 1, wherein
the columnar metal layer has one of copper (Cu) or a stacked film of copper (Cu) and nickel (Ni), and
the solder layer has one of tin (Sn) or an Sn—Ag film.

11. The semiconductor device according to claim 1, wherein
the columnar metal layer has one of copper (Cu) or a stacked film of copper (Cu) and nickel (Ni), and
the solder layer has one of indium (In) or an In—Ag film.

12. The semiconductor device according to claim 1, wherein
the at least one gap control electrode of the plurality of solder-including electrodes further includes a pad between the columnar metal layer and the chip body, wherein
the pad is on the element-formation surface of the chip body,
the pad is of aluminum, and
the pad is electrically connected to the columnar metal layer.

13. The semiconductor device according to claim 1, wherein the length of the aperture is elongated in the lengthwise direction.

14. The semiconductor device according to claim 1, wherein a distance between the semiconductor chip and the packing substrate is one of greater than or equal to a height of the columnar metal layer.

15. The semiconductor device according to claim 1, wherein a portion of the wiring is buried in the first portion of the solder resist layer.

* * * * *